(12) United States Patent
Mandal et al.

(10) Patent No.: US 9,515,211 B2
(45) Date of Patent: Dec. 6, 2016

(54) SCHOTTKY BARRIER DETECTION DEVICES HAVING A 4H-SIC N-TYPE EPITAXIAL LAYER

(71) Applicants: Krishna C. Mandal, Columbia, SC (US); J. Russell Terry, Los Alamos, NM (US)

(72) Inventors: Krishna C. Mandal, Columbia, SC (US); J. Russell Terry, Los Alamos, NM (US)

(73) Assignee: University of South Carolina, Columbia, SC (US)

( * ) Notice: Subject to any disclaimer, the term of this patent is extended or adjusted under 35 U.S.C. 154(b) by 0 days.

(21) Appl. No.: 14/444,140

(22) Filed: Jul. 28, 2014

(65) Prior Publication Data

US 2015/0028353 A1 Jan. 29, 2015

Related U.S. Application Data

(60) Provisional application No. 61/858,907, filed on Jul. 26, 2013, provisional application No. 61/960,488, filed on Sep. 19, 2013, provisional application No. 61/961,225, filed on Oct. 8, 2013, provisional application No. 61/961,219, filed on Oct. 8, 2013.

(51) Int. Cl.
*H01L 31/0312* (2006.01)
*H01L 31/036* (2006.01)
*H01L 31/118* (2006.01)
*H01L 33/00* (2010.01)

(52) U.S. Cl.
CPC ......... *H01L 31/036* (2013.01); *H01L 31/0312* (2013.01); *H01L 31/118* (2013.01); *H01L 33/0033* (2013.01)

(58) Field of Classification Search
CPC ... H01L 31/028; H01L 31/036; H01L 31/0224
USPC .......................................................... 257/77
See application file for complete search history.

(56) References Cited

U.S. PATENT DOCUMENTS 3,770,565 A * 11/1973 Schoolar ................. H01L 21/34
148/DIG. 150
6,734,461 B1 * 5/2004 Shiomi .................... C30B 23/00
257/194
6,972,436 B2 * 12/2005 Das ....................... H01L 21/045
257/411

(Continued)

*Primary Examiner* — Thanh T Nguyen
(74) *Attorney, Agent, or Firm* — Dority & Manning, P.A.

(57) ABSTRACT

A detection device, along with methods of its manufacture and use, is provided. The detection device can include: a SiC substrate defining a substrate surface cut from planar to about 12°; a buffer epitaxial layer on the substrate surface; a n-type epitaxial layer on the buffer epitaxial layer; and a top contact on the n-type epitaxial layer. The buffer epitaxial layer can include a n-type 4H—SiC epitaxial layer doped at a concentration of about $1 \times 10^{15}$ cm$^{-3}$ to about $5 \times 10^{18}$ cm$^{-3}$ with nitrogen, boron, aluminum, or a mixture thereof. The n-type epitaxial layer can include a n-type 4H—SiC epitaxial layer doped at a concentration of about $1 \times 10^{13}$ cm$^{-3}$ to about $5 \times 10^{15}$ cm$^{-3}$ with nitrogen. The top contact can have a thickness of about 8 nm to about 15 nm.

17 Claims, 38 Drawing Sheets

(56) References Cited

U.S. PATENT DOCUMENTS

2006/0151806 A1\* 7/2006 Fukuda ............... H01L 21/0445
   257/155
2007/0090370 A1\* 4/2007 Nakayama ............ H01L 29/045
   257/77

\* cited by examiner

SCHOTTKY BARRIER DETECTION DEVICES HAVING A 4H-SIC N-TYPE EPITAXIAL LAYER

PRIORITY INFORMATION

The present application claims priority to U.S. Provisional Patent Application Ser. No. 61/858,907 titled "Highly Sensitive X-Ray Detectors in the Low-Energy Range on n-type 4H—SiC Epitaxial Layers" of Mandal, et al. filed on Jul. 26, 2013, U.S. Provisional Patent Application Ser. No. 61/960, 488 titled "Low Energy X-Ray and Gamma-Ray Detectors Fabricated on n-type 4H—SiC Epitaxial Layer" of Mandal, et al. filed on Sep. 19, 2013, U.S. Provisional Patent Application Ser. No. 61/961,225 titled "Schottky Barrier Detectors on 4H—SiC n-type Epitaxial Layer for Alpha Particles" of Mandal, et al. filed on Oct. 8, 2013, and U.S. Provisional Patent Application Ser. No. 61/961,219 titled "High Resolution Alpha Particle Detection Using 4H—SiC Epitaxial Layers: Fabrication, Characterization, and Noise Analysis" of Mandal, et al. filed on Oct. 8, 2013; the disclosures of which are incorporated by reference herein.

GOVERNMENT SUPPORT CLAUSE

This invention was made with government support under 143479 awarded by Los Alamos National Laboratory/DOE and under grant number DE-AC52-06NA25396 awarded by Los Alamos National Laboratory/DOE. The government has certain rights in the invention.

BACKGROUND

Development of advanced radiation detectors is aimed at high energy-resolution detectors that are capable of reliable and long term non-degrading operation at elevated temperatures under high doses of ionizing radiation. Such detectors can be built on silicon carbide (SiC), a wide band-gap semiconductor, which has been recognized for long time as an attractive alternative to more mature technologies in intense and rugged environments.

Silicon carbide (SiC), a wide band-gap semiconductor, has been recognized for high-power, high frequency, and high-temperature opto-electronics applications. Over the past decade, SiC has developed significantly in the area of high power electronics, making high-quality SiC material increasingly available for research and development and other commercial applications. This gained momentum to the development of SiC based ionizing radiation detectors, where a defect-free high purity single crystals and thick epitaxial layers are crucial for high resolution, high sensitivity, and low noise detectors of x-rays, gamma-rays, and low-energy ionizing radiation. Detectors based on 4H—SiC epitaxial layers with low level of impurities and defects can reliably detect any type of ionizing radiation at high radiation background at elevated temperatures and can be used in radiation doses as high as 22 MGy. Diode-type detectors fabricated using SiC epitaxial layers perform well in high-resolution detection of low penetration depth α-radiation, whereas the resolution of the detectors based on bulk semi-insulating SiC grown by physical vapor transport (PVT) is not yet adequate presumably due to high density of defects and deep level centers, implying that further quality improvement of these crystals is necessary.

The present inventors have evaluated the state-of-the-art n-type 4H—SiC epitaxial layers in terms of quality and electrical and defect properties. It was found that there is no commercially available detector that is sensitive enough to soft x-rays in the sub-keV to 10 key spectral range. As such, there exists a need in the art for improved detectors, particularly in the soft x-rays and gamma range spectral ranges.

The prospect of SiC Schottky diodes as alpha particle detectors was first reported by Babcock and co-workers. Ruddy et al., reported a resolution of 5.8% (full width at half maxima, FWHM) at a deposited energy of 294 keV and 6.6% (FWHM) at a deposited energy of 260 keV by alpha particles from a collimated 238Pu source in 4H—SiC Schottky diodes with circular contacts of diameter 200 and 400 μm. F. Nava et al. reported very robust 5.48 MeV alpha particle signal in 4H—SiC epitaxial detectors with circular contacts of ~2 mm diameter. However, they have not achieved a saturation of the charge collection efficiency even at a bias voltage of 200 V. In a later work, Ruddy et al. reported an energy resolution of 5.7% for a deposited energy of 89.5 keV alpha particles from a 100 μm collimated 148Gd source in similar detectors with relatively larger Schottky contact diameter of 2.5, 3.5, 4.5 and 6.0 mm and 10 μm thick epilayer. Among high resolution alpha particle detection reports, Ruddy et al. reported fabrication of alpha particle detectors with aluminum guard ring structures using which they obtained an energy resolution close to 46 keV for alpha particles from a 238Pu source and 41.5 keV for alpha particles from a 148Ga source. Ivanov et al. reported an energy resolution of 20 keV in the energy range 5.4-5.5 MeV. In another work, Ruddy et al. reported an energy resolution of 20.6 keV for 238Pu alpha particles and Pullia et al. reported 0.9% energy resolution in the 4.8-5.8 MeV energy range at a temperature of 55° C. using a SiC/GaN detector with a 1000 Å Au entrance window. However, there exists a need in the art for improved alpha particle detectors.

SUMMARY

Objects and advantages of the invention will be set forth in part in the following description, or may be obvious from the description, or may be learned through practice of the invention.

A detection device is generally provided, along with methods of its manufacture and use. In one embodiment, the detection device includes: a SiC substrate defining a substrate surface cut from planar to about 12°; a buffer epitaxial layer on the substrate surface; a n-type epitaxial layer on the buffer epitaxial layer; and a top contact on the n-type epitaxial layer. The buffer epitaxial layer generally includes a n-type 4H—SiC epitaxial layer doped at a concentration of about $1 \times 10^{15}$ cm$^{-3}$ to about $5 \times 10^{18}$ cm$^{-3}$ with nitrogen, boron, aluminum, or a mixture thereof. The n-type epitaxial layer generally includes a n-type 4H—SiC epitaxial layer doped at a concentration of about $1 \times 10^{13}$ cm$^{-3}$ to about $5 \times 10^{15}$ cm$^{-3}$ with nitrogen. The top contact generally has a thickness of about 8 nm to about 15 nm.

Other features and aspects of the present invention are discussed in greater detail below.

BRIEF DESCRIPTION OF THE DRAWINGS

A full and enabling disclosure of the present invention, including the best mode thereof to one skilled in the art, is set forth more particularly in the remainder of the specification, which includes reference to the accompanying figures:

FIG. 29 shows the variation of detector resolution (in keV and percentage) as a function of reverse bias according to Example 4. The variation of the pulser peak width is also shown along with.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

Detection devices are generally provided that are formed from Schottky diodes on n-type 4H—SiC epitaxial layers. The detection devices are particularly suitable for low-energy x-ray detection, gamma-ray detection, and alpha particle detection.

Figure 1:
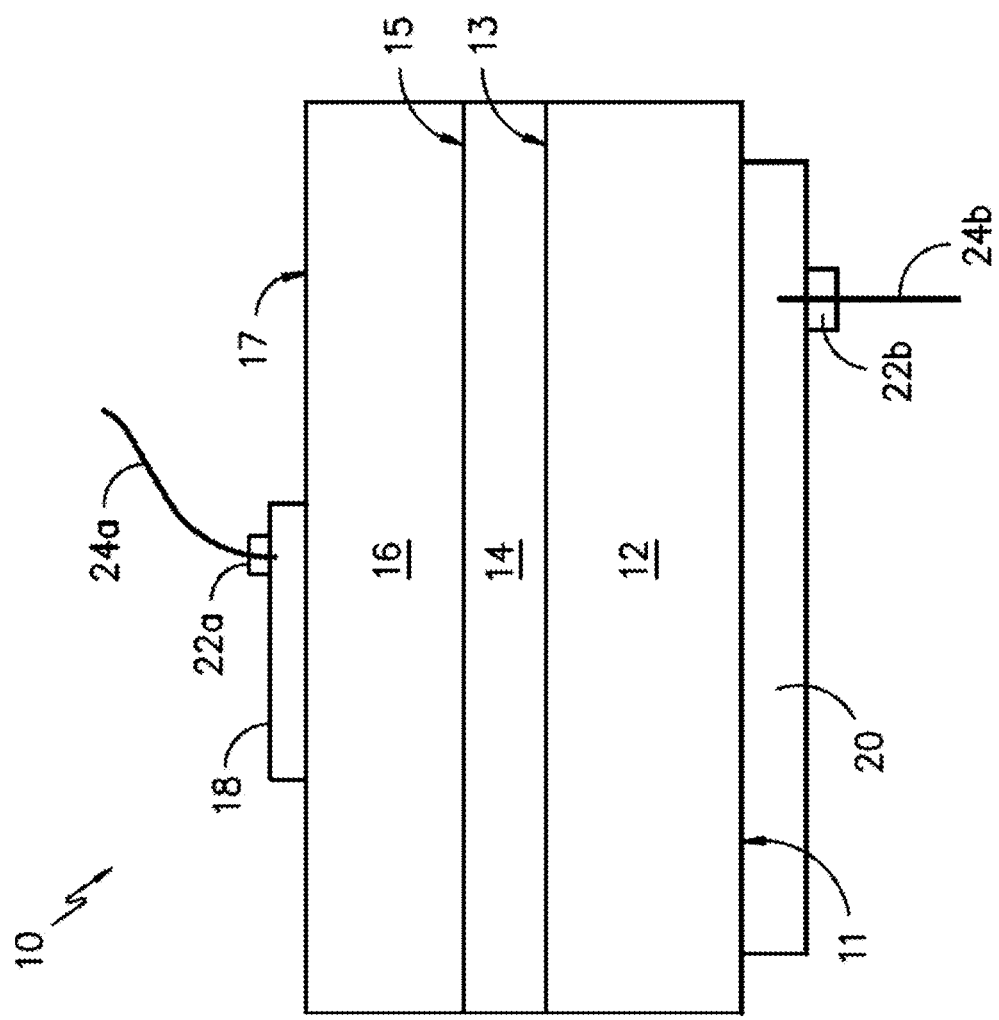
FIG. 1 shows a cross-sectional view of an exemplary detection device according to one embodiment of the present invention.

Referring to FIG. 1, an exemplary detection device 10 is shown including a SiC substrate 12, a buffer epitaxial layer 14, and a n-type epitaxial layer 16. As shown, the buffer epitaxial layer 14 is grown on the substrate surface 13 of the substrate 12, and the n-type epitaxial layer 16 is grown on the surface 15 of the buffer epitaxial layer 14. A top contact 18 is positioned on the detection surface 17 of the n-type epitaxial layer 16, with a top lead 24a attached to the top contact 18 with the paste 22a. A bottom contact 20 is positioned on the opposite surface 11 of the SiC substrate 12, with a bottom lead 24b is attached to the bottom contact 20 with the paste 22b.

The SiC substrate 12 is, in one embodiment, a SiC wafer. Properties like wide band-gap, radiation hardness and high breakdown field make SiC a potential candidate for radiation detectors even in harsh environments such as high radiation background and hot and humid environments, without considerable deterioration in their detection properties. However, the presence of defects in the epilayer and the substrate is one of the crucial factors which define the performance of the SiC detectors. Major defects present in SiC are edge dislocations, screw dislocations, carrot defects, comet defects, triangular defects, and basal plane dislocations. Most of these defects are normally confined to the substrate but some screw dislocations can propagate to the epitaxial layer and form micropipe defects in the epilayer. A sufficiently large depletion width, which defines the active volume of the detector, is yet another crucial requirement for obtaining high energy resolution and high efficiency detection.

In one embodiment, the SiC wafer can have a thickness of about 250 μm to about 450 μm (e.g., about 300 μm to about 400 μm). Generally, the substrate surface 13 of the SiC substrate 12 can be cut at an angle that is planar (i.e., 0°) to about 12°. For example, the SiC substrate 12 can be cut at an angle that is about 4° to about 8° to form the substrate surface 13. In a particular embodiment, the SiC substrate 12 has a crystalline structure that is 4H—SiC.

In one embodiment, the buffer epitaxial layer 14 has a thickness of about 0.5 μm to about 2.0 μm (e.g., about 0.8 μm to about 1.5 μm). The buffer epitaxial layer 14 comprises a n-type 4H—SiC epitaxial layer doped at a concentration of about $1 \times 10^{15}$ cm$^{-3}$ to about $5 \times 10^{18}$ cm$^{-3}$ with nitrogen, boron, aluminum, or a mixture thereof. In one particular embodiment, the buffer epitaxial layer 14 is doped with nitrogen at a concentration of about $1 \times 10^{15}$ cm$^{-3}$ to about $5 \times 10^{18}$ cm$^{-3}$. The buffer epitaxial layer 14 generally serves as a template for the epitaxial growth of the n-type epitaxial layer 16, as well as providing strain relief from any lattice mismatch between the SiC substrate 12 and the n-type epitaxial layer 16. As such, the buffer epitaxial layer 14 can have a thickness sufficient to transition from the substrate surface 13 of the SiC substrate 12 to the n-type epitaxial layer 16. For example, the buffer epitaxial layer 14 can have a thickness of about 0.5 μm to about 2.0 μm (e.g., about 0.8 μm to about 1.5 μm).

The n-type epitaxial layer 16 comprises a n-type 4H—SiC epitaxial layer doped at a concentration of about $1 \times 10^{13}$ cm$^{-3}$ to about $5 \times 10^{15}$ cm$^{-3}$ with nitrogen.

The n-type epitaxial layer 16 has, in one embodiment, a thickness of about 10 μm to about 50 μm. The n-type epitaxial layer 16 generally defines an exposed surface 17 defining a surface area. This exposed surface 17 of the n-type epitaxial layer 16 is the detection surface that is exposed to the x-rays and/or gamma-rays. Additionally, the top contact 18 is positioned on the exposed surface 17, and has a thickness of about 8 nm to about 15 nm. At this relatively small thickness, the x-rays and/or gamma-rays may still pass through the top contact 18 and reach the exposed surface 17, which effectively increases the sensitivity of the detector. Additionally, the top contact 18 is sized, in certain embodiments, to cover about 10% to about 20% of the surface area of the exposed surface 17 of the n-type epitaxial layer 16.

Together, the n-type epitaxial layer 16 and the top contact 18 form a Schottky diode. In one embodiment, the top contact 18 comprises a high barrier metal, such as Pt, Au, Ag, Ni, Pd, W, Mo, Ir, Ru, or mixtures thereof. Alternatively, the top contact 18 can comprise a low barrier metal, such as Al, Sn, In, Ti, or mixtures thereof. In one particular embodiment, the top contact 18 comprises Ni.

Similarly, the bottom contact 20 can comprise a high barrier metal, such as Pt, Au, Ag, Ni, Pd, W, Mo, Ir, Ru, or mixtures thereof. Alternatively, the bottom contact 20 can comprise a low barrier metal, such as Al, Sn, In, Ti, or mixtures thereof. In one particular embodiment, the bottom contact 20 comprises Ni.

Both the top lead 22a and the bottom lead 22b can be a thin wire (e.g., a Ni wire) attached to the top contact 18 and bottom contact 20, respectively, with the paste 22a, 22b. In one embodiment, the paste 22a, 22b comprises silver and an adhesive (e.g., an epoxy adhesive).

EXAMPLE 1

Detectors were fabricated that showed significantly improved response of x-ray detection in a low-energy range. The detectors were highly sensitive to soft x-rays and showed improved response compared to the commercial SiC UV photodiodes. Specifically, the detectors were sensitive enough to soft x-rays in the sub-keV to 10 key spectral range. Current-voltage characteristics at 475 K showed low leakage current (<1 nA at 200 V) revealing the possibility of high temperature operation. The high quality of the epi-layer was confirmed by XRD and chemical etching. TSC measurements performed at 94-550 K revealed low density of deep levels which may cause charge trapping. No charge trapping on detectors' responsivity in the low x-ray energy was found.

Results are presented herein from bench-top electronic characterization, x-ray diffraction (XRD) rocking curve measurements, defect characterization by thermally stimulated current (TSC) spectroscopy, defect delineating chemical etching, and x-ray responsivity measurements (50 eV to 10 keV spectral range) performed using the X8A beam line at the National Synchrotron Light Source (NSLS) at Brook Haven National Laboratory (BNL).

Figure 2:
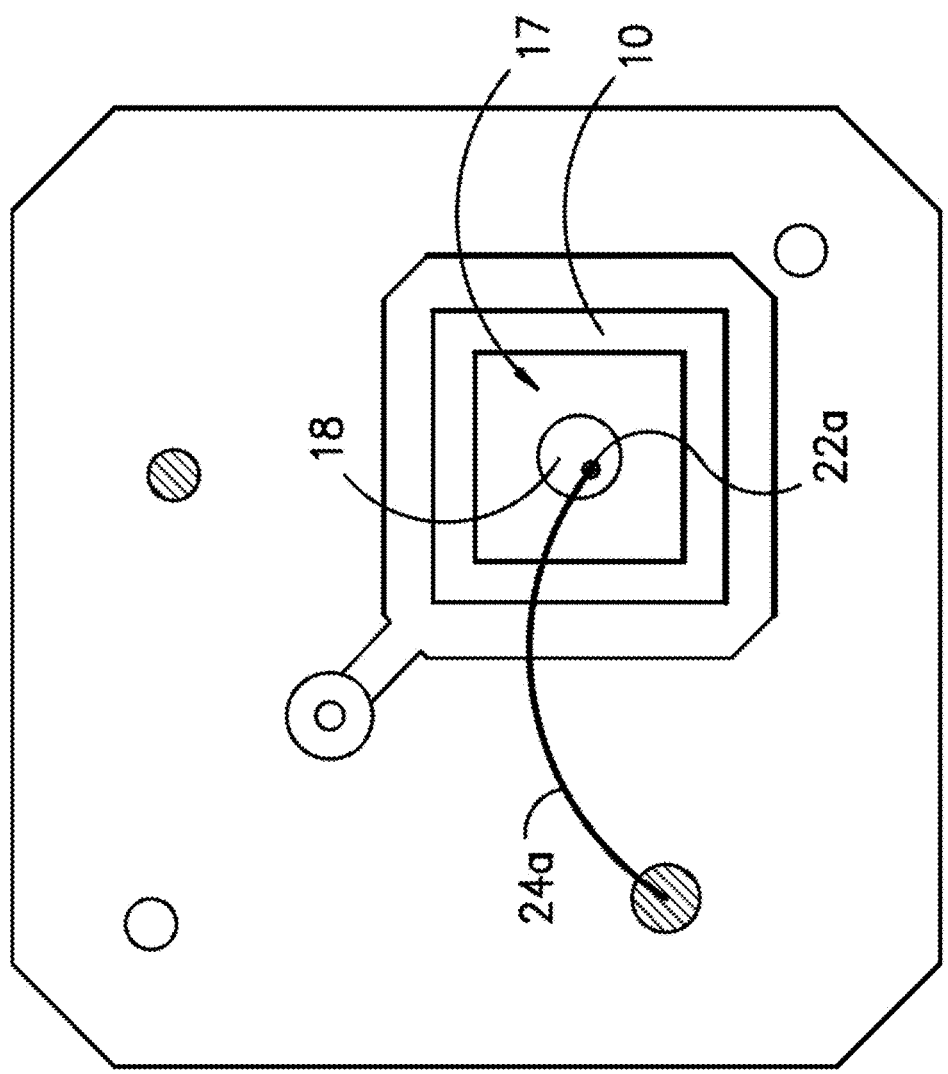
FIG. 2 shows a diagram of an exemplary 4H—SiC detector with a 3.2 mm diameter Ni contact mounted on a PCB board, according to Example 1.

A 50 μm thick n-type epitaxial layer grown on 2" diameter 4H—SiC (0001) wafer was used, which was highly doped with nitrogen and off-cut 8° towards the [11$\bar{2}$0] direction. The net doping concentration of the epitaxial layer measured using high frequency (100 kHz) capacitance-voltage (C-V) method was found to be $8\times10^{14}$ cm$^{-3}$. The x-ray detectors were fabricated on 8×8 mm$^2$ substrates diced from the 2" diameter wafer by depositing 3.2 mm in diameter and of ~10 nm in thickness Ni Schottky contacts on top of the epitaxial layers through the shadow mask using Quorum model Q150T sputter coater. Large Ni contact (approx. 6×6 mm$^2$) of ~100 nm in thickness was deposited on the backside by the same means. The standard RCA cleaning of the substrates was used prior to contact deposition. No annealing was performed after the deposition of Ni contacts. The wire bonding technique has been developed in our laboratory for lead attachment without damaging the thin Ni contact. This technique deploys special type of silver paste rated for high temperature applications. The same type of the silver paste was used for mounting the chip on a PCB board. A diagram of the single pixel planar detector is shown in FIG. 2.

TSC measurements on the epitaxial layer were conducted in the temperature range 94-550 K in vacuum $<1\times10^{-4}$ Torr at 4-15 K/min heat rates. The trap filling was achieved by illuminating the samples at 94 K using UVP model UVM-57 Handheld UV Lamp specified to produce 302 nm UV light. Current-voltage (I-V) characterization was performed at room and higher temperatures using Keithley 237 High Voltage Source Measure Unit.

In order to evaluate the density of crystallographic defects, defect delineating chemical etching was performed in molten KOH at 773 K for about 5 min. Threading edge, screw, and basal plane dislocation densities (BPDs) were assessed via etch pit density (EPD) evaluation using Nomarski optical microscope. X-ray diffraction rocking curves were acquired using double crystal diffractometer (model DSO-1, manufactured by Radicon Scientific Instruments Ltd., Russia). CuK$_\alpha$ radiation and (0008) reflection was used in the rocking curve measurements.

The detectors fabricated at the inventors' laboratory at the University of South Carolina (USC), using n-type 4H—SiC epitaxial layers, were tested and evaluated at Los Alamos National Laboratory (LANL) for detecting low energy x-rays and compared to commercial off-the-shelf (COTS) SiC UV photodiode detectors. The measurements were performed at 20 V-250 V bias voltages using U3C and X8A beam line at the NSLS at BNL. The beam line provided monochromatic photon beams ranging from 50 to 6500 eV with intensities as high as $10^{12}$ photons/second.

Figure 3:
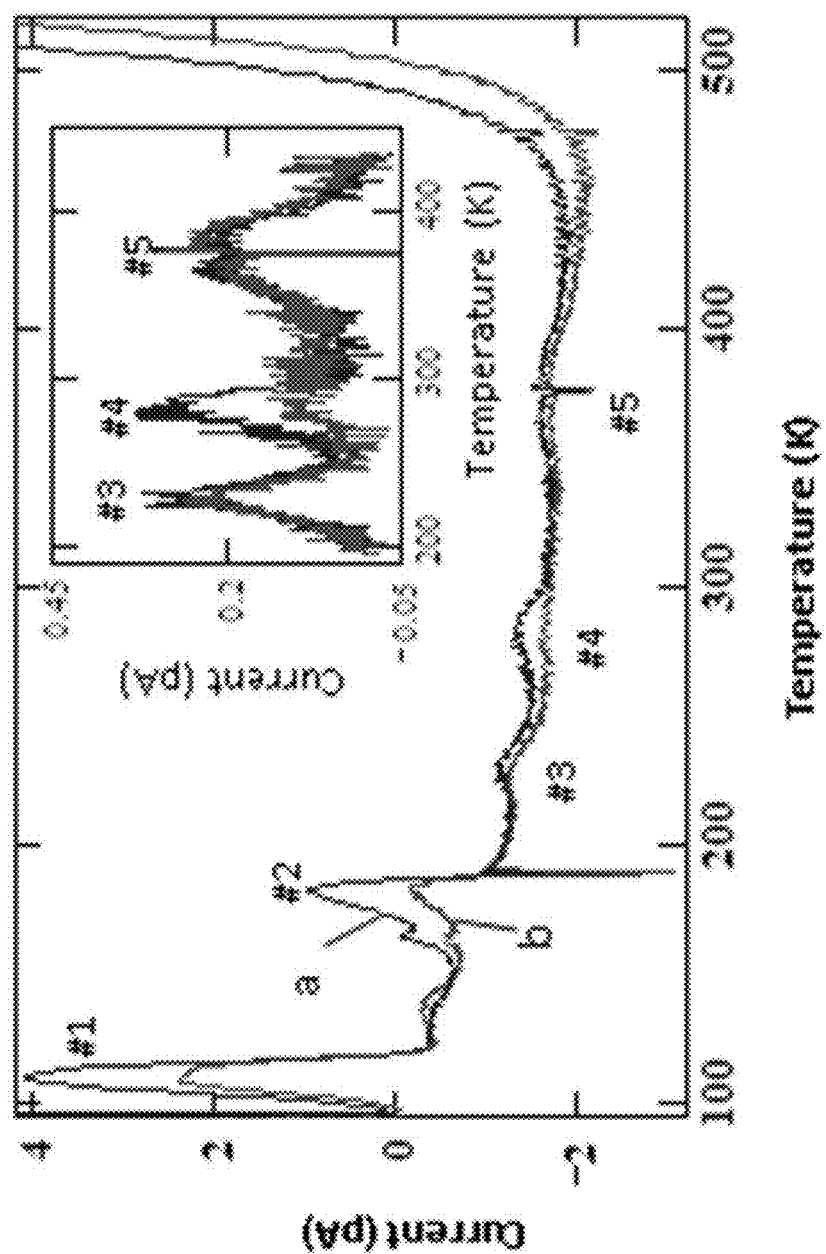
FIG. 3 shows a TSC spectrum of an n-type 4H—SiC epitaxial layer obtained at 10 V (line a) and 3 V (line b) reverse bias and 15 K/min heat rate, according to Example 1.

FIG. 3 shows TSC spectra of the detector at 10 V and 3 V reverse bias both obtained at 15 K heat rate. The spectra are dominated by peak #1 with maximum temperature $T_m=108$ K and activation energy ~0.25 eV estimated from Arrhenius plot (not shown). It is believed, without wishing to be bound by any particular theory, that this peak is associated with relatively shallow acceptor-like levels near the valence band edge related to Al and/or B as well as to their complexes with intrinsic defects. The intensity of this peak and peaks #2 and #4 clearly shows voltage dependence of the peak intensity, implying that the deep level centers are evenly distributed in the depletion region. The intensity of peaks #3 and #5 do not show voltage dependence of the peak intensity as evidenced by inset in FIG. 3 showing these peaks after subtraction of the stray current from corresponding portions of the spectra in FIG. 3. Therefore these traps are probably located near the metal semiconductor interface and not in the bulk of the epitaxial layer. Assuming uniform distribution of deep level centers in the depletion region for peaks #1, #2, and #4, their concentrations are estimated ($8\times10^{13}$ cm$^{-3}$, $3\times10^{13}$ cm$^{-3}$, and $9\times10^{12}$ cm$^{-3}$ respectively) using formula (1):

$$N_T = \frac{Q}{A}\sqrt{\frac{2N_d}{q\varepsilon\varepsilon_0(V_{bi}+V_a)}} \quad (1)$$

where $N_T$ is the trap concentration, Q is the total charge emitted by trap of a given TSC peak as determined by the area under the peak, A is the contact area, $N_d$ is the net doping concentration, $V_{bi}$ is the built-in voltage, $V_a$ is the bias voltage, q is the electronic charge, $\in$ is the dielectric permittivity of SiC, and $\in_0$ is the dielectric permittivity of vacuum. $N_d$ was determined from C-V characteristic at room temperature (RT) in equation (1), assuming $N_T \ll N_d$. Precise determination of activation energies for peaks #3-#5 using Arrhenius plot was not possible because the very weak TSC signal from these traps and low signal-to-noise ratio. Additionally peak #2 was always distorted by the negative spike, the origin of which is unclear at this time. Therefore for bulk traps #2 and #4 we performed trap identification using their maximum temperatures and results of our work where it was performed TSC studies of n-type and semi-insulating 4H—SiC samples using similar conditions. The peak #2 ($T_m$~175K) may be due to HS1 and HH1 hole traps in the lower half of the bandgap. Trap #4 ($T_m$~280 K) peaked at temperatures typical to that of well-known $Z_{1/2}$ center, an electron trap associated with a vacancy-type defect.

Figure 4A:
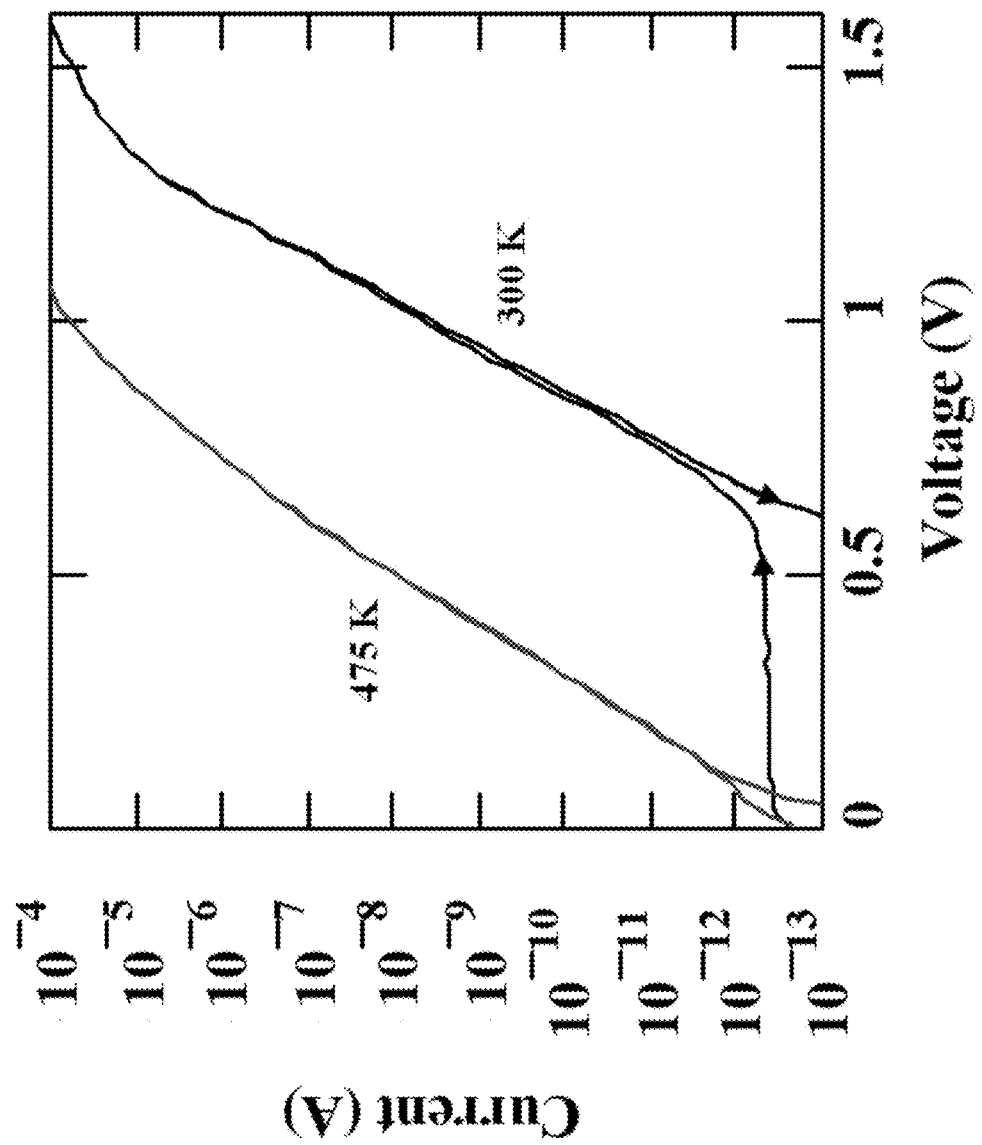
FIG. 4a shows the forward I-V characteristics at 300 K and 475 K for the 3.2 mm diameter detector on n-type 4H—SiC epitaxial layer according to Example 1.
Figure 4B:
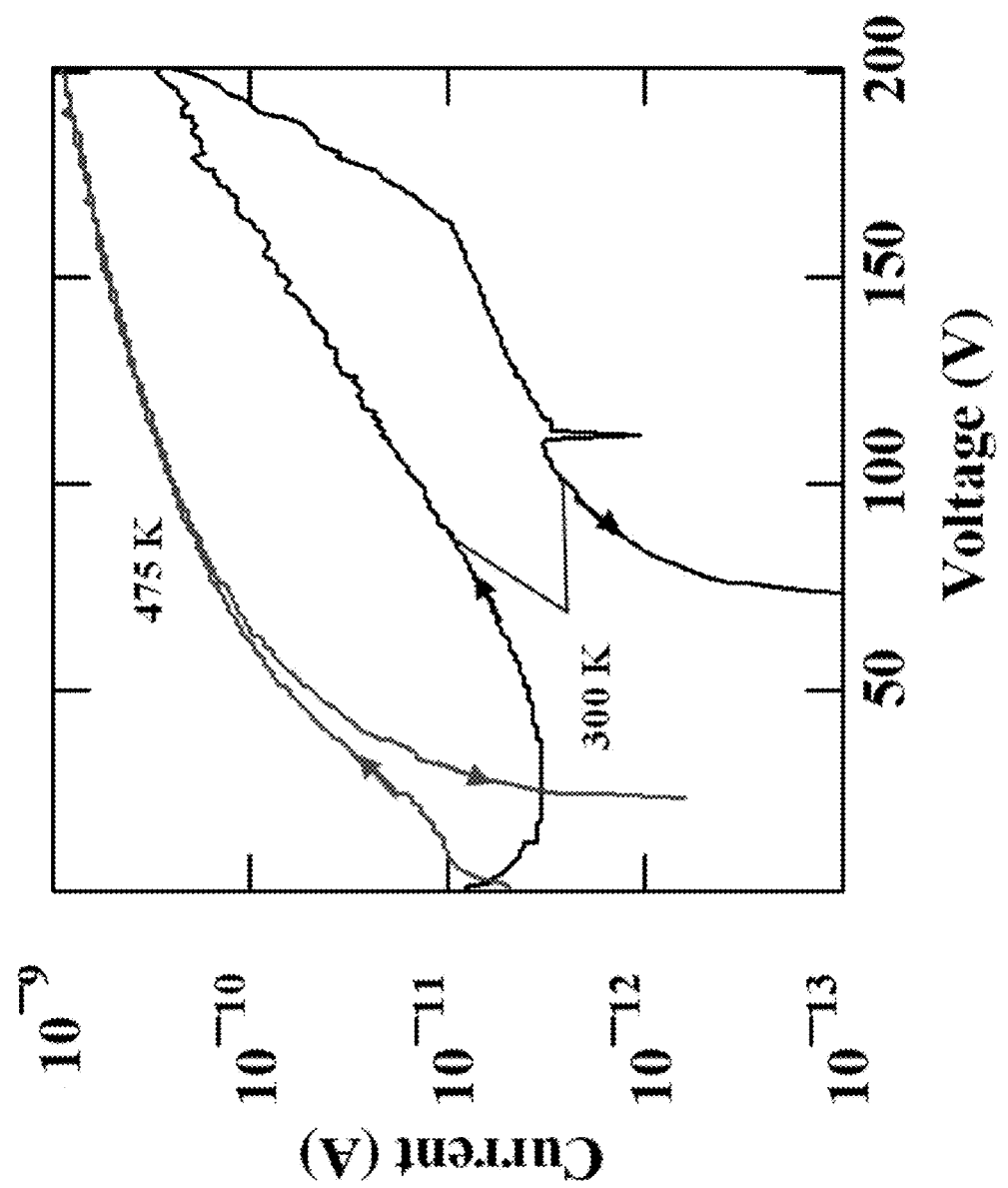
FIG. 4b shows the reverse I-V characteristics at 300 K and 475 K for the 3.2 mm diameter detector on n-type 4H—SiC epitaxial layer according to Example 1.

The barrier height of ~1.8 eV and ~1.6 eV and the ideality factor ~1.06 and ~1.35 were determined from the I-V characteristics at RT and 475 K respectively. The dark current of the detector was below 1 nA at 200 V for both temperatures. The low leakage current at 475 K indicates the possibility of detector operation at high temperature. Note that the I-V characteristics were measured using dual stair sequence, and therefore each I-V characteristic in FIGS. 4a and 4b has two branches corresponding to ramping the voltage up and down. These branches did not coincide at RT resulting in a hysteresis, which is attributed to the influence of the deep level centers. One of the devices suffered breakdown at about 400 V at RT. Based on our previous studies, it is expected to occur at the device edges due to the low breakdown strength of the air and lack of surface passivation. Note that the breakdown voltage of the epilayer itself is ~8 kV, implying on possibilities of further optimization. Development of proper edge termination and passivation is on-going to extend the operating voltage of our detectors.

Figure 5:
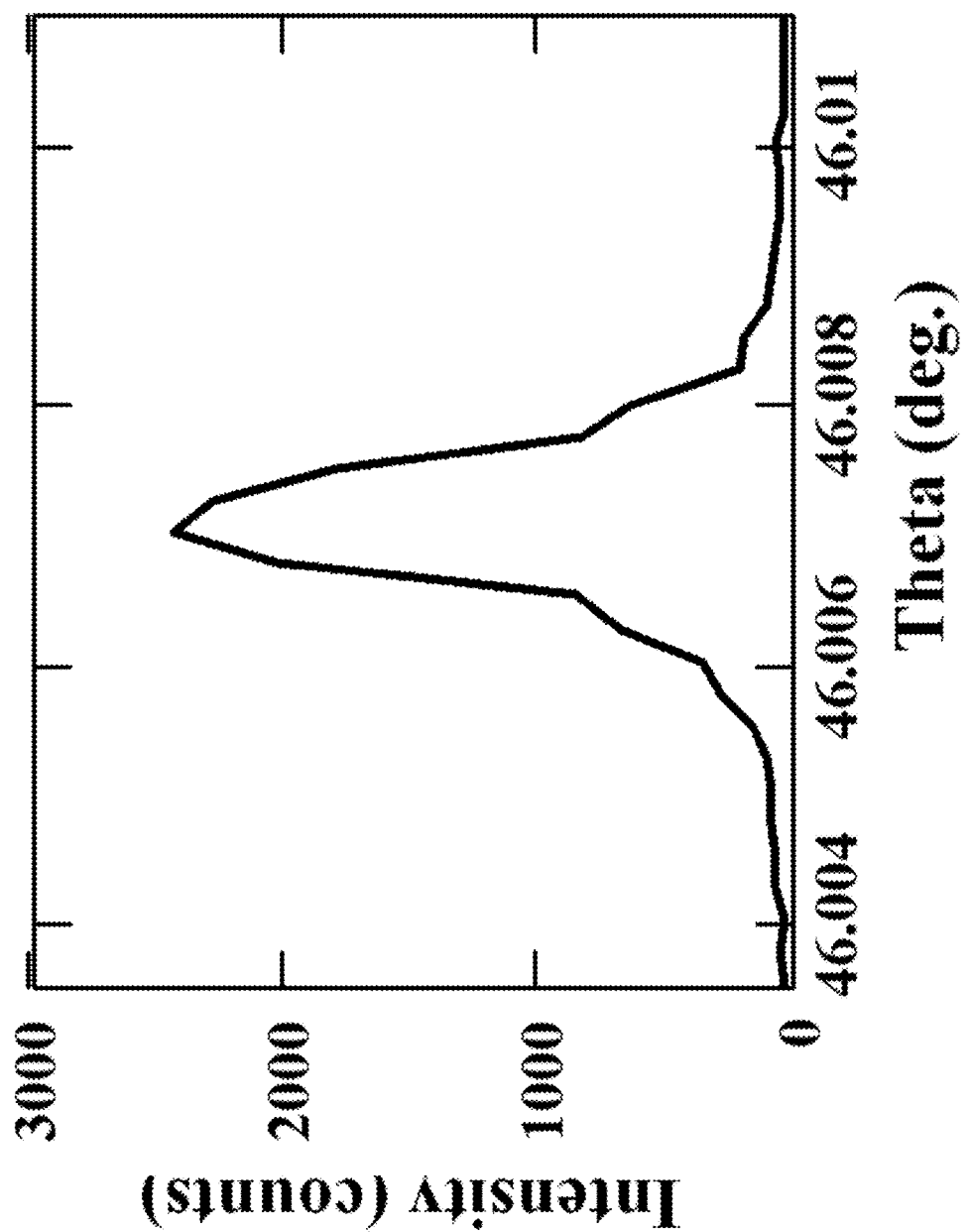
FIG. 5 shows the rocking curve ((0008) reflection) of the 4H—SiC epitaxial layer used for detector fabrication according to Example 1.

Quality of the epitaxial layers used for detector operation was assessed by defect delineating chemical etching in molten KOH and XRD rocking curve measurements. The rocking curve acquired using (0008) reflection is shown in FIG. 5. The full width at half maximum (FWHM) of the rocking curve is about 3.6 arc sec indicating high quality of the epitaxial layer. Results of defect delineating chemical etching revealed etch pit density (EPD) of threading screw dislocations (TSDs)~$1.7\times10^3$ cm$^{-2}$, threading edge dislocations (TEDs)~$1\times10^4$ cm$^{-2}$, and BPDs~70 cm$^{-2}$. These dislocation densities are much lower than that reported earlier reflecting improved quality of the epitaxial layer used in this study.

Figure 6:
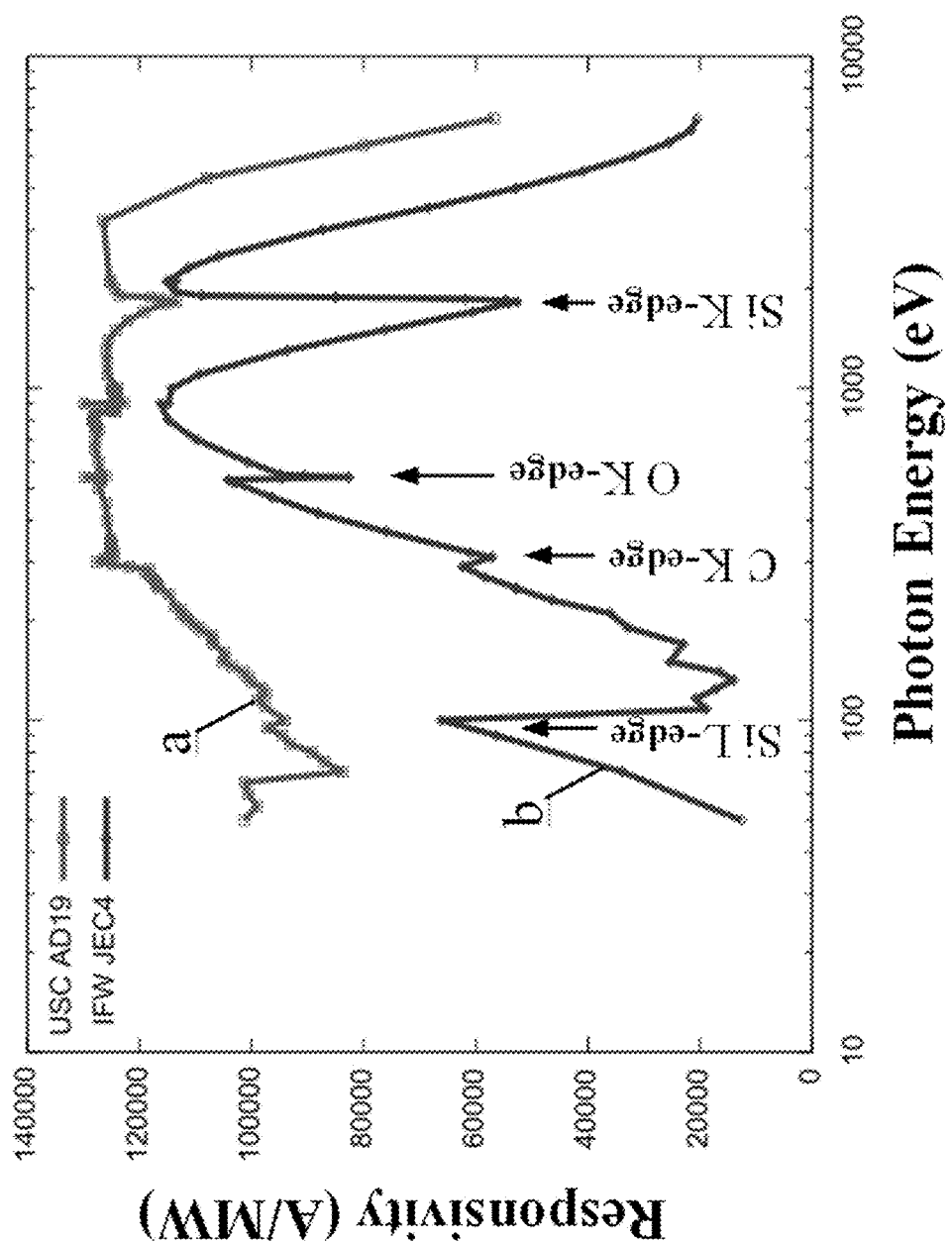
FIG. 6 shows the responsivity of the detectors on 4H—SiC n-type epitaxial layer (line a) and COTS (IFW JEC4) SiC photodiode (line b) to the low-energy x-rays according to Example 1.
Figure 7:
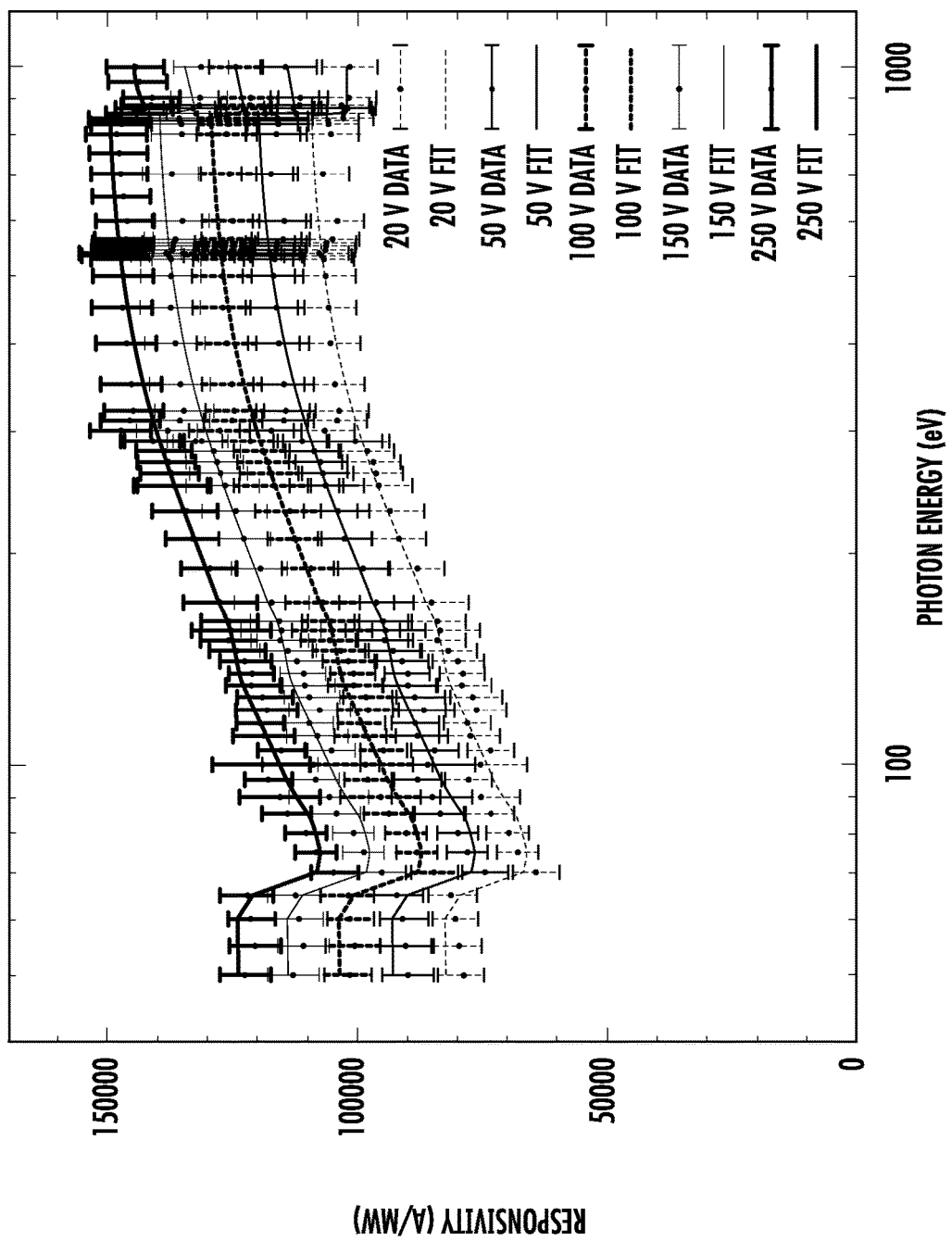
FIG. 7 shows the low-energy x-ray response for various bias voltages according to Example 1. Each subsequent data set is artificially offset in the vertical direction by +10,000 A/MW starting from an initial offset of −20,000 A/MW for the 20-V data set. The overlaid solid lines represent statistical fits in which the metallization thickness is allowed to freely vary (active volume thickness and overall scale are fixed; see Example 1).

Synchrotron light sources such as the NSLS at BNL are highly suitable for probing the physical construction of photonic sensors and can also provide an absolute measurement of their responsivity. FIG. 6 shows the responsivity of our detector and COTS SiC UV photodiode to soft x-ray energy ranges. Responsivity, given in units of A/MW, is measured by recording successive measures of photocurrent in a well-calibrated silicon sensor (with known responsivity) and in the sensor of interest. Ideally, the responsivity of a solid-state photon detector is determined solely by the inverse of the average electron-hole pair creation energy. However, dead layers and a limited active volume thickness lead to responsivity that varies greatly with photon energy. Further, edges are also apparent in the responsivity curve, arising from discrete atomic transitions. Edges associated with silicon and carbon are clearly observed in the data, providing a quantitative measure of the composition of the active and dead layers. The general feature of a steep decrease starting at 2-3 keV provides information on active layer thicknesses, which is much higher in our detector. Therefore our sensor chip showed significantly improved response in the few keV range compared to COTS SiC UV photodiode (IFW JEC4). Our detector has shown much higher response in the low energy part of the spectra as well, which could be attributed to much thinner dead/blocking layers. Also, our detectors showed uniform response vs. energy from multiple positions on the detector chip as reported earlier. Next, the detectors were tested for the charge trapping effects. Charge trapping can lead to space charge buildup, ultimately causing reduced charge collection efficiency. For high-energy photon beams used at the NSLS, which constantly deposit energy throughout the entire depth of the depletion zone, the effects of charge trapping may be inadvertently mitigated due to the de-trapping effect of the ionizing radiation. However, low-energy photons, which do not penetrate the full depth of the depletion zone, do not benefit from this de-trapping mechanism. Therefore, charge trapping should be more apparent in the low-energy response of the sensor. The strength of the electric field in the depleted region also plays an important role in charge collection efficiency in the presence of charge trapping, and the effect of charge trapping can be mitigated by applying stronger drift fields in the depleted zone. To search for any trapping effects at low photon energies, responsivity curves were collected for energies ranging from 50 eV to 1000 eV (FIG. 7). The data were statistically fit (solid lines in FIG. 7), which includes a metallization layer and an active SiC layer as variable parameters. The data includes a scale factor to peak responsivity of the SiC photodiode, primarily sensitive to the charge carrier pair creation energy of the material and which was kept fixed to the value determined from the responsivity curve at 250 V bias. The width of the active layer W was calculated using the formula $W=\sqrt{2\varepsilon_0\varepsilon V_d/qN_d}$, and the metallization thickness had no statistically significant change of the bias voltage range from 20 V to 250 V. FIG. 7 shows that for all bias voltages, the estimated data is in good agreement with the experimental data. Since estimated data does not account for any charge trapping, the agreement between calculated and experimental data is a good indication of the absence or negligible trapping effects in our detectors in the low energy x-ray region.

In conclusion, high sensitivity x-ray detectors in the low energy range (50 eV to 10 keV) on n-type 4H—SiC epitaxial layers have been fabricated and evaluated. The fabricated detectors showed significantly improved response compared to the commercial COTS SiC UV photodiodes. The sensitivity to higher-energy photons (>3 keV) was limited by the active volume thickness. TSC studies in wide temperature range of 94-550 K revealed the density of deep level centers in the order of $10^{13}$ cm$^{-3}$. No effects of charge trapping on detectors' responsivity were found. The high quality of the epitaxial layer was confirmed by XRD rocking curve measurements and defect delineating chemical etching. The epitaxial detectors exhibited low leakage current (<1 nA) at 475 K revealing a great possibility of high temperature operation.

EXAMPLE 2

Schottky barrier diode (SBD) radiation detectors have been fabricated on n-type 4H—SiC epitaxial layers and evaluated for low energy x- and γ-rays detection. The detectors were found to be highly sensitive to soft x-rays in the 50 eV to few keV range and showed 2.1% energy resolution for 59.6 keV gamma rays. The response to soft x-rays for these detectors was significantly higher than that of commercial off-the-shelf (COTS) SiC UV photodiodes. The devices have been characterized by current-voltage (I-V) measurements in the 94-700 K range, thermally stimulated current (TSC) spectroscopy, x-ray diffraction (XRD) rocking curve measurements, and defect delineating chemical etching. I-V characteristics of the detectors at 500 K showed low leakage current (<2 nA at 200 V) revealing a possibility of high temperature operation. The XRD rocking curve measurements revealed high quality of the epitaxial layer exhibiting a full width at half maximum (FWHM) of the rocking curve ~3.6 arc sec. TSC studies in a wide range of temperature (94-550 K) revealed presence of relatively shallow levels (~0.25 eV) in the epi bulk with a density ~$7\times10^{13}$ cm$^{-3}$ related to Al and B impurities and deeper levels located near the metal-semiconductor interface.

SBD detectors were fabricated on n-type 4H—SiC epitaxial layer and characterized in terms of quality, electrical and defect properties, and performance for low energy x- and γ-ray detection. The results are presented from benchtop electronic characterization, XRD rocking curve measurements, defect characterization by TSC spectroscopy and chemical etching, pulse height spectra with 59.6 keV $^{241}$Am, and soft x-ray responsivity measurements performed at the National Synchrotron Light Source (NSLS) at Brookhaven National Laboratory (BNL).

Experimental Procedure:

In this work, a 50 μm thick 4H—SiC n-type epitaxial layer grown on 50 mm diameter 4H—SiC (0001) wafer was used, which was highly doped with nitrogen and off-cut 8° towards the direction. The net doping concentration of the epitaxial layer measured using high frequency (100 kHz) capacitance-voltage (C-V) method was found to be $8\times10^{14}$ cm$^{-3}$. The radiation detectors were fabricated on 8×8 mm$^2$ substrates diced from the 50 mm diameter wafer by depositing 3.2 mm in diameter and ~10 nm in thickness Ni Schottky contacts on top of the epitaxial layers through a shadow mask and using a Quorum model Q150T sputtering unit. Large Ni contacts (~6×6 mm$^2$) 100 nm in thickness was deposited on the backside by the same means.

The standard Radio Corporation of America (RCA) cleaning [6] of the substrates was carried out prior to contact deposition. No annealing was performed after the deposition of Ni contacts. The wire bonding technique has been developed in our laboratory for the electrical connections without damaging the thin Ni contact.

Figure 8:
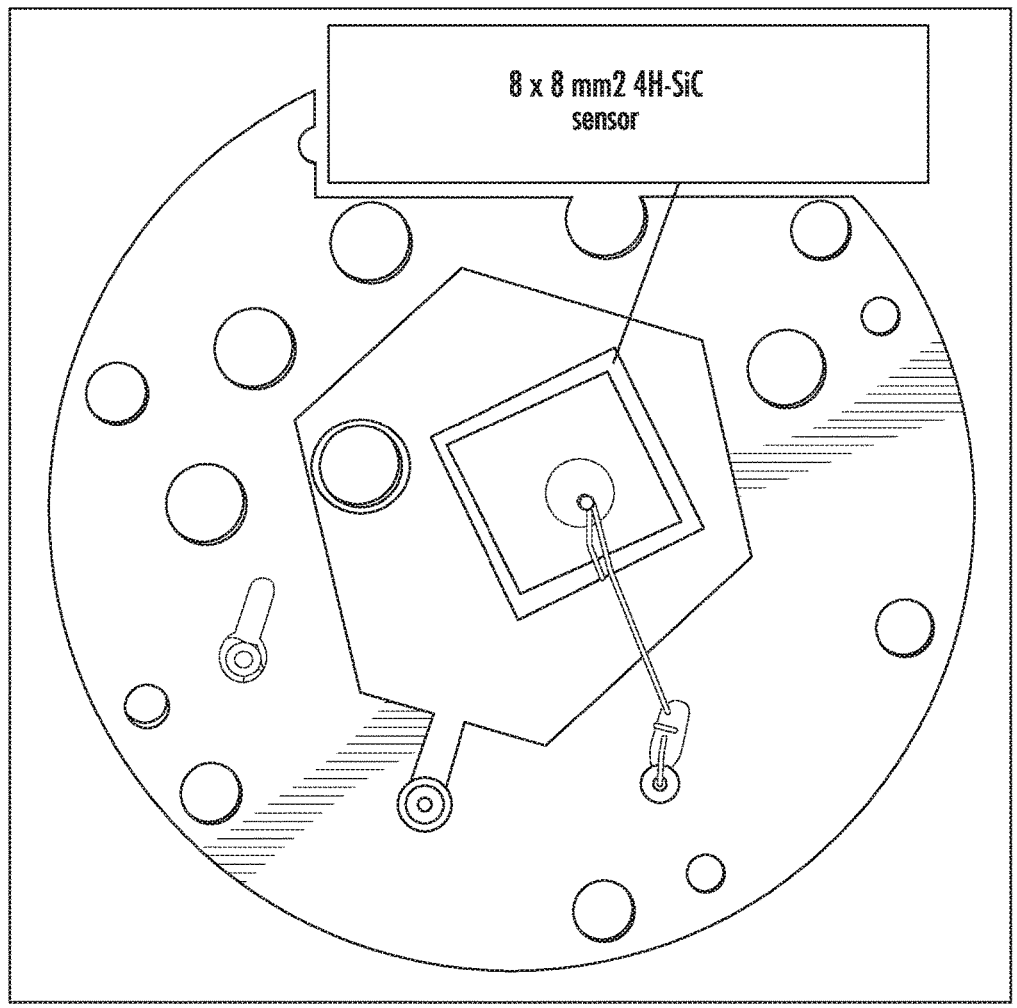
FIG. 8 shows a diagram of an exemplary 4H—SiC n-type epitaxial detector with 3.2 mm diameter Ni contact mounted on a printed circuit board (PCB), according to Example 2.

This technique deploys special type of silver paste (Pelco, 16047) rated for high temperature applications. The same type of the silver paste was used for mounting the chip on a PCB. A diagram of a single pixel detector is shown in FIG. 8.

TSC measurements on the epitaxial layer were conducted in the temperature range 94-550 K in vacuum<$1\times10^{-4}$ Torr at 4-15 K/min heat rates. The trap filling was achieved by illuminating the samples at 94 K using UVP model UVM-57 Handheld UV Lamp specified to produce 302 nm UV light. Current-voltage characterization was performed at 94-700 K range using a Keithley 237 High Voltage Source Measure Unit. National Instrument's Labview software was used to automate the I-V and TSC measurements.

In order to evaluate the density of crystallographic defects, defect delineating chemical etching in molten KOH was performed at 773 K for about 5 min. Threading edge, screw, and basal plane dislocation densities (BPDs) were assessed via etch pit density (EPD) evaluation using a Nomarski optical microscope. X-ray diffraction rocking curves were acquired using a double crystal diffractometer (model DSO-1, manufactured by Radicon Scientific Instruments Ltd., Russia). CuK$_\alpha$ radiation and (0008) reflection was used in the rocking curve measurements.

The detectors were fabricated in the laboratory at the University of South Carolina (USC) using n-type 4H—SiC epitaxial layers and were tested and evaluated at Los Alamos National Laboratory (LANL) for detecting low energy x-rays and compared to COTS SiC UV photodiode detectors. The measurements were performed at 20-250 V bias voltages using U3C and X8A beam lines at the NSLS at BNL. This beam line provides monochromatic photon beams ranging from 50 to 6500 eV with intensities as high as $10^{12}$ photons/second.

Figure 9:
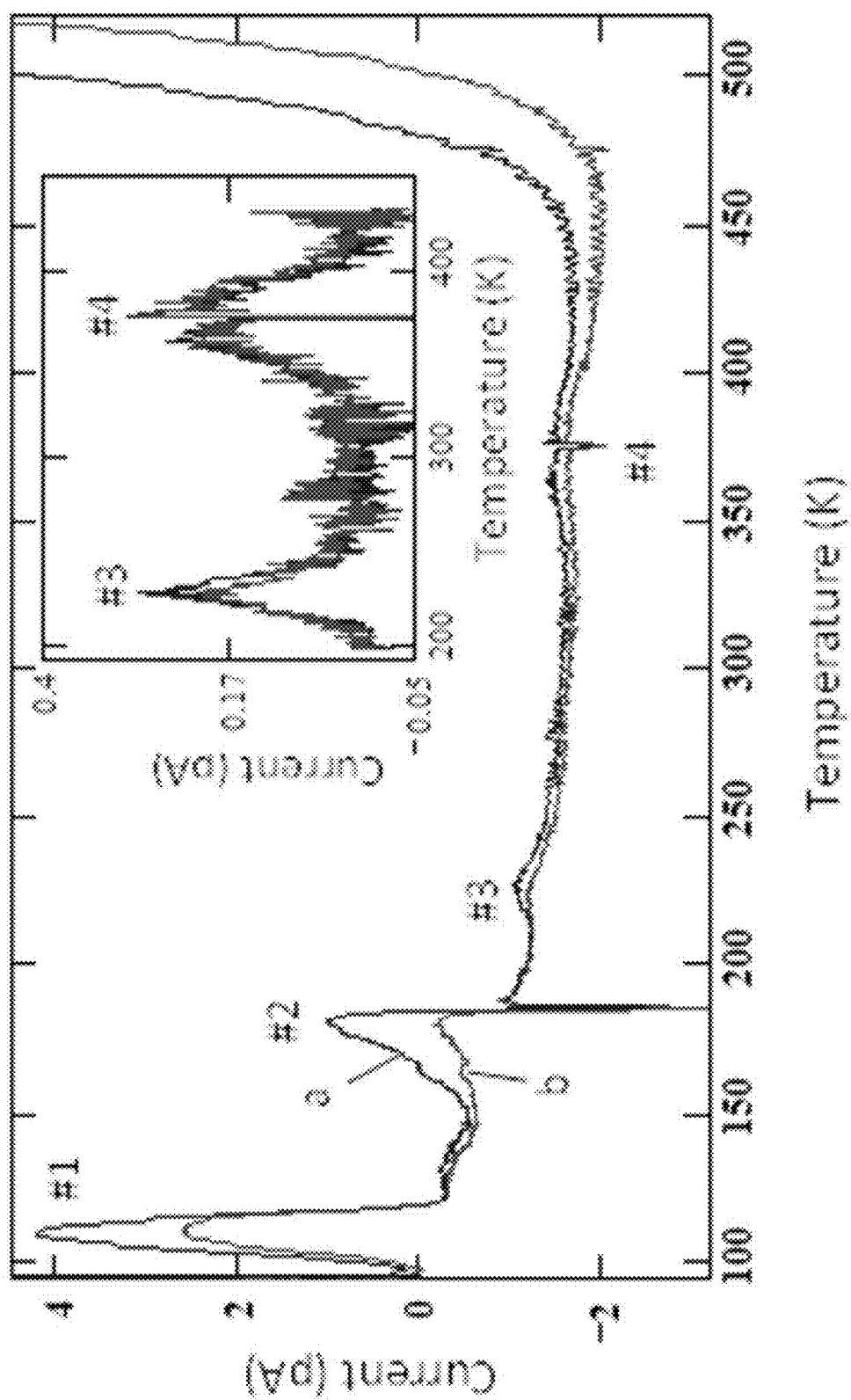
FIG. 9 shows a TSC spectra of the n-type 4H—SiC epitaxial layer obtained at 12 V (line a) and 4 V (line b) reverse bias and 15 K/min heat rate, according to Example 2.
Figure 10:
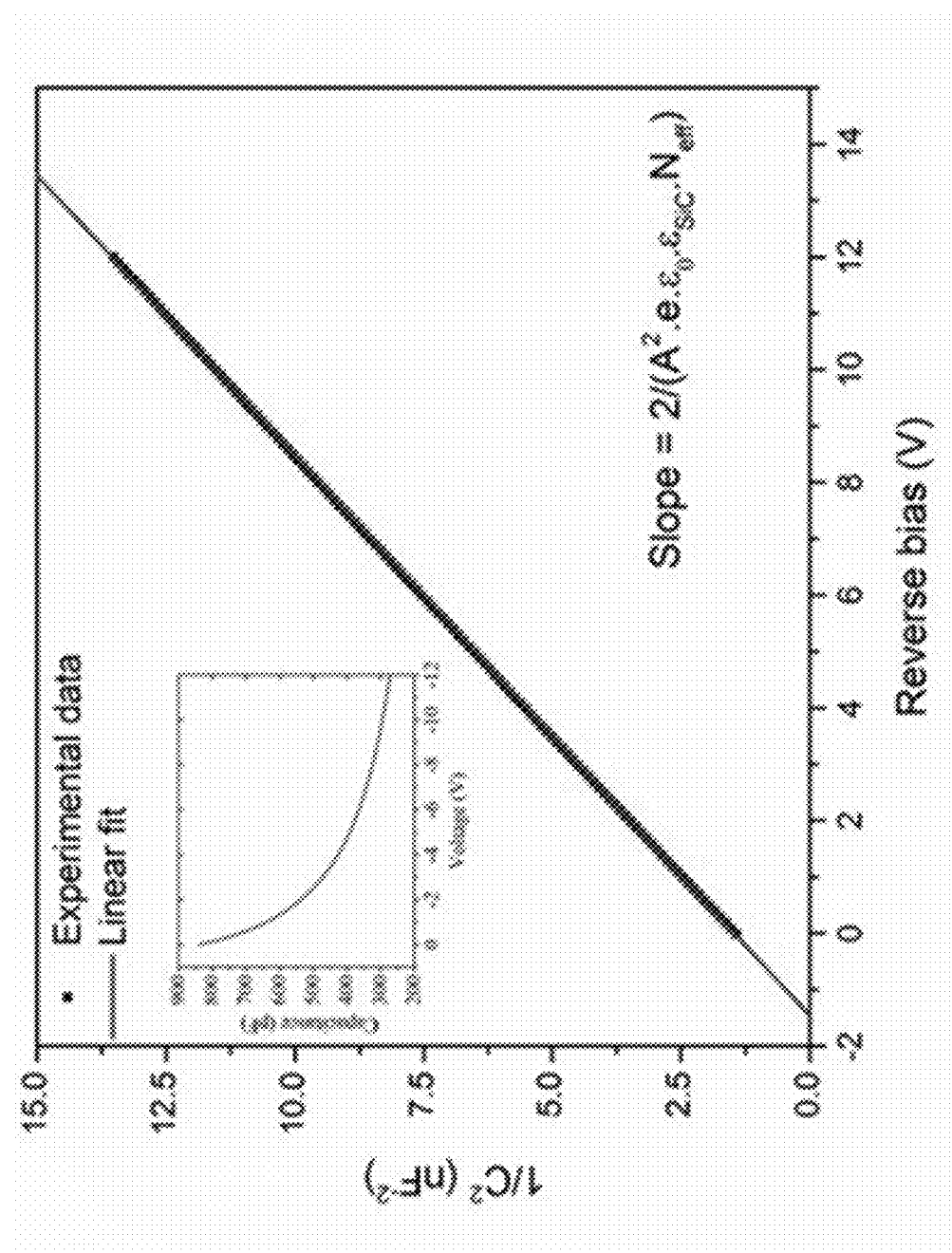
FIG. 10 shows the $1/C^2$ vs reverse bias voltage for an 4H—SiC n-type epitaxial Schottky detector according to Example 2. The inset shows the original C-V characteristic for this detector.

Results and Discussion:

TSC characterization of the detector: FIG. 9 shows TSC spectra of the detector at 4 V and 12 V reverse bias both obtained at 15 K/min heat rate. The spectra are dominated by peak #1 with maximum temperature $T_m$=109 K and activation energy ~0.25 eV estimated from Arrhenius plot (not shown). This peak is associated with shallow acceptor-like levels, 0.25 eV from valence band edge and related to Al and/or B as well as to their complexes with intrinsic defects. The intensity of this peak clearly shows voltage dependence, implying that the deep level centers are distributed at least over the ~4 μm (depletion depth at 12 V reverse bias) epilayer thickness depleted during the measurements. Assuming uniform distribution of deep level centers in the depletion region corresponding to peaks #1 we have estimated their concentration to be ~$7\times10^{13}$ cm$^{-3}$ using the equation (2)

$$N_T = \frac{Q}{A}\sqrt{\frac{2N_d}{q\varepsilon\varepsilon_0(V_{bi}+V_a)}} \quad (2)$$

where $N_T$ is the trap concentration, Q is the total charge emitted by trap of a given TSC peak as determined by the area under the peak, A is the contact area, $N_d$ is the net doping concentration, $V_{bi}$ is the built-in voltage, $V_a$ is the bias voltage, q is the electronic charge, $\varepsilon$ is the dielectric permittivity of SiC, and $\varepsilon_0$ is the dielectric permittivity of vacuum. $N_d$ was determined from C-V characteristic at room temperature (RT) in equation (2), assuming $N_T \ll N_d$. FIG. 10 shows the 1/C$^2$ vs V plot, measured by Keithley 590 C-V analyzer at 100 KHz. Although the concentration of trap centers corresponding to peak #1 is relatively high, these traps are not expected to cause significant trapping/polarization due to the shallow levels of these centers. The intensity of peak #2 also increased with the bias voltage. However, it depended on other conditions such as pumping time. Overnight pumping since the exposure of the TSC chamber and the sample to air resulted in decrease of the peaks #2 intensities by a factor of two to three. Such behavior suggests that peaks #2 might have contributions from levels/dipoles produced by adsorption of residues in the vacuum chamber (such as water) onto the surface of the sample. Additionally, peaks #2 were always distorted by the negative spike, the origin of which is unclear at this time. The intensities of peaks #3 and #4 do not show voltage dependence of the peak intensities as evidenced by inset in FIG. 9 which shows these peaks after subtraction of the stray current from corresponding portions of the spectra in FIG. 9. This indicates that these traps are located near the metal semiconductor interface and not in the bulk of the epitaxial layer. Determination of activation energies for peaks #3 and #4 from Arrhenius plot was hindered by the very weak TSC signal from these traps and low signal-to-noise ratio. Therefore, for traps corresponding to peaks #3 and #4, we performed trap identification using their maximum temperatures and results of our earlier works, where we performed TSC studies of n-type and SI 4H—SiC samples using similar conditions. The peak #3 ($T_m$~226 K) may be due to D-center, a B-related defect, boron at C-site (BC) or boron at Si site (BSi) and carbon vacancy VC, whereas peak #4 represent intrinsic defects such as IL$_2$ center.

Figure 11A:
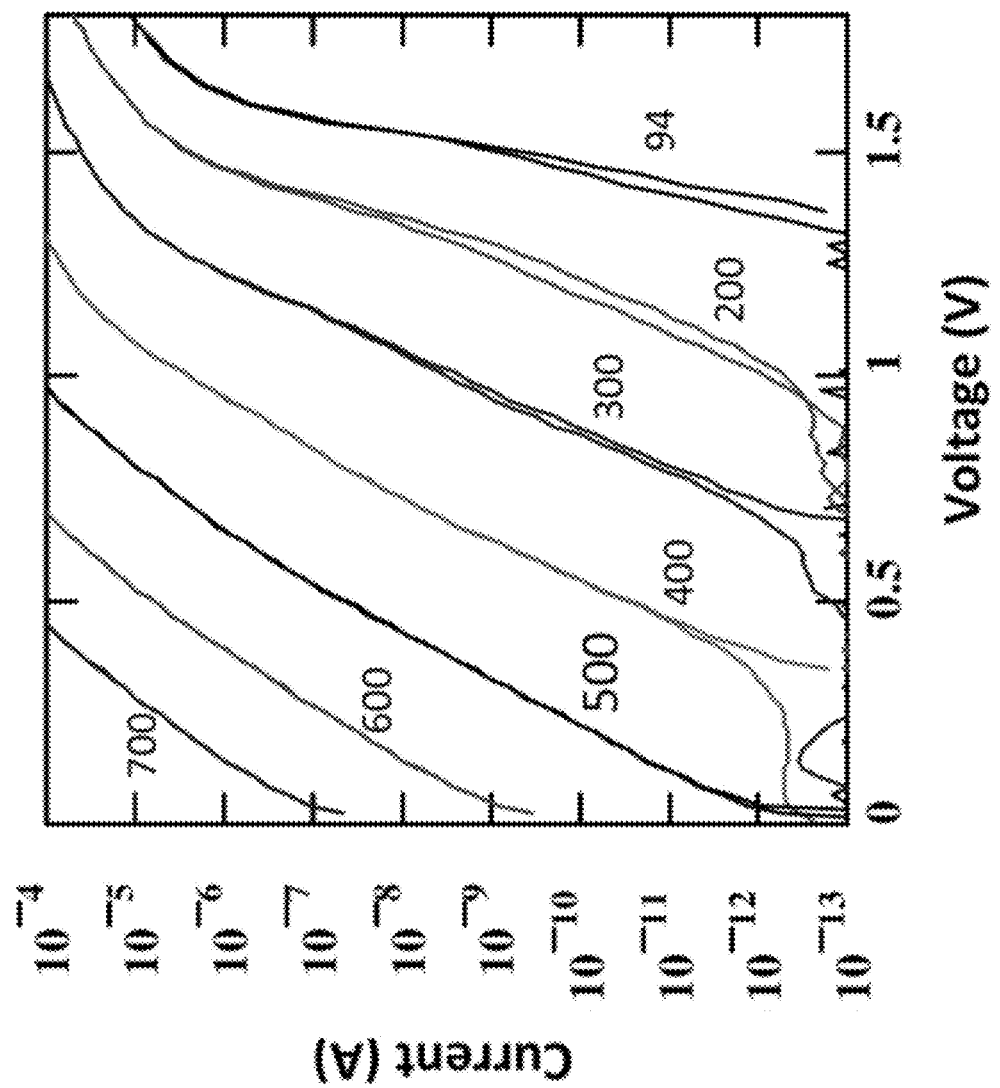
FIG. 11a shows the forward I-V characteristics at various temperatures for the 3.2 mm diameter detector on n-type 4H—SiC epitaxial layer according to Example 2 with the temperature tagged to each curve in K.
Figure 11B:
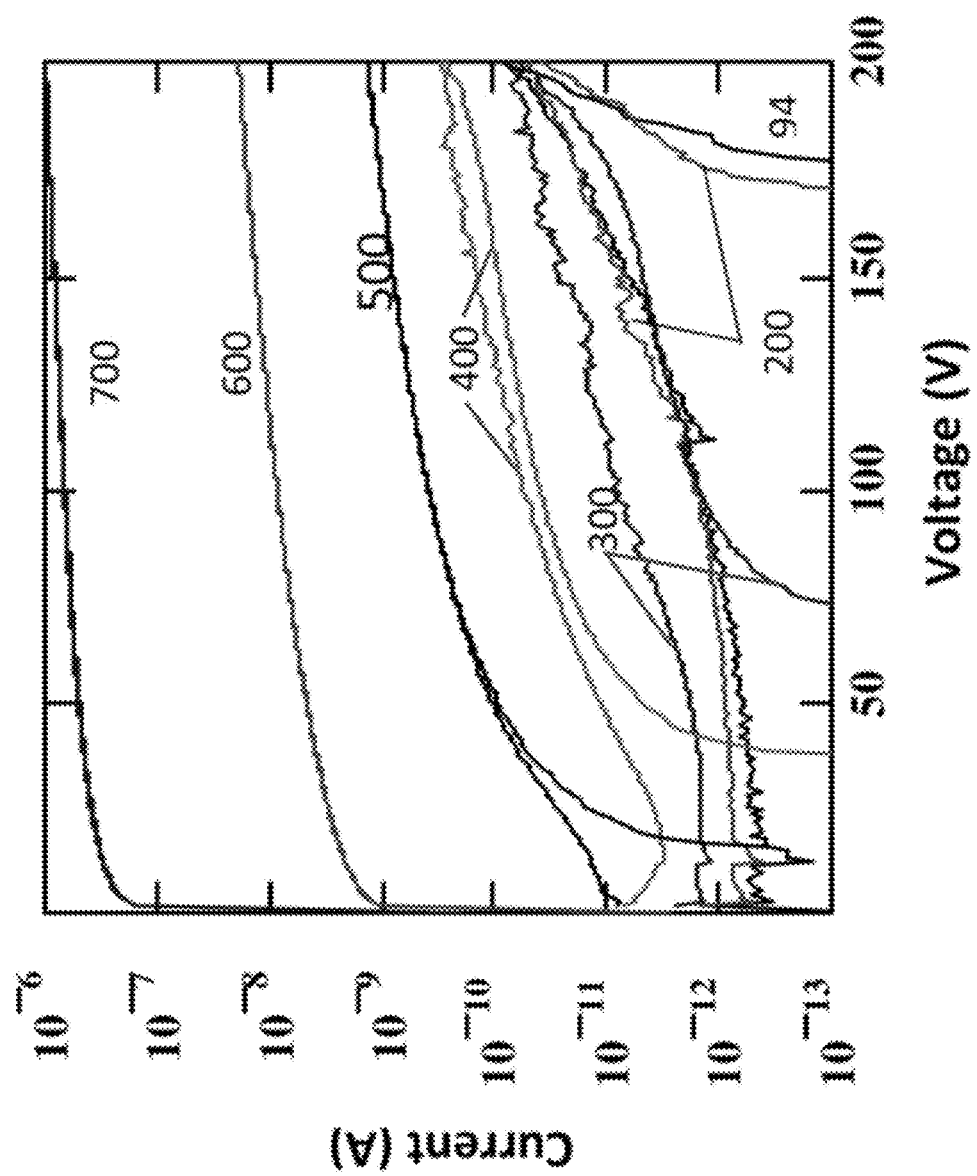
FIG. 11b shows the reverse I-V characteristics at various temperatures for the 3.2 mm diameter detector on n-type 4H—SiC epitaxial layer according to Example 2 with the temperature tagged to each curve in K.
Figure 12:
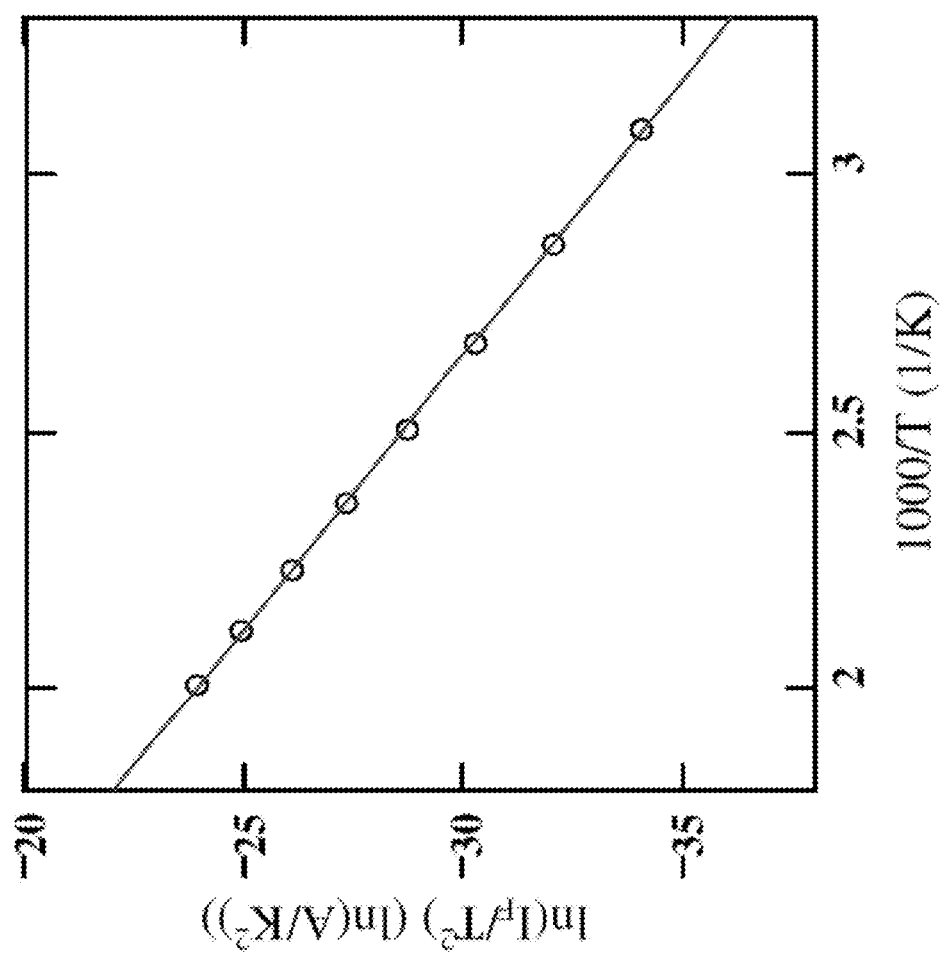
FIG. 12 shows an activation energy plot for the fabricated 4H—SiC detector according to Example 2, with the experimental data points represented by "o" and the line indicating the linear fit.

Current-voltage characterization of n-type 4H—SiC epitaxial layers: FIGS. 11a and 11b show the forward and reverse current-voltage (I-V) characteristics of the fabricated detector obtained in a temperature range of 94-700 K. The reverse I-V characteristics indicated low leakage currents at room temperature (≤0.1 nA at 200 V), which enabled high signal-to-noise ratio of the fabricated radiation detectors. The typical leakage current measured at 500 K and at 200 V applied bias was <2 nA, which is satisfactorily low for the efficient operation of the detector at such a high temperature. Since the I-V characteristics were measured using a dual stair sequence, each I-V characteristic shown in FIGS. 11a and 11b have two branches corresponding to ramping the voltage up and down. These branches did not coincide at temperatures below ~500 K resulting in a hysteresis. The hysteresis indicates a possible influence of the interface/bulk states and/or interface dipoles on the I-V characteristics. We have observed similar hysteresis in SI 4H—SiC epitaxial detectors which was attributed to the difference in the potential distribution at the Ni/SI—SiC and SI—SiC/n+SiC interfaces. Further studies are underway to explain the observed hysteresis in the I-V characteristics. The barrier height and the ideality factor were estimated from the forward I-V characteristics at each temperature using theoretical value of Richardson constant of 146 A/K$^2$ cm$^2$ and the device geometrical area of 0.08 cm$^2$. The barrier height increased monotonically from ~0.9 eV at 94 K to ~1.9 eV at 700 K and the ideality factor decreased from ~2.5 to 1 in this temperature range saturating/approaching unity at temperatures higher than 400 K. This trend of change in barrier height and ideality factor with temperature is similar to that reported in the literature. Using the activation energy method, the electrically active area $A_e$ is estimated and the effective Richardson constant $A^{}$ using the equation (3) given below $$\ln(I_F/T^2) = \ln(A_e A^{}) - q(\phi_{Bn} - V_F)/kT \tag{3}$$

where $q(\phi_{Bn} - V_F)$ is the activation energy, $I_F$ is the forward current, T is the temperature, $V_F$ is the applied forward voltage, $A_e$ is the electrically active area, $\Phi_{Bn}$ is the barrier height. FIG. 12 shows activation energy plot in the temperature range 325-500 K for $V_F$=0.8 V. Using geometrical area of the device=0.08 cm$^2$, we have determined the effective Richardson constant $A^{}$=0.074 A/K$^2$ cm$^2$, which is more than three orders of magnitude lower than the theoretically predicted value of 146 A/K$^2$ cm$^2$. On the other hand, if we use the theoretical value of Richardson constant to calculate electrically active area $A_e$, its value would be more than three orders less than the device geometrical area resulting in the electrically active diameter of the contact ~0.1 mm. Similar result of underestimated Richardson constant by 2-5 orders of magnitude derived from I-V measurements was reported by different groups of researchers. The reason of the large underestimation of Richardson constant is not very clear at this time. The authors of associate it with spatial inhomogeneities of Schottky barrier resulting in very small electrically active area, admitting at the same time that it was not possible to directly detect these inhomogeneities. On the other hand Hacke et al. ascribed very small values of $A^{}$ in nearly ideal GaN Schottky diodes, to a very thin barrier at the metal semiconductor interface through which the electron tunnels.

Figure 13:
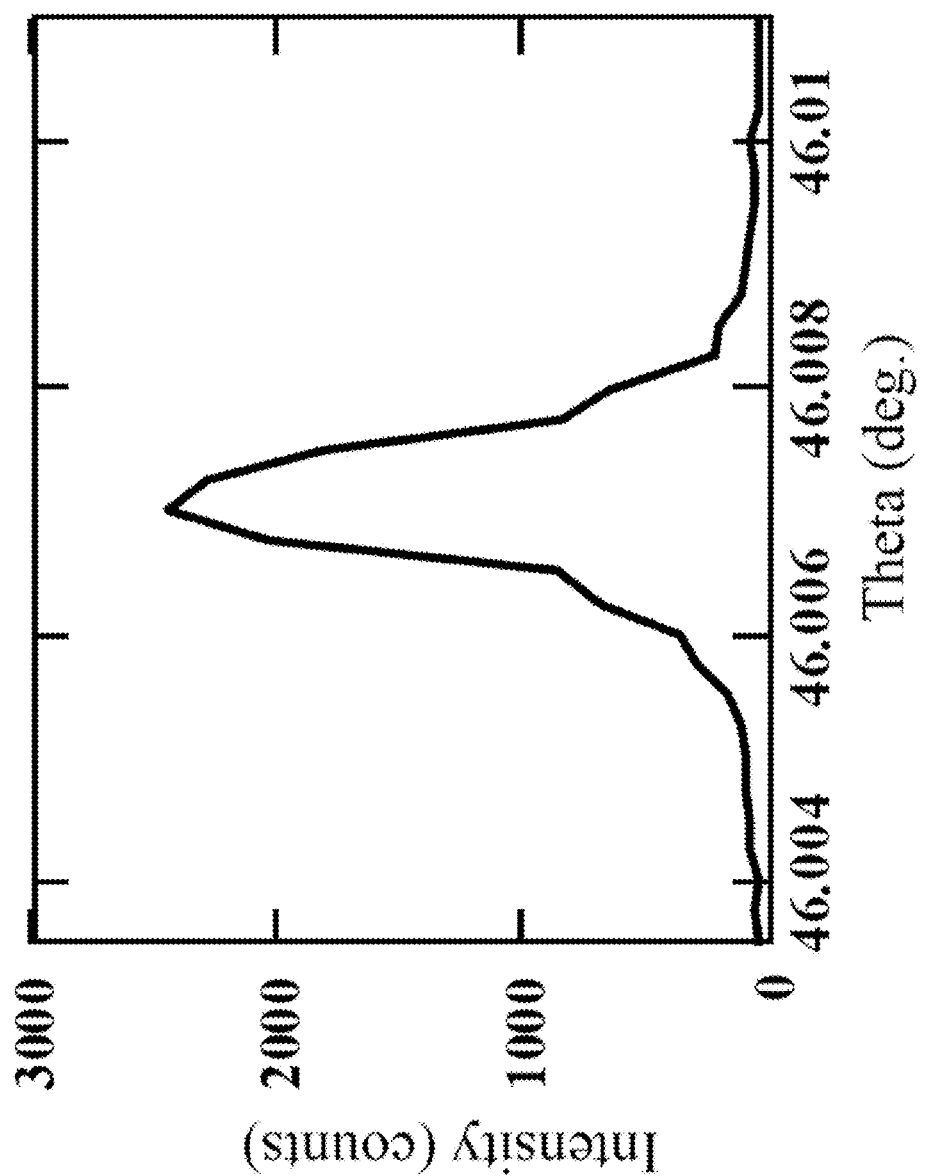
FIG. 13 shows the rocking curve (0008) reflection) of the 4H—SiC epitaxial layer used for detector fabrication according to Example 2.

Quality evaluation of epitaxial layer: Quality of the epitaxial layers used for detector fabrication and operation was assessed by defect delineating chemical etching in molten KOH and XRD rocking curve measurements. The rocking curve width is an important parameter when determining a crystalline quality. The narrower the rocking curve, the higher the crystalline quality. FWHM of the rocking curve is often reported to highlight the crystal quality. The broadening of the rocking curve can be due to various reasons, such as dislocations, mis-orientation or residual strain. For the reflection geometry used in our studies, FWHM of the rocking curve can be calculated using equation (4):

$$FWHM = \frac{2r_e \lambda^2}{\pi V \sin 2\theta_B} \frac{1}{\sqrt{\gamma}} |C| \sqrt{F_{hkl} F_{\overline{hkl}}} \tag{4}$$

where $r_e$ is the classical electron radius, $\lambda$ is the x-ray wavelength, V is the volume of the unit cell, $\theta_B$ is the Bragg angle, $\gamma = \cos(\psi_h)/\cos(\psi_0)$ is the asymmetric ratio, $\Psi_h$ and $\Psi_0$ are the angles between the normal to the crystal surface directed inside the crystal and the reflected and incident directions of x-ray waves respectively, C is the polarization factor (C=1 for $\sigma$ polarization and C=$\cos 2\theta_B$ for $\pi$ polarization) and $F_{hkl}$ is the structure factor with the modulus for (0001) reflection in 4H—SiC (back-reflection geometry) given by equation (5):

$$|F_{000l}| = 4\sqrt{f_{Si}^2 + f_C^2 + 2 f_{Si} f_C \cos(3\pi l/8)} \tag{5}$$

where $f_{Si}$ and $f_C$ are the atomic scattering factors of Si and C atoms respectively. For coarse estimation we have calculated the atomic scattering factor f using the 9-parameter equation (5) derived by Cromer and Mann.

$$f = c + \sum_{i=1}^{4} a_i \exp[-b_i \sin^2(\theta/\lambda)] \tag{6}$$

where $a_i$, $b_i$, and c are the atom-specific Cromer-Mann coefficients. Using the equations (4-6), the FWHM of the (0008) reflection was calculated to be ≤2.7 arc sec. The experimentally obtained rocking curve for this reflection, shown in FIG. 13, has a FWHM of ~3.6 arc sec, revealing high crystalline quality of the epitaxial layers.

Results of defect delineating etching showed an etch pit density (EPD) of threading screw dislocations (TSDs)~1.7×10$^3$ cm$^{-2}$, threading edge dislocations (TEDs)~1×10$^4$ cm$^{-2}$, and BPDs ~70 cm$^{-2}$. These dislocation densities are much lower than that reported in our earlier studies, reflecting improved quality of the epitaxial layer used in this study.

Figure 14:
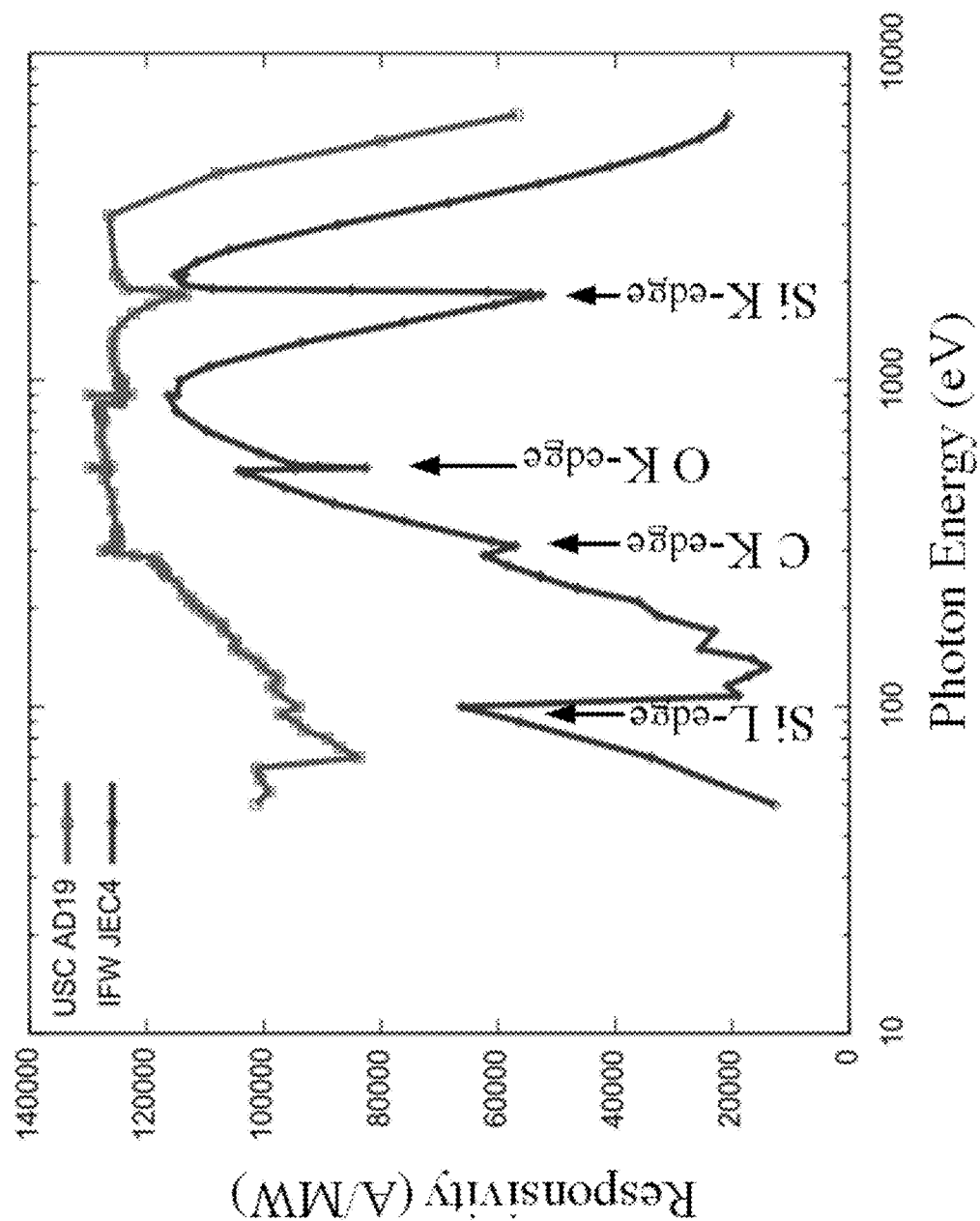
FIG. 14 shows the measured responsivity of a 4H—SiC n-type epitaxial device biased to 250 V and an IFW JEC4 photodiode biased to 120 V, according to Example 2.

Low energy x-ray and γ-ray detection: Synchrotron light sources are highly suitable for probing the physical construction of photonic sensors and can also provide an absolute measurement of their responsivity. The sensors fabricated at USC using n-type 4H—SiC epitaxial layers were tested and evaluated at NSLS at BNL for detection of low energy x-rays and compared to the commercial off-the-shelf (COTS) SiC UV photodiode by IFW, model JEC4 (the best commercially available for this application). At present, no x-ray spectrometer for such a low energy spectral range is available commercially. FIG. 14 shows the responsivity of our detector and COTS SiC UV photodiode to soft x-ray energy ranges for respective bias voltages of 250 V and 120 V, and the following results were derived using a statistical analysis of these data based on energy-dependent x-ray attenuation lengths. Responsivity, given in units of A/MW, is measured using the U3C and X8A lines by recording successive measures of photocurrent in response to a high flux, mono-energetic beam of photons in a well-calibrated silicon sensor (with known responsivity) and in the sensor of interest. Dead layers and a limited active volume thickness lead to responsivity that varies greatly with photon energy. Further, edges are also apparent in the responsivity curve, arising from discrete atomic transitions. Edges associated with silicon and carbon is clearly observed in the data, providing a quantitative measure of the composition and dimension of the active and dead layers. The general feature of a steep decrease starting at 2-3 keV provides information on active layer thicknesses, which is deduced to be 21 µm in our detector compared to roughly 6 µm for the JEC4 diode. Because of the higher active layer thickness our sensor chip showed significantly improved response in the few keV range compared to COTS SiC UV photodiode. Our detector has shown much higher response in the low energy part of the spectra as well, which could be attributed to a much thinner dead/blocking layer, deduced from the responsivity curve to result solely from the 10 nm thick nickel layer (which leads to the pronounced edge at 70 eV). In comparison, the JEC4 diode has been found to include a significant oxidation and inactive SiC layer on the order of 100 nm each, which limits responsivity at low photon energies. It should be noted that the JEC4 diode is intended for UV detection, for which it is well suited. The significant dead layers are likely due to passivation, which may be preferred over reducing the thickness of dead layers on the active face of the sensor.

Figure 15A:
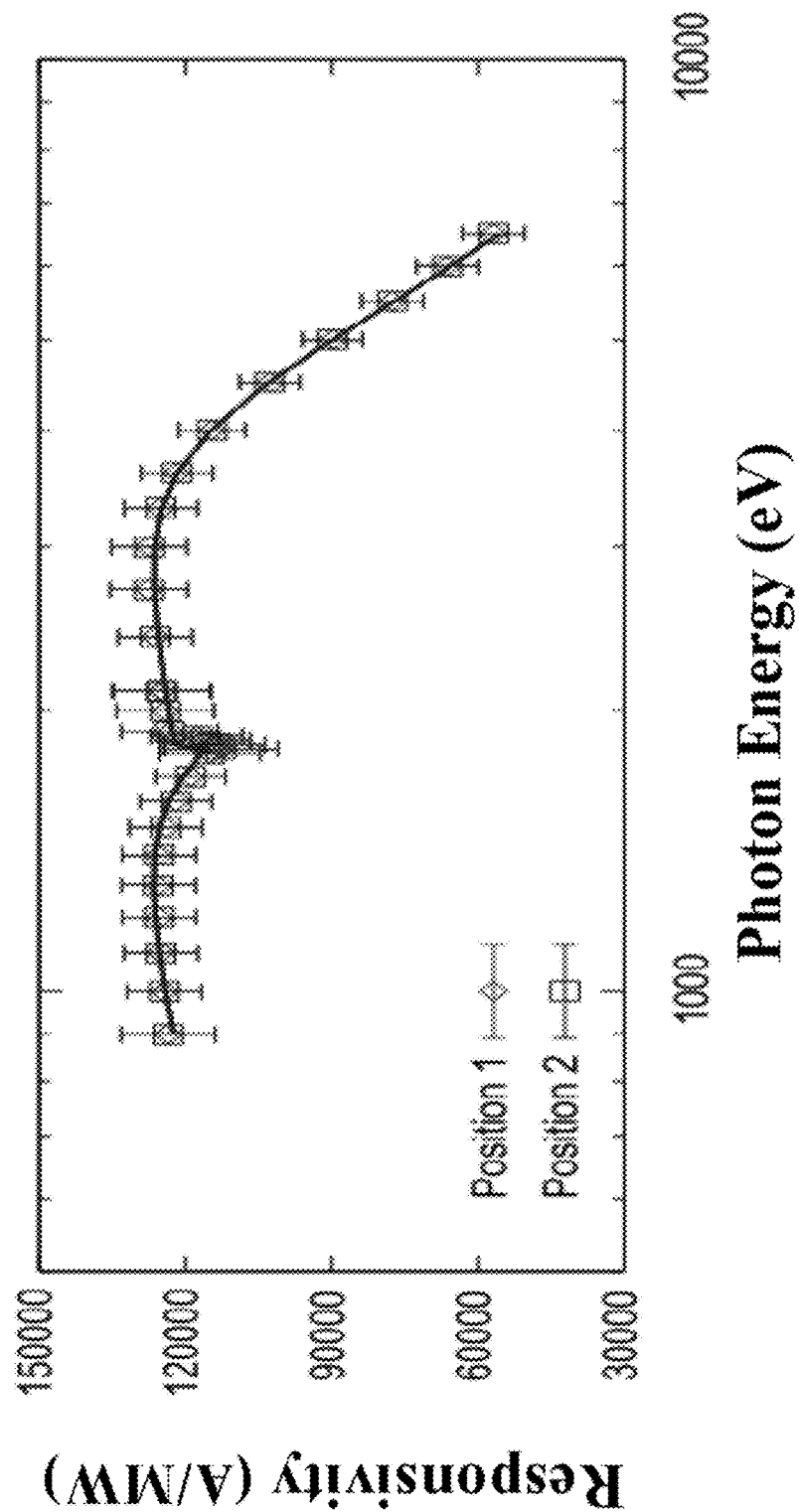
FIG. 15a shows the responsivity of the detectors on 4H—SiC, according to Example 2, n-type epitaxial layer at two different locations.
Figure 15B:
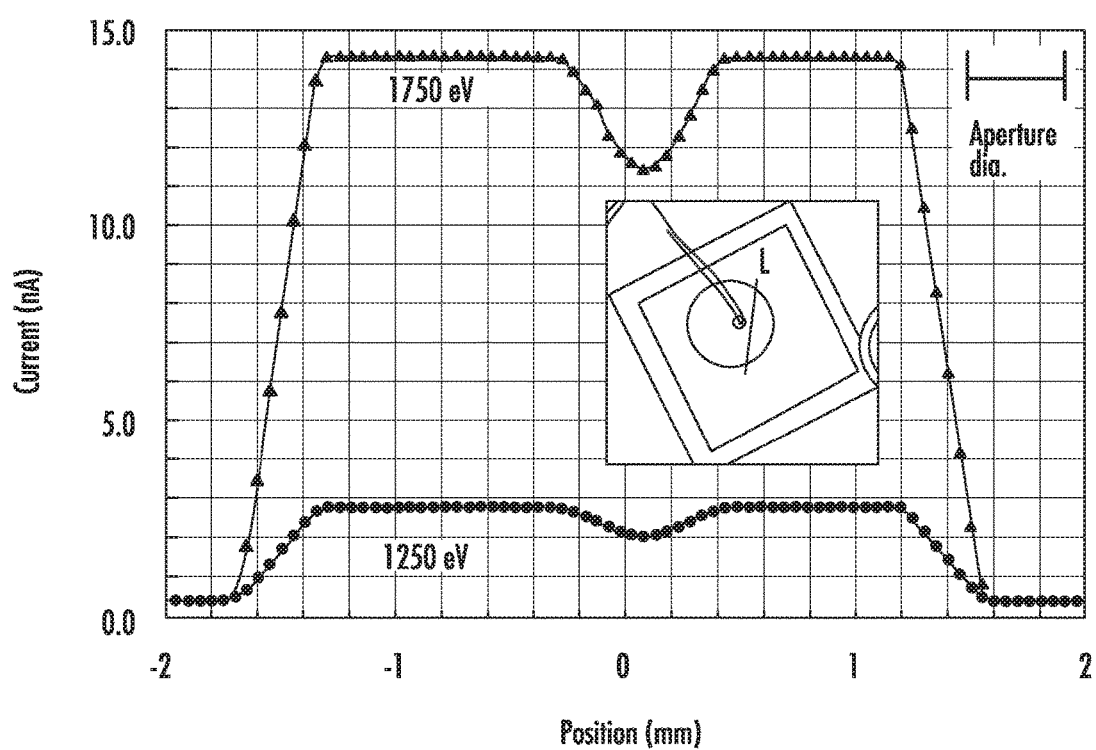
FIG. 15b shows the surface scan profiles along line L obtained to assess detector's uniformity, according to Example 2.
Figure 16:
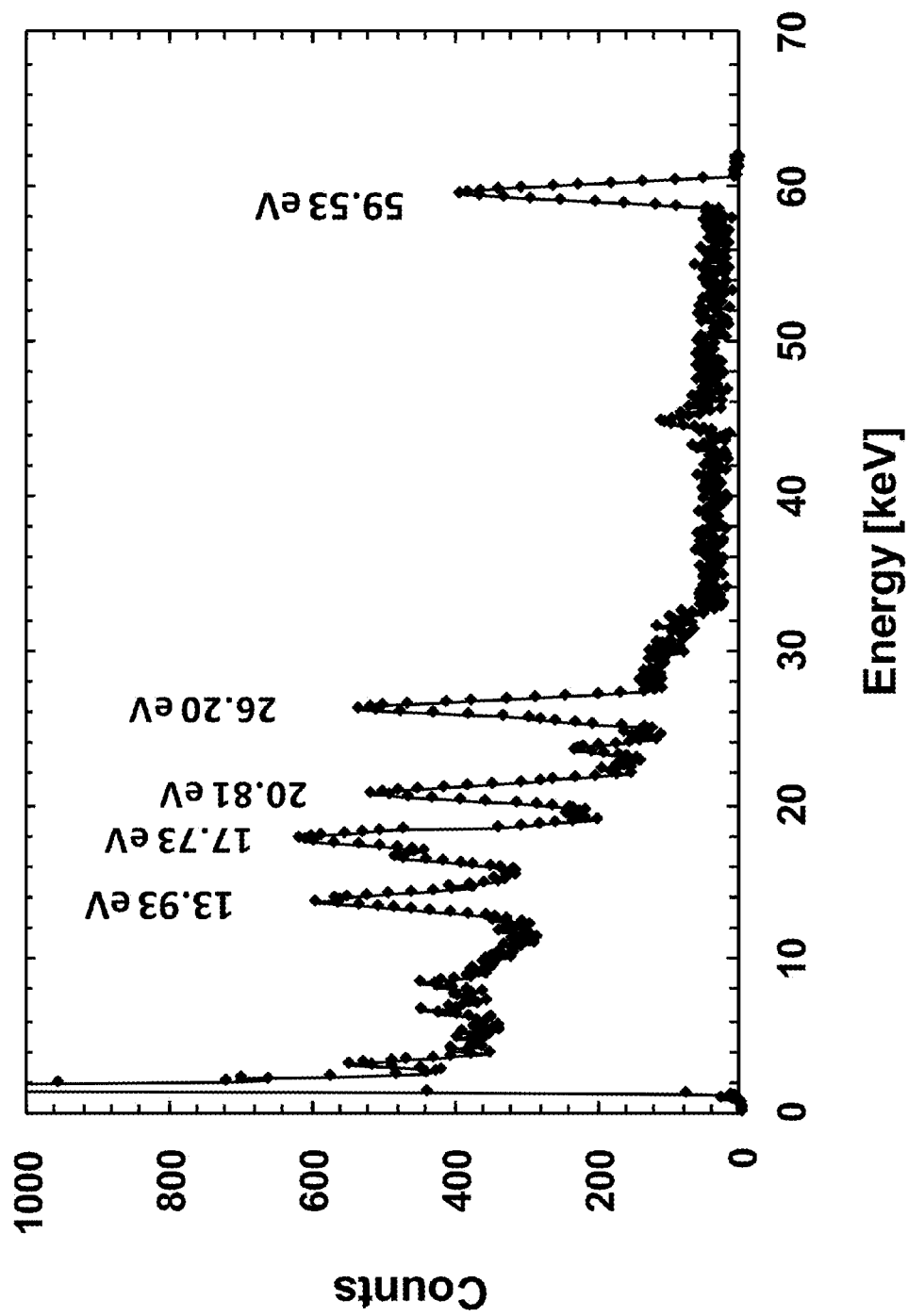
FIG. 16 shows $^{241}$Am spectrum of a 4H—SiC detector (8.0 mm$^2$) at 300 K, 250 V bias and 4 μs shaping time, according to Example 2.

Our detector has also exhibited very good spatial uniformity in measured responsivity. FIGS. 15a and 15b show responsivity at two different locations and line scan profiles for two different x-ray energies. Note that the decrease of the detector's current at about 0 mm (FIG. 15b) is due to the crossing the location of wire bonding and not due to detector's imperfection. The SiC detectors were connected to low-noise front end electronics developed in-house for pulse-height spectroscopy. Pulse height measurements were carried out at room temperature by irradiating the 4H—SiC detectors with ~1 µCi$^{241}$Am X-γ ray source (active diameter of 8 mm, ~16 months old—some presence of $^{237}N_p$ is not ruled out). The source to detector distance was kept about 10 mm and the total acquisition time was 10 minutes (600 sec). FIG. 16 shows high resolution in detecting 59.6 keV gamma rays with the detector biased at 250 V. The best spectrum obtained was with an FWHM of 1.2 keV (2.1%) at 59.6 keV, which is comparable with the resolutions achieved using our recently fabricated high quality SiC and CdZnTe detectors. The detector also detected low energy x-rays of 26.20, 20.81, 17.73 and 13.93 keV.

Conclusion:

The radiation detectors on n-type 4H—SiC epitaxial layer have been fabricated and evaluated for detection of low energy x- and γ-rays. The fabricated detectors showed significantly improved response in the soft x-ray ranges compared to the COTS SiC UV photodiodes. The sensitivity to higher-energy photons was limited by the active volume thickness and the detectors showed high resolution (~2.1%) in detection of 59.6 keV γ-rays ($^{241}$Am). TSC studies in wide temperature range of 94-550 K revealed relatively shallow levels (~0.25 eV) in the epi bulk with the density ~7×10$^{13}$ cm$^{-3}$ related to Al and B impurities and deeper levels located near the metal semiconductor interface. The high quality of the epitaxial layer was confirmed by XRD rocking curve measurements and defect delineating chemical etching. The epitaxial detectors exhibited low leakage current (<2 nA) at 500 K revealing a great possibility of high temperature operation.

EXAMPLE 3

Schottky barrier detectors were fabricated on 50 µm n-type 4H—SiC epitaxial layers grown on 360 µm SiC substrates by depositing ~10 nm nickel contact. Current-voltage (I-V) and capacitance-voltage (C-V) measurements were carried out to investigate the Schottky barrier properties. The detectors were evaluated for alpha particle detection using a $^{241}$Am alpha source. An energy resolution of ~2.7% was obtained with a reverse bias of 100 V for 5.48 MeV alpha particles. The measured charge collection efficiency (CCE) was seen to vary as a function of bias voltage following a minority carrier diffusion model. Using this model, a diffusion length of about 3.5 µm for holes was numerically calculated from the CCE vs bias voltage plot. Rise-time measurements of digitally recorded charge pulses for the 5.48 MeV alpha particles showed a presence of two sets of events having different rise-times at a higher bias of 200 V. A biparametric correlation scheme was successfully implemented for the first time to visualize the correlated pulse-height distribution of the events with different rise-times. Using the rise-time measurements and the biparametric plots, the observed variation of energy resolution with applied bias was explained.

The fabrication of a low-leakage radiation detector on 4H—SiC n-type epilayer and a systematic study of its performance as an alpha particle detector are provided. The detector has been characterized using I-V, C-V, and alpha ray spectroscopic measurements. The room temperature I-V measurements revealed a very low leakage current of ~0.8 nA at 250 V reverse bias. Charge collection efficiencies (CCE) were measured as a function of bias voltage for 5.48 MeV alpha particles. Using the experimentally obtained CCE values and a minority carrier diffusion model, contribution of hole diffusion to the charge collection efficiency values and the hole diffusion length has been numerically calculated. Digital spectroscopic methods were adopted to obtain the rise-time of pulses and biparametric correlation plots. Using the rise-time distribution and the biparametric plots, the observed increase in FWHM values for the alpha particles at higher bias has been explained.

Experimental: Detector Fabrication

Figure 17:
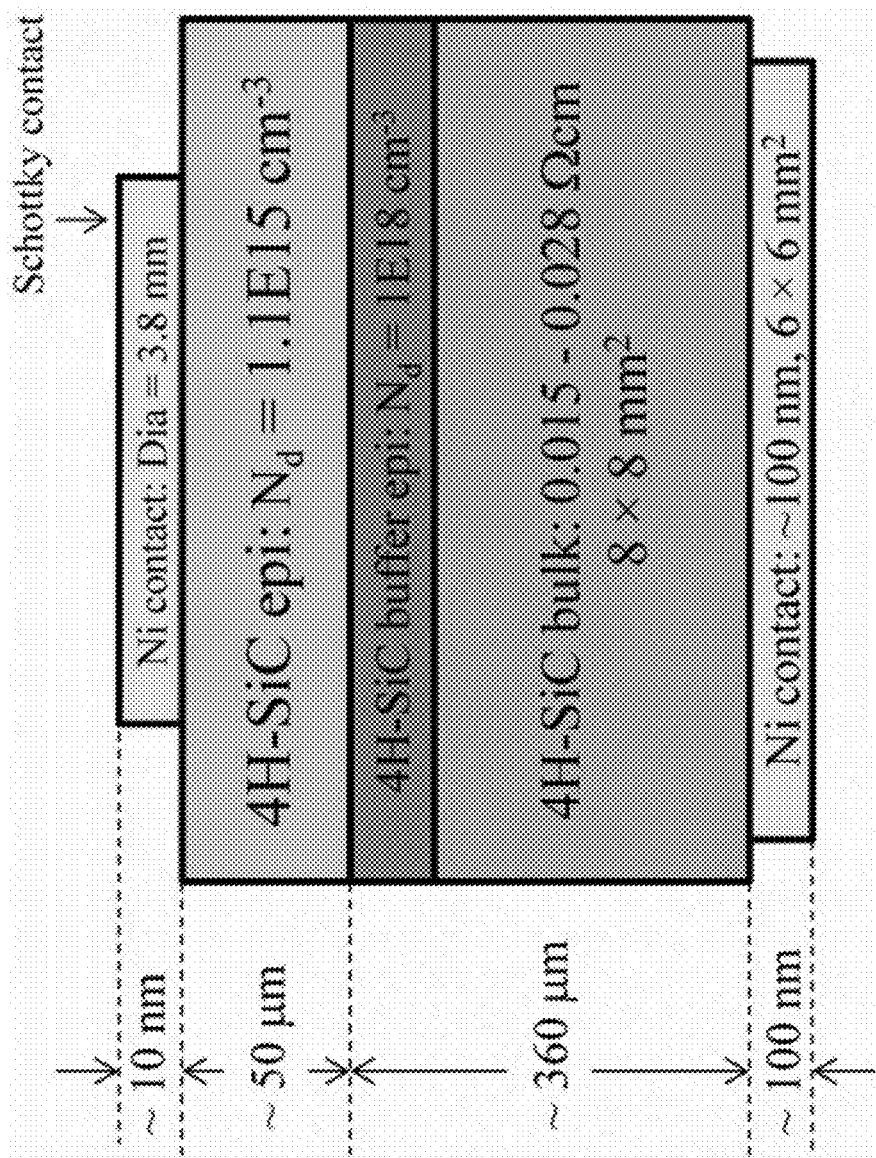
FIG. 17 shows a general schematic diagram of n-type 4H—SiC epilayer Schottky barrier detector according to Example 3.

A 50 µm thick n-type epitaxial layer grown on a 50 mm diameter 4H—SiC (0001) wafer was fabricated with highly doped with nitrogen and 8° off-cut towards the [112 $\bar{0}$] direction. The net doping concentration of the epitaxial layer measured using high frequency (100 kHz) capacitance-voltage (C-V) method was found to be 1.1×10$^{15}$ cm$^{-3}$. A micropipe defect density less than 15 cm$^{-2}$ has been evaluated using Nomarski optical microscopy and scanning electron microscopy (Quanta 200 SEM, low vacuum mode) on a sister sample. The radiation detectors were fabricated on 8×8 mm$^2$ substrates diced from the 50 mm diameter wafer by depositing 3.2 mm diameter Ni Schottky contacts ~10 nm in thickness on top of the epitaxial layers through the shadow mask using a Quorum model Q150T sputtering unit. Large Ni contact (approx. 6×6 mm$^2$) 100 nm in thickness was deposited on the opposite surface for the back contact. Standard RCA cleaning procedure of the wafer was carried out prior to the contact deposition. The wafer was then mounted on a printed circuit board (PCB) and wire bonded for proper electrical connection. FIG. 17 shows a schematic diagram of the cross-section of the detector fabricated for the present studies.

Experimental: Electrical Characterization

Current-voltage (I-V) measurements were carried out on these detectors using a Keithley 237 sourcemeter. Forward and reverse bias characteristics were acquired to obtain the diode parameters and leakage current. Capacitance-voltage (C-V) measurements were carried out using a Keithley 590 CV analyzer at a frequency of 100 kHz. The effective doping concentration was calculated using standard 1/C$^2$ vs V plots. All measurements were carried out at room temperature.

Experimental: Alpha Spectroscopy

Pulse height spectra of alpha particles from a 0.1 µCi$^{241}$Am alpha source were recorded using a standard analog spectrometer. The source and the detector were placed inside an EMI shielded aluminum box which was constantly evacuated using a rotary pump in order to minimize scattering of alpha particle with air molecules. The source used was a broad window (2 mm) source kept at a distance of 1.5 cm from the detector window ensuring that the whole surface of the detector was illuminated. The detector signals were collected using a Cremat CR110 charge sensitive pre-amplifier. The charge pulses were shaped using an Ortec 572 spectroscopy amplifier. The amplified signals were then digitized and binned to obtain pulse-height spectra using a Canberra Multiport II ADC-MCA unit controlled by Genie 2000 interface software. The peaks obtained in various spectra were fitted using peak analyzer function of Origin 8.6. Charge collection efficiencies (CCE) were measured using the same alpha source at different reverse bias voltages as the ratio of energy deposited in the detector to the actual energy of particles (5.48 MeV) emitted by the source. The energy deposited was calculated from the alpha peak position in a calibrated MCA.

Digital spectroscopic measurements were accomplished using a GWInstek (GDS 1062A) digital oscilloscope used as a digitizer with a sampling rate of 1 Ms/sec and 8 bit ADC resolution. The pre-amplifier pulses were digitized and recorded in a PC for offline analysis. At least 5000 pulses were recorded to obtain decent statistics. The data acquisition and the offline analysis software were designed in-house using the LabVIEW and MATLAB programming languages, respectively. The analyses involved calculation of the 10-90% rise-time of the charge pulses and pulse-height determination after shaping the pre-amplifier signal. The Gaussian shaping of the pulses were achieved using a transfer function resembling CR-RC4 semi-Gaussian configuration. The software was also used to obtain distributions of pulse-height and rise-time and biparametric plots to investigate any type of correlation between the pulse-heights and pulse-shapes of a set of events.

Results and Discussion: Electrical Measurements

Figure 18:
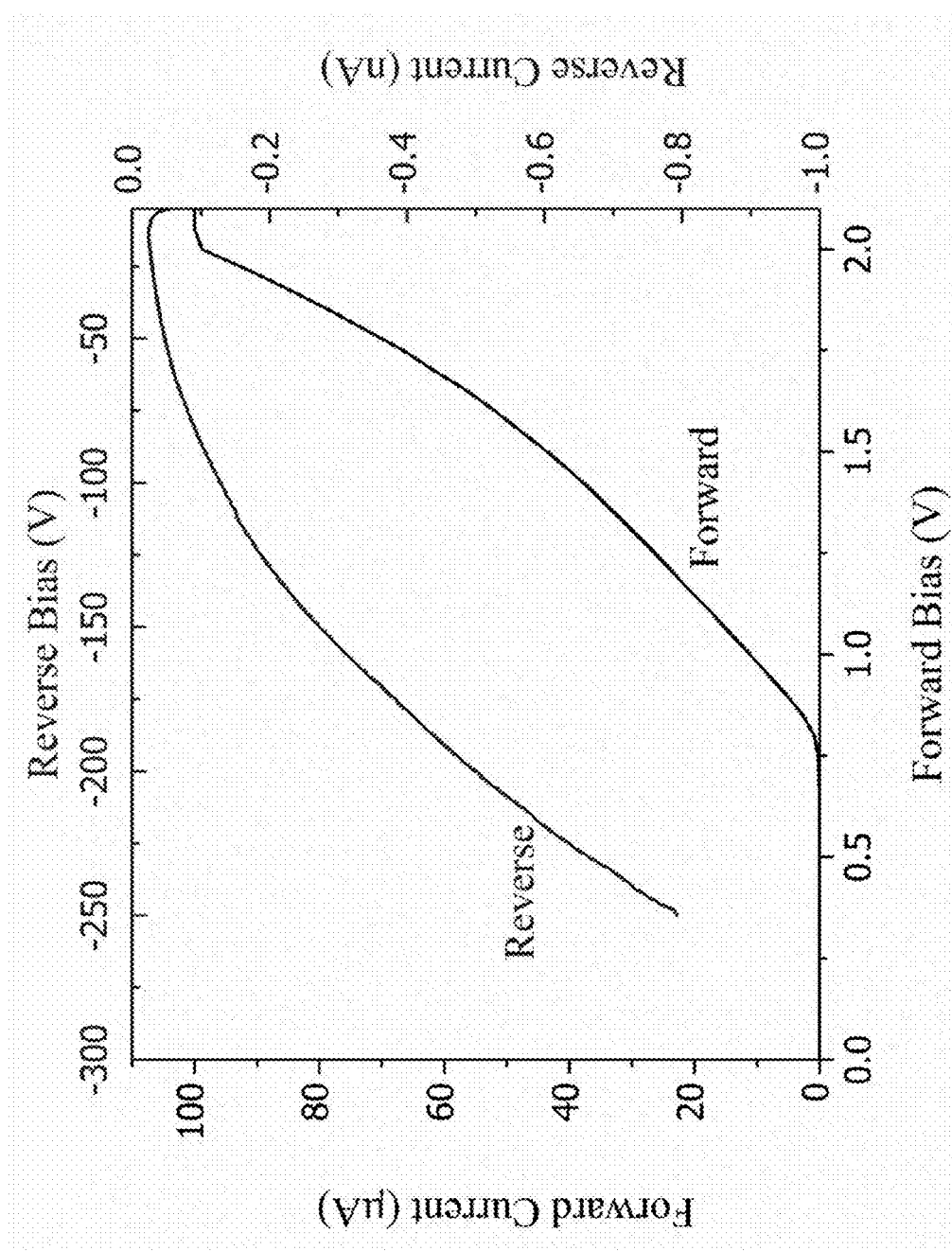
FIG. 18 shows the room temperature I-V characteristics at forward and reverse bias for n-type 4H—SiC epitaxial Schottky detector according to Example 3.

FIG. 18 shows I-V characteristics of the detector at forward and reverse bias. The room temperature reverse bias leakage current was found to be ~0.8 nA at a bias voltage of 250 V and ~0.2 nA at 100 V. A diode ideality factor of 1.4 and a Schottky barrier height of 1.3 eV was found from the forward I-V characteristic and using a thermionic emission model given by equation (7)

$$I = I_S \left( e^{\frac{\beta V_a}{n}} - 1 \right) \quad (7)$$

where $I_S$ is the saturation current, $V_a$ is the applied voltage, n is the diode ideality factor and $\beta = q/(k_B T)$, q being the electronic charge, $k_B$ the Boltzmann constant, and T is the absolute temperature. The saturation current is given by equation (8)

$$I_S = A^* A T^2 (e^{-\beta \phi_B}) \quad (8)$$

where $A^*$ is the effective Richardson constant (146 Acm$^{-2}$K$^{-2}$ for 4H—SiC), A is the area of the diode, $\phi_B$ is the Schottky barrier height and n is the diode ideality factor.

The barrier height thus calculated depends on the spatial homogeneity of the Schottky barrier height. An ideality factor greater than unity, indicates non-uniformity in the surface barrier height, which in turn indicates the possibility of the presence of traps in the depletion region.

Figure 19:
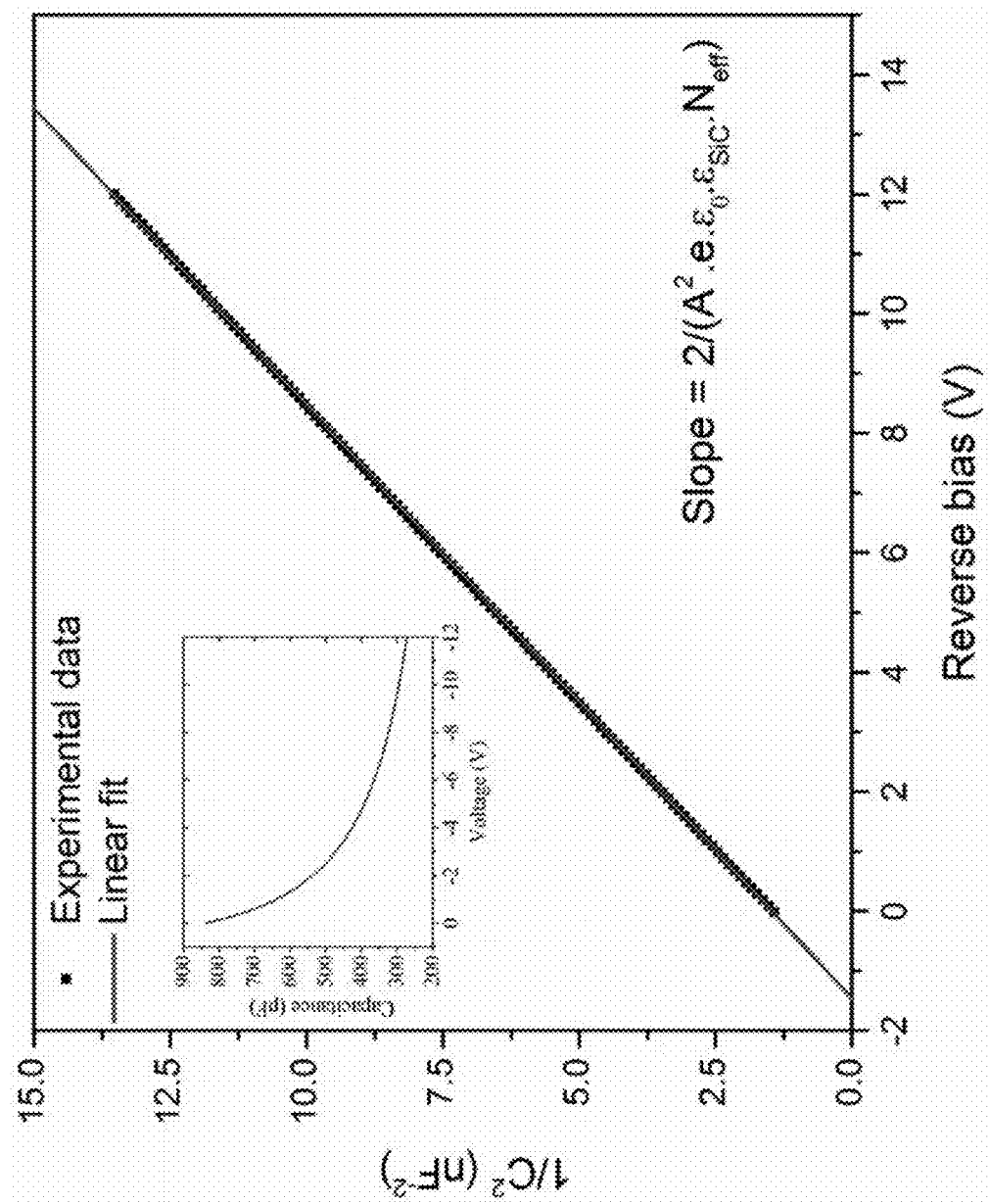
FIG. 19 shows a $1/C^2$ vs V plot for n-type epitaxial 4H—SiC Schottky barrier detector according to Example 3. The solid line shows the linear fit to the experimental data. Effective doping concentration (Neff) is derived from the slope of the linear fit and using the formula shown, where A is the area, e is the electronic charge, $\in_0$ is permittivity of vacuum and $\in_{SiC}$ is the dielectric constant of 4H—SiC. The original C-V plot has been shown in the inset.

FIG. 19 shows a $1/C^2$ vs $V_a$ plot obtained for the present detector. A linear fit to the curve gives an effective doping concentration value $N_{eff}=1.1 \times 10^{15}$ cm$^{-3}$ and a built-in potential ($V_{bi}$) of 1.4 V. The barrier-height was also calculated from the C-V characteristics to be 1.47 eV, using the equations 9 and 10 given below $$\phi_{B(C-V)} = V_{bi} + V_n \quad (9)$$

where, $V_n$ is the potential difference between the Fermi level energy and the bottom of the conduction band in the neutral region of the semiconductor and is given by equation (10)

$$V_n = kT \ln \frac{N_C}{N_D} \quad (10)$$

where $N_C$ is the effective density of states in the conduction band of 4H—SiC and is taken equal to $1.6 \times 10^{19}$ cm$^{-3}$. The barrier height calculated from the C-V measurements is slightly higher than that obtained from the forward I-V characteristics. The value of barrier-height obtained from forward I-V characteristics is dominated by low Schottky barrier-height locations in an inhomogeneous Schottky diode. So, the barrier-height thus calculated shows lower values than that obtained from C-V characteristics, which on the other hand gives an average value of the barrier height for the whole diode. Hence, the larger value of barrier height calculated from the C-V measurements further confirms the inhomogeneity of the surface barrier height.

Results and Discussion: Alpha Spectroscopic Measurements

Figure 20:
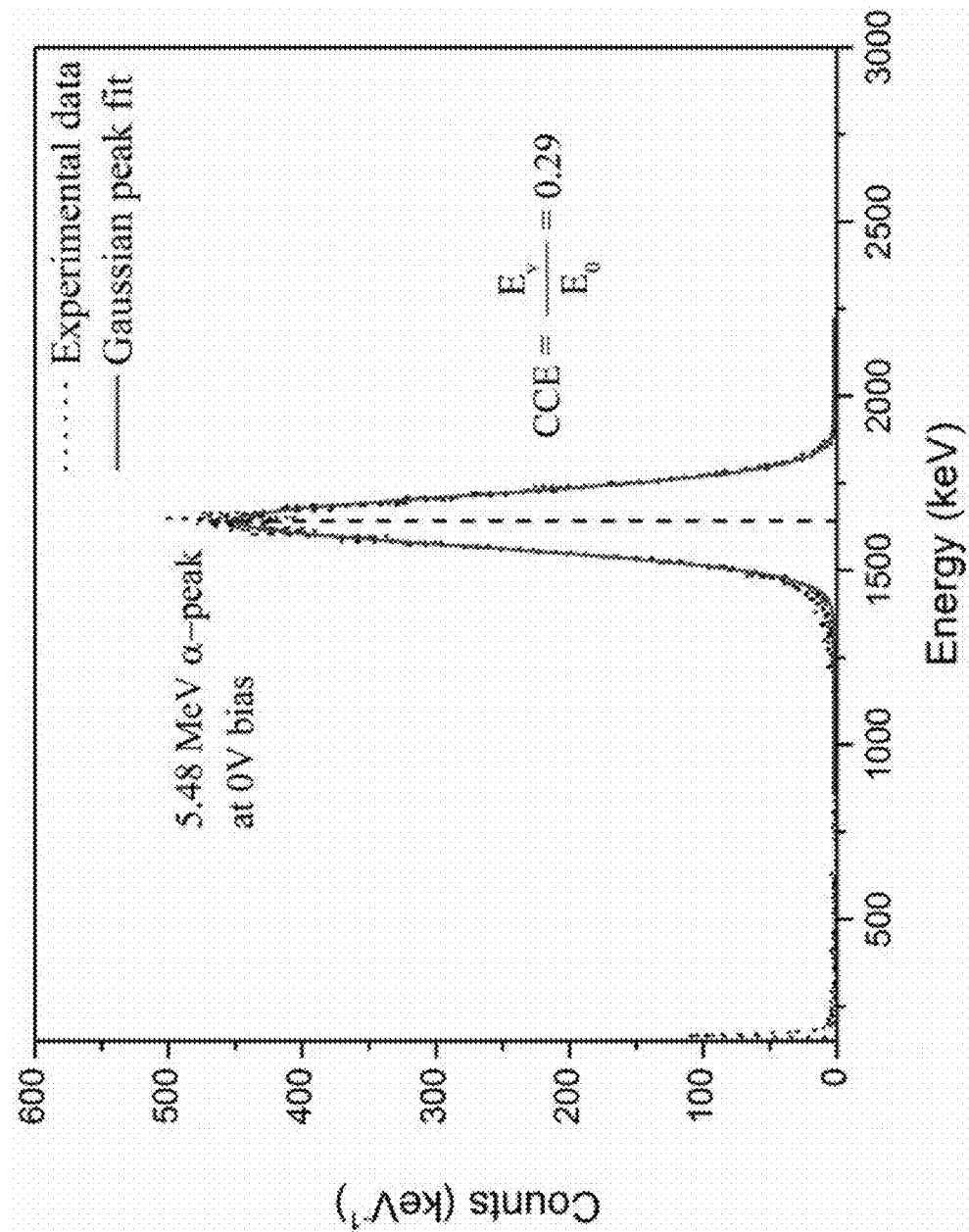
FIG. 20 shows a pulse height spectrum obtained for 5.48 MeV alpha particles from a $^{241}$Am source using n-type 4H—SiC epitaxial Schottky barrier detector biased at 0V, according to Example 3. The dotted line shows the peak centroid, $E_v$ and $E_0$ is the actual energy (5.48 MeV) of the emitted alpha particles.
Figure 21:
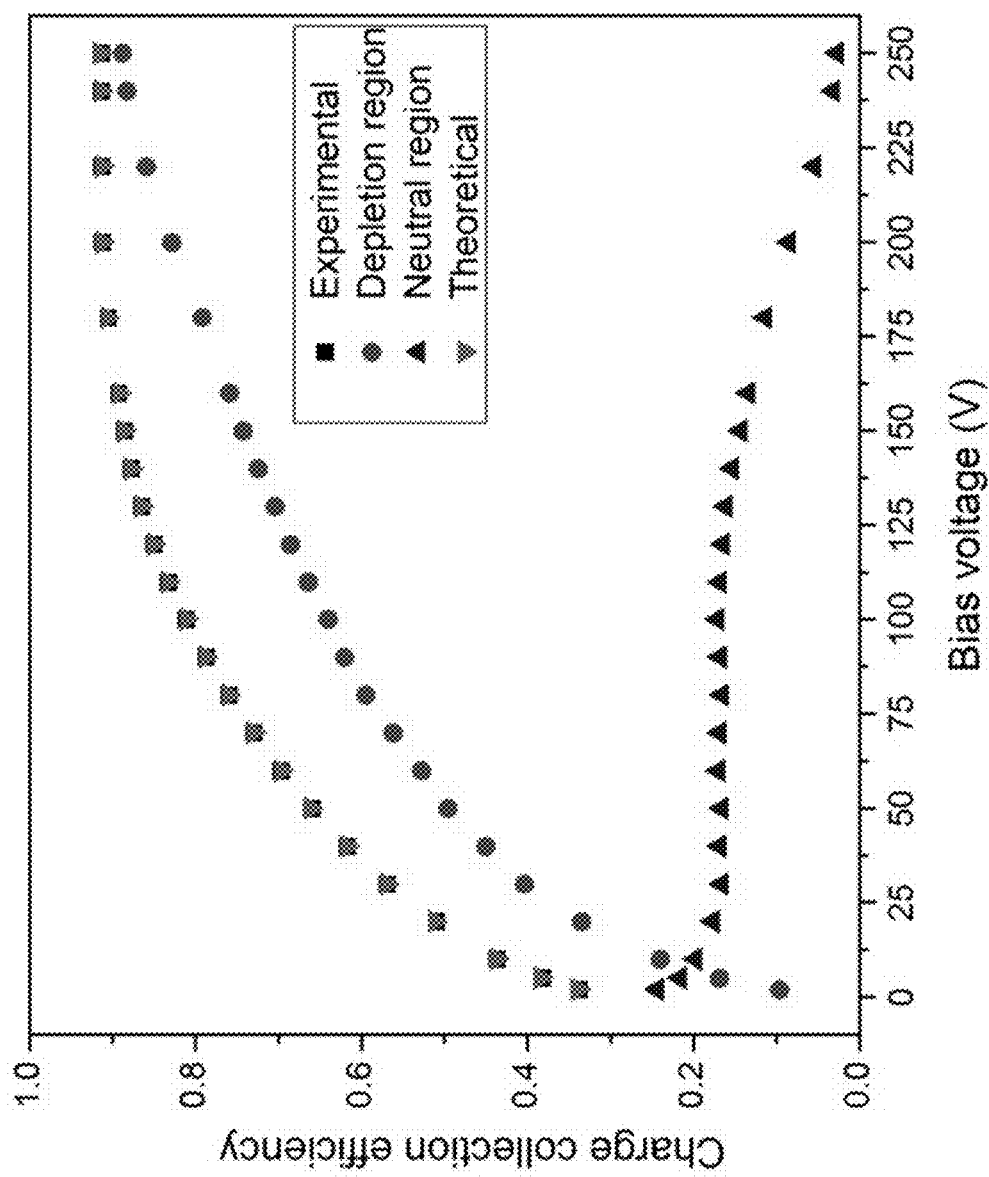
FIG. 21 shows the variation of experimentally obtained (■) and theoretically calculated (▼) charge collection efficiency as a function of reverse bias voltage, according to Example 3. The theoretically calculated separate contributions to the total CCE from charge drifts in depletion region (●) and from hole diffusion in neutral region (▲) are also shown.

FIG. 20 shows a pulse height spectrum obtained using a $^{241}$Am alpha source at zero applied bias ($V_a+1.4$ V=0 V). A symmetric and robust peak was obtained which indicates a substantial amount of diffusion of minority carriers. At zero applied bias, because of the negligible width of the depletion region, all the interactions predominantly take place in the neutral region (beyond the depletion region) as the range of 5.48 MeV alpha particles in SiC is ~18 µm. So, the charge transfer is dominated by the diffusion of holes. The charge collection efficiency at zero applied bias in this case was calculated to be 29%. Such a high value of CCE at zero applied bias implies that the diffusion length of the holes is comparable to the range of the alpha particles. Ivanov et al. have reported an even higher CCE of 50% at 0 V in their 26 µm thick n-type 4H—SiC epilayer detectors for 5.39 MeV alpha particles. The hole diffusion length in their case was reported as 13.2 µm. FIG. 21 shows the variation of CCE calculated using 5.48 MeV alpha particles as a function of reverse bias voltage. The CCE was seen to saturate after an applied reverse voltage of 180 V. The highest CCE achieved was 92% at 250 V. The reason behind not achieving 100% CCE can be explained as follows. The depletion width at a reverse bias of 250 V was calculated to be 16 µm. Alpha particles of energy 5.48 MeV have a projected range of 18 µm in SiC. So the alpha particles do not deposit their full energy in the depletion region which is the active region of the detector and hence 100% efficiency was not observed. To have a better perspective of the variation of CCE with applied bias, we calculated the separate contribution of charge carriers produced in the depletion region and that of the diffusion of holes created in the neutral region, to the observed CCE. The calculation was done based on a model proposed by Breese originally for calculating minority carrier diffusion length for ion beam induced charge collection measurements. According to the model, the charge collection efficiency at a given reverse bias voltage (depletion width) is given as Equation (11)

$$CCE_{theory} = \frac{1}{E_p} \int_0^d \left(\frac{dE}{dx}\right) dx + \frac{1}{E_p} \int_d^{x_r} \quad (11)$$

$$\left[\left(\frac{dE}{dx}\right) \times \left\{-\frac{(x-d)}{L_d}\right\}\right] dx$$

$$= CCE_{depletion} + CCE_{diffusion}$$

where $E_p$ is the energy of the alpha particles, d is the depletion width at the particular bias, dE/dx is the electronic stopping power of the alpha particles calculated using SRIM 2012, $x_r$ is the projected range of the alpha particles with energy $E_p$ and $L_d$ is the diffusion length of the minority carriers. The first term of Equation 11, $CCE_{depletion}$, gives the contribution of charge generated within the depletion region to the charge collection efficiency and the second term, $CCE_{diffusion}$, is that from the charge carriers created in the region behind the depletion region and diffused to the depletion region. The diffusion length of the holes was calculated as follows. First the $CCE_{depletion}$ value was calculated by numerical integrating the dE/dx values obtained from SRIM 2012 (See Eqn. 11) at a particular bias voltage. Then $CCE_{diffusion}$ and $L_d$, was calculated while considering $L_d$ as a free parameter to fit the experimentally obtained CCE value at that particular bias. The average $L_d$ value obtained considering all the bias voltages was calculated to be 3.5 μm. Similar calculation was reported by Manfredotti et al. where they numerically fit the experimentally obtained CCE values by calculating the CCE theoretically while considering $L_d$ as a free parameter. FIG. 21 also plots separately the values of $CCE_{depletion}$, $CCE_{diffusion}$, and $CCE_{theory}$. It can be seen from the figure that initially (up to 5 V), the $CCE_{diffusion}$ values were higher than $CCE_{depletion}$ values, which implies that at lower biases the charge transport was dominated by hole diffusion. Similarly, it can be seen that at higher biases the $CCE_{depletion}$ values almost matches the experimentally obtained CCE values which implies that the charge transfer is almost solely due to carrier drift inside the depletion region.

Figure 22:
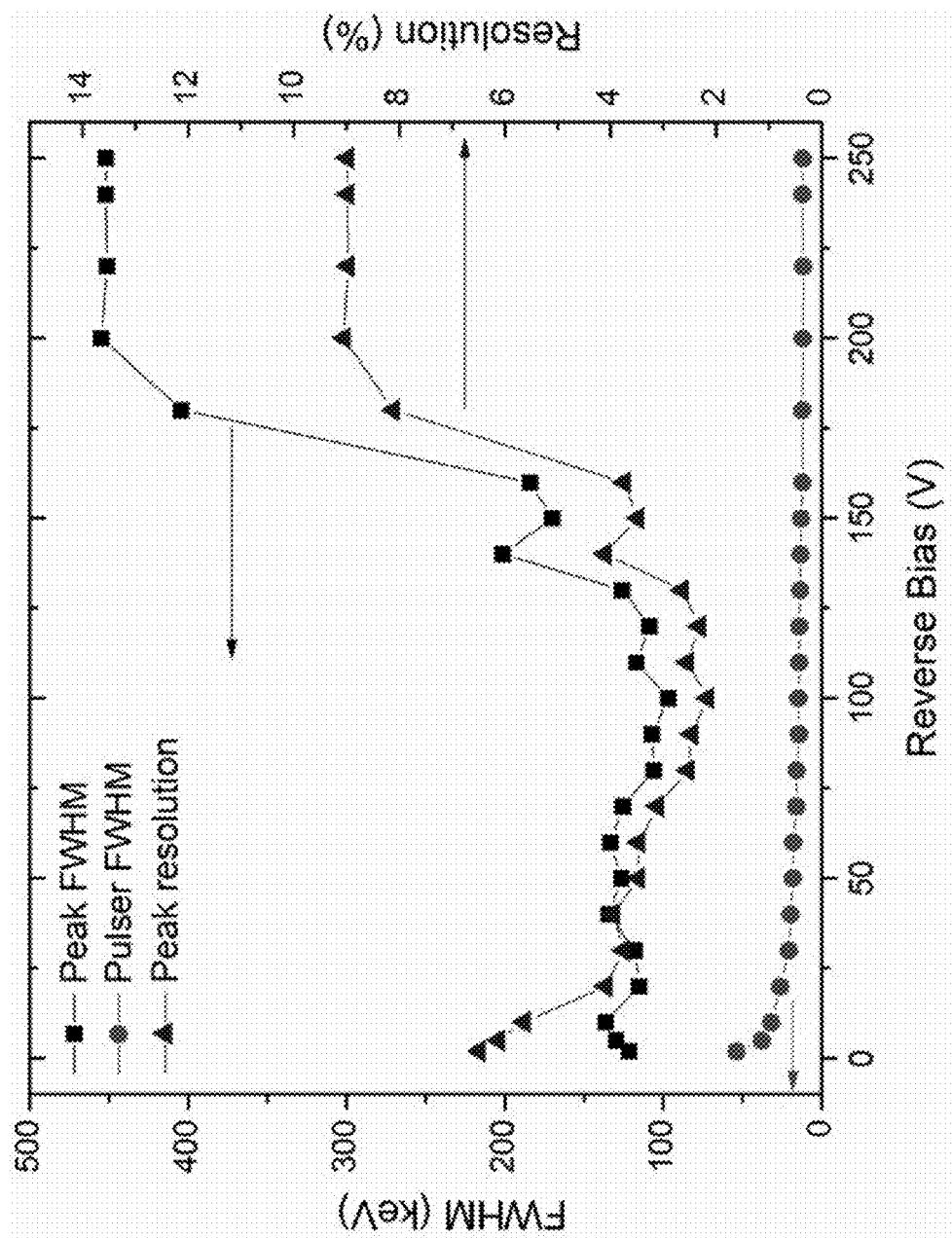
FIG. 22 shows the variation of 5.48 MeV alpha peak FWHM (■), pulser peak FWHM (●) and alpha peak percentage resolution (▲) as a function of detector bias voltage. The solid lines are guide for the reader.
Figure 23:
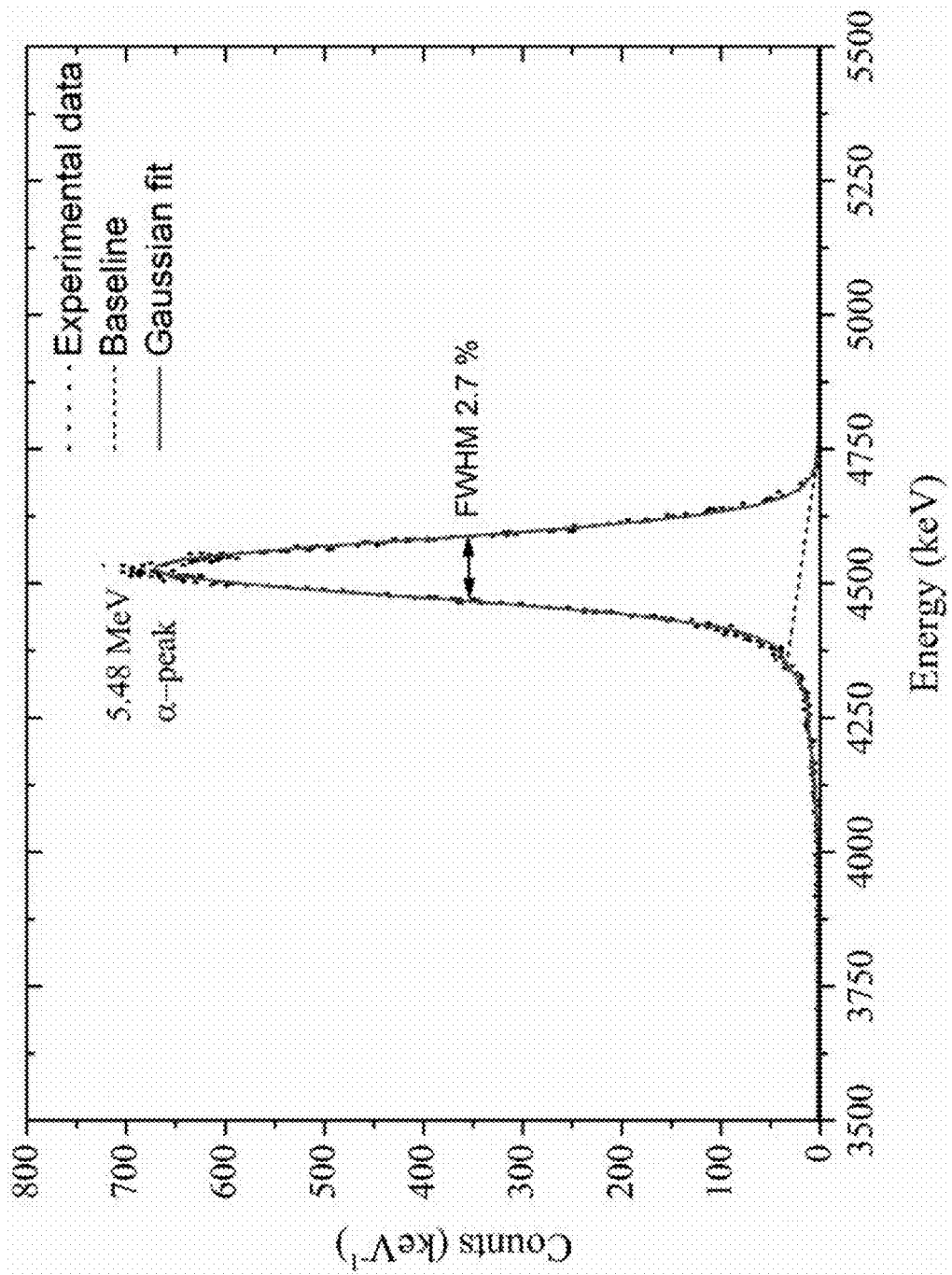
FIG. 23 shows the pulse height spectra obtained using the n-type 4H—SiC Schottky barrier detector, according to Example 3, for 5.48 MeV alpha particles at an operating voltage of 100 V. The dots are the experimental points and the solid line is a Gaussian distribution fitted to the experimental data. The dashed line shows the baseline.

Apart from the CCE, the energy resolution was also monitored as a function of bias voltage. FIG. 22 shows the variation of detector resolution measured in terms of FWHM as well as percentage resolution, for 5.48 MeV peak, as a function of reverse bias voltage. Also, Table 1 lists the peak parameters for some of the important cases relevant to the discussion. In order to monitor any variation in the post-detector electronics, pulser spectra were simultaneously recorded during all the data acquisitions using a precision pulser. The pulser-peak FWHM essentially gives the magnitude of noise of the detection system. FIG. 22 also shows the variation of the pulser FWHM as a function of bias voltage. The much higher FWHM values of alpha peak compared to that of the pulser peak clearly indicates that the detector resolution was not limited by the overall electronic noise of the system. It can be seen from the figure that initially the resolution improved with increase in bias voltage, attained a minima at 100 V and then started increasing with increasing bias. FIG. 23 shows the alpha pulse height spectrum obtained at 100 V. The percentage resolution was calculated to be 2.7%. The initial decrease in the FWHM value is a normal detector behavior and is generally attributed to the increase in the active volume of the detector and reduction in detector capacitance with increase in bias. The reason behind the increase in the FWHM values beyond 100 V was not very apparent. No variation in the pulser-peak FWHM was observed in this region. Thus the effect of increasing leakage current on the detector resolution with applied bias can be ruled out as increase in detector leakage current means increase in parallel noise which would broaden the pulser peak as well. A plausible reason behind the deterioration of resolution with increasing bias could be explained as follows. As the reverse bias increases, the depletion region extends more towards the epilayer-substrate interface. So, the probability of finding threading type dislocation defects increases more and more. Threading dislocations are basically dislocations which propagate from the substrate to the epilayer.

Figure 24A:
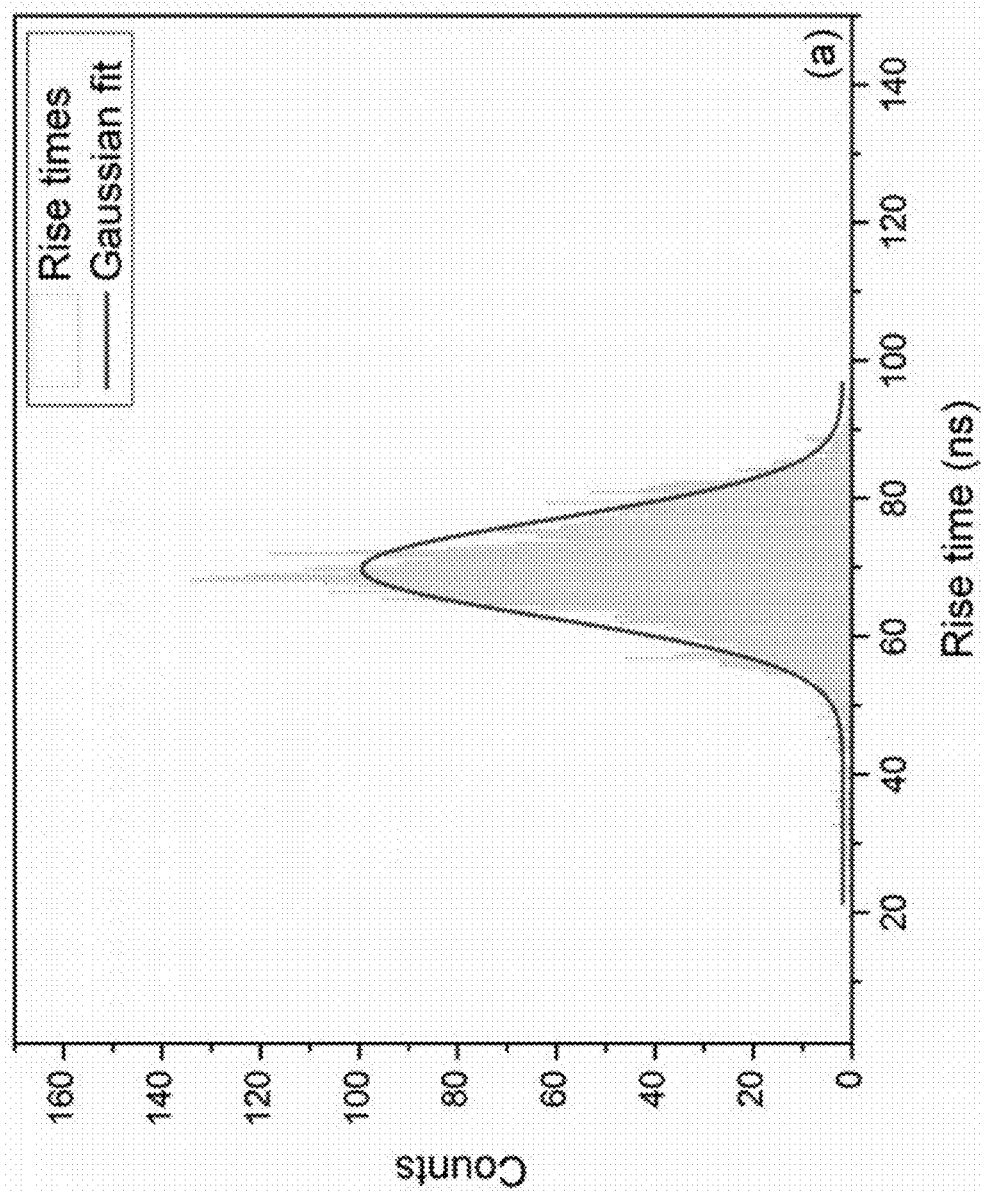
FIG. 24a shows the distribution of 10-90% rise-time of charge pulses obtained for 5.48 MeV alpha particles when the detector was biased at 100 V, according to Example 3. In order to obtain the peak positions, the peaks were fitted with Gaussian functions.
Figure 24B:
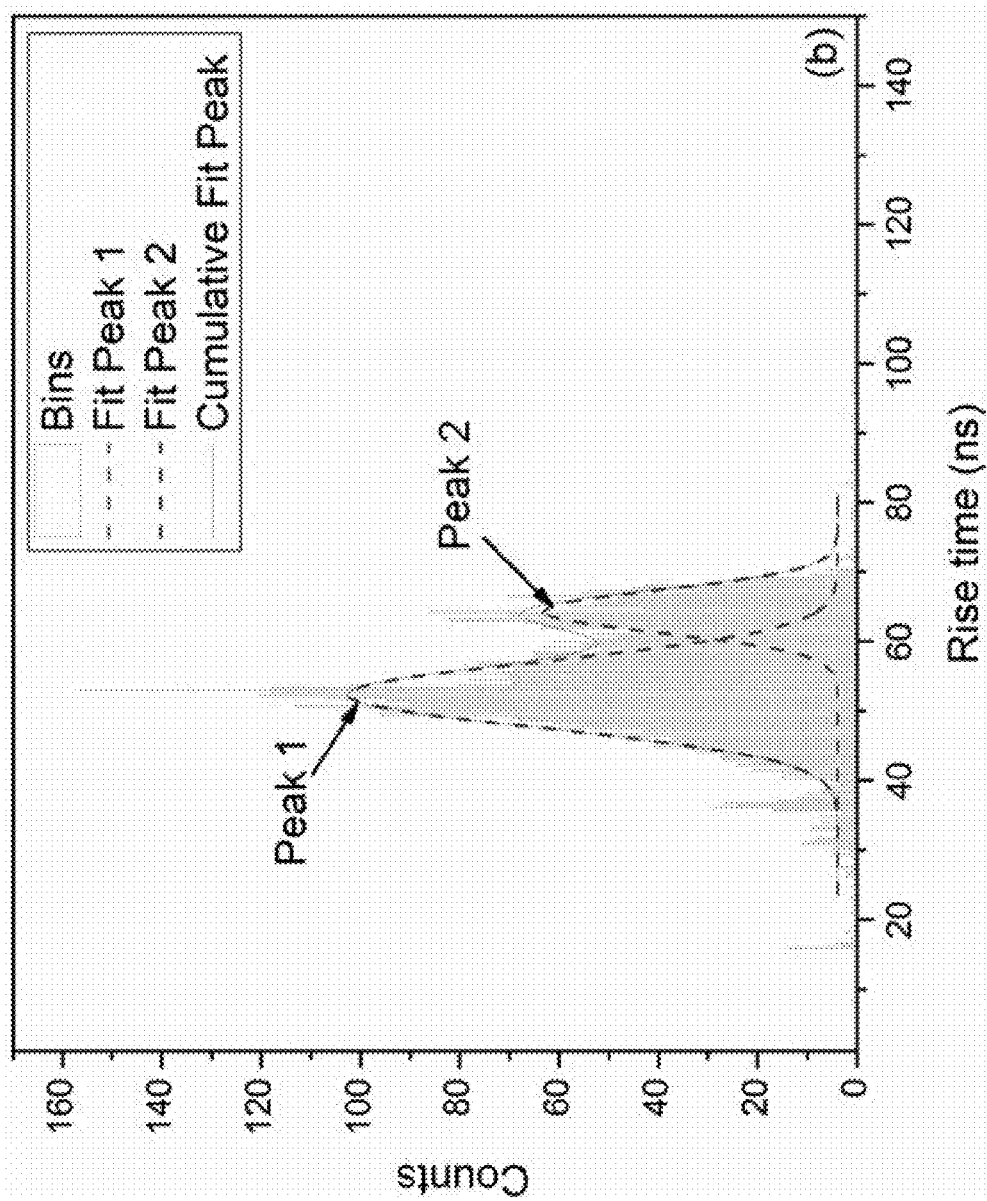
FIG. 24b shows distribution of 10-90% rise-time of charge pulses obtained for 5.48 MeV alpha particles when the detector was biased at 200 V, according to Example 3. In order to obtain the peak positions, the peaks were fitted with Gaussian functions.

In order to have a deeper understanding, pulse-height and rise-times measurements of the alpha particle charge-pulses from the detector were carried out. The variations of rise-times were observed for the detector biased at two different voltages. FIGS. 24a and 24b shows the 10-90% rise-time distribution histogram at 100 V and 200 V respectively. A Gaussian fit to the distribution showed that the rise-time distribution for the alpha particle charge pulses was centered at around 69 ns when the detector was biased at 100 V. Interestingly, FIG. 24b shows a clear presence of two peaks in the rise-time distribution of pulses acquired at 200 V. The histogram was fitted with a two-Gaussian peak fit function and the two peaks were found to be centered at 64 ns and 52 ns. So, it appears that an additional set of events with faster rise-time is present. If we consider our previous assumption of inclusion of defect-rich region with higher bias to be true, then it can be assumed that a fraction of the charge carriers are getting trapped and recombining in these defects. As a result of this, these charges never reach the collecting electrode and hence induce partial charge on the collecting electrode. As a consequence, the 10-90% rise-time calculated from these pulses turn out to be faster. This can be very easily visualized using biparametric plots. A biparametric plot is a two dimensional graph showing the correlation between two pulse parameters of a set of pulses. A biparametric plot (not shown) was obtained for two different detector biasing, 100 and 200 V. The pulse-height and the pulse rise-time for each event were plotted on the horizontal and vertical axes. A spot of events were observed, for a detector biasing of 100 V, which corresponded to the 5.48 MeV alpha particles. On the other hand, a very broad set of correlated events could be noticed for a detector biasing of 200 V. The broadness in the corresponding pulse-height distribution is possibly due to the variation of the induced charge due to uneven radial distribution of defect concentration. It was also seen in the biparametric plot for a detector biasing of 200 V that the pulse-height distribution corresponding to the set of events with lower rise-times values is broader than that of the set of events with higher rise-time which also confirmed our assumption of variation in charge induced by the carriers trapped in defects. The widening of the alpha peak at higher bias can be realized easily from the biparametric plot. The pulse height spectrum can be visualized as a projection of the number of these counts on the pulse height axis of the biparametric plot. In the case of the higher bias, because of the overall broadening of the distribution of energy, the resulting projection on the x-axis returns a broad energy peak.

Finally, it should be mentioned that various factors regulate the energy resolution of this kind of 4H—SiC epitaxial Schottky barrier radiation detectors. Presence of defects like micropipes in the epilayer is the most serious concern as of now. The superior energy resolution obtained in the present work is believed mostly due to the low concentration of micropipes. Also various authors have reported that the ultimate energy resolution of the detector is limited by the energy dispersion at the metal contact window. Therefore, the choice of window material and optimization of the window thickness also plays a very important role for obtaining high energy resolution. The measured energy resolution also depends on the variation of angle of incidence of the gamma rays. Since a broad source has been used in this study a further improvement in the detector performance can be expected if a collimated source is being used.

Conclusions

The performances of radiation detectors fabricated from 4H—SiC n-type epilayers on SiC substrates were evaluated for alpha particle detection. An energy resolution of 2.7% of $^{241}$Am (5.48 MeV) alpha particles was obtained for full illumination of the detector at an optimized bias of 100 V using a simple planar structure. I-V measurements at room temperature have showed very low (~0.8 nA at 250 V) leakage current. Although the charge collection efficiency of the detector was seen to increase with bias voltages beyond 100 V, the FWHM value for the 5.48 MeV alpha particles was seen to degrade with further increment in bias voltages. A theoretical investigation of CCE variation with applied bias was carried out to study the contribution of hole diffusion to the charge collection process. From this study, the diffusion length of holes was calculated to be 3.5 μm. Distribution of rise-time of the pulses obtained by the detector biased at 200 V, showed a presence of two sets of pulses with different rise-times. From a biparametric correlation plot, these two sets of events were found to have different pulse-height distribution. Inclusion of more and more defects into the detector active volume due to the increase in depletion width with increase in reverse bias was considered to be a possible reason for the observed higher FWHM values at higher reverse bias voltages.

EXAMPLE 4

The fabrication and characterization of large area, room-temperature operable and very high resolution Schottky barrier detectors for alpha particles is reported using 20 μm thick n-type 4H—SiC epitaxial layers. Schottky barriers were fabricated by depositing circular nickel contacts of ~11 mm$^2$ area on the 4H—SiC epitaxial layers. Room temperature current-voltage measurements revealed very high Schottky barrier height of 1.6 eV and extremely low leakage current of 3.5 pA at an operating reverse bias of −90 V. Also reported is an energy resolution of 0.29%, which is the best resolution obtained so far for uncollimated 5.48 MeV alpha particles in 4H—SiC epitaxial detectors with such a large area. Very low micropipe density (<1 cm$^{-2}$) and low effective doping concentration ($2.4\times10^{14}$ cm$^{-3}$) in the epilayer helped to achieve a high resolution even with the large detector area and a broad source. A diffusion length of ~18.6 μm for holes has been determined in these detectors following a calculation based on a drift-diffusion model. A noise analysis in terms of equivalent noise charge revealed that the white series noise due to the detector capacitance has substantial effect on their spectroscopic performance.

Introduction: 4H—SiC epitaxial layers have been long identified as a radiation hard and physically rugged material with superior electronic properties which are appropriate for nuclear radiation detection purpose. Availability of high-quality bulk and epitaxial 4H—SiC has revived the feasibility of fabrication of nuclear radiation detectors which are truly compact, operable at room or elevated temperature, physically rugged, and radiation hard. In particular, SiC detectors have been demonstrated as excellent alpha particle detectors and hence are being considered as compact neutron detectors when coupled with neutron-alpha conversion layers. Because of large hole diffusion length and achievable built-in potential greater than ~1.15 eV, 4H—SiC Schottky barrier detectors can also be configured for bias-less operation which is a much sought-after quality for field deployment of stand-off detection for Homeland Security applications. As usually in the case of semiconductor radiation detectors, defects present in the active volume of the detector play a very crucial role in defining the overall performance of the detector. Various kinds of electrically active defects might be present in 4H—SiC epilayers which can be detrimental to the required detection properties like charge carrier mobility and lifetime. Apart from defect free active volume, the pre-requisites for high-resolution and high-efficiency detection system are minimum energy scattering at the detector entrance window, efficient stopping of the ionizing particle within the effective volume of the detector (depletion region), high carrier mobility and lifetime, minimum detector leakage current and minimum noise associated with the detection front-end and filter electronics. In this example, we describe the fabrication and characterization of large-area and highest resolution alpha detectors operable at room temperature. The detectors were fabricated following a very simplistic approach using 4H—SiC epitaxial detectors and taking into consideration all the above-mentioned criteria for high resolution detection. There are no reports of such high-resolution detectors present in the literature. Strokan et al. reported an energy resolution of 0.34% for 5.1 to 5.5 MeV α-particles for detectors with area one order of magnitude less than that of the detector used in this study. Ruddy et al. also reported similar energy resolution for 5499 keV alpha particles using 4H—SiC epilayer detectors with an area of ~0.79 mm$^2$. We have used 10 nm nickel contacts for forming Schottky junction thereby minimizing the energy dispersion at the entrance window. High resistive epilayers enabled to obtain depletion width of 20 μm at reverse bias voltages as low as −90 V, which is a sufficient depth to stop most of the alpha particles from n,α nuclear reactions. Epilayers with micropipe density lower than 1 cm$^{-2}$ helped to obtain very low leakage currents and high carrier transport coefficients. And finally, to monitor the electronic noise associated with the detector and detection electronics, we have carried out noise analysis based on an equivalent noise charge (ENC) calculation model.

Figure 25:
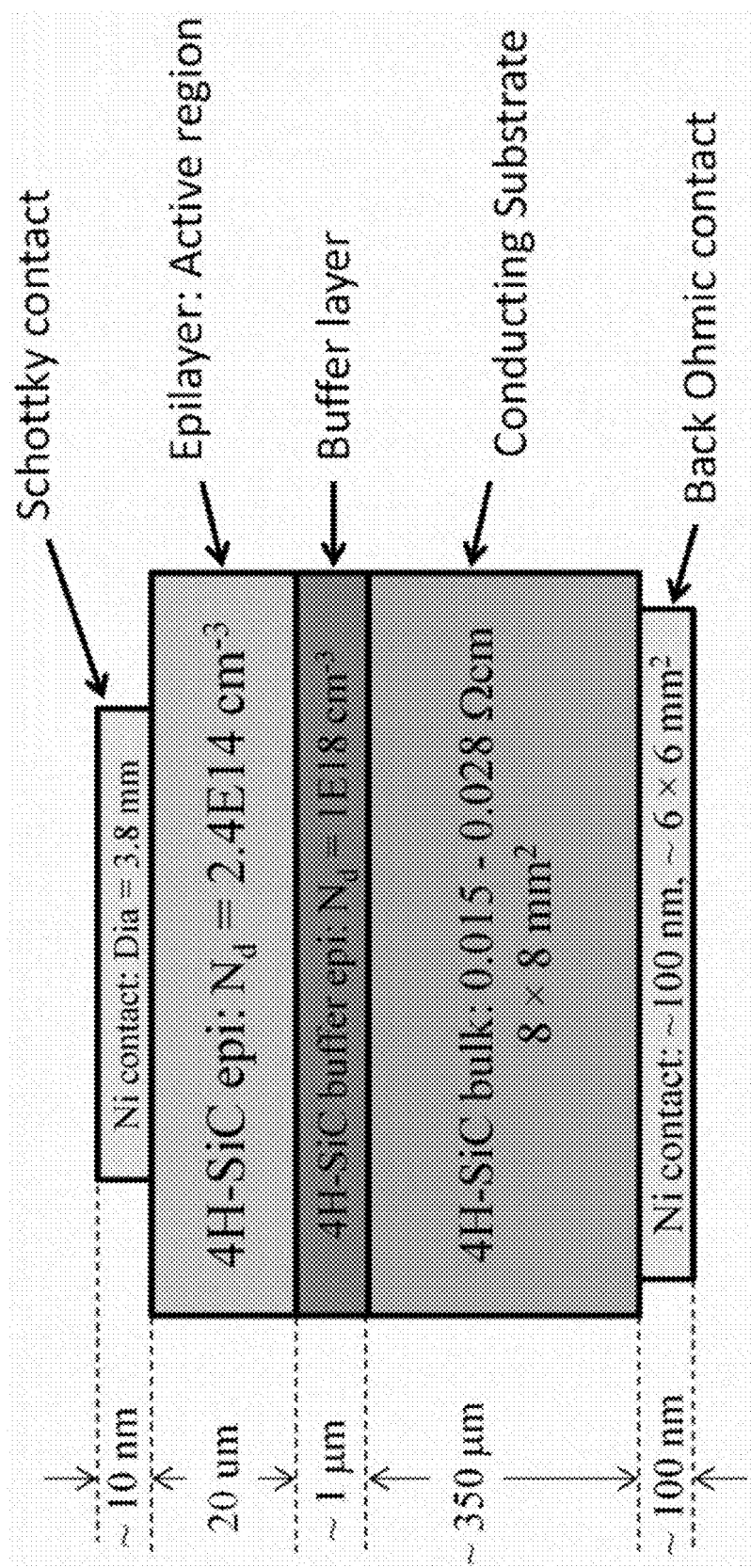
FIG. 25 shows a schematic diagram of the 4H—SiC wafer used for fabrication of Schottky barrier detectors according to Example 4.

Experimental Methods:

A 20 μm thick n-type epitaxial layer was used, grown on a 4H—SiC (0001) wafer highly doped with nitrogen and 4° off-cut towards the [112$\bar{0}$] direction. FIG. 25 shows the cross-section of the wafer structure schematically. The effective doping concentration of the epitaxial layer was measured to be $2.4\times10^{14}$ cm$^{-3}$. A micropipe defect density less than 1 cm$^{-2}$ has been evaluated using Nomarski optical microscopy and scanning electron microscopy. Several 8×8 mm$^{-2}$ SiC samples were diced from the 76 mm diameter parent wafer. The wafers were cleaned following the standard RCA cleaning procedure. Schottky barriers were formed by depositing 10 nm thick nickel contacts (circular) with an area of ~11 mm$^2$ on the freshly cleaned wafers using a Quorum Q150T sputtering unit. Large Ni contact (approx. 6×6 mm$^2$) 100 nm in thickness was deposited on the opposite surface for the back contact. The wafers were then mounted on printed circuit boards (PCB) and wire-bonded. The wire-bonding was done using very thin (25 μm) gold wire to ensure less scattering and obscuration of the alpha particles from the wire-bond region. The PCBs were fitted with board-to-board connector pins in order to obtain plug-in modular configuration for stable electrical connections.

The Schottky barrier electrical properties were studied at room-temperature using current-voltage (I-V) and capacitance-voltage (C-V) measurements. Pulse-height spectra of alpha particles were recorded using an analog spectrometer comprised of an Amptek A250CF preamplifier, an Ortec 572 spectroscopy amplifier, and a Canberra Multiport II ADC-MCA unit. The detectors under test were placed inside a metal box which was being constantly evacuated (~$10^{-3}$ mbar) during the measurements. A negative bias was applied to the Schottky contact for reverse biasing the detector. A 0.1 µCi $^{241}$Am alpha source with an active diameter of 7 mm was placed inside the box and above the detector (facing the Schottky contact) at a vertical distance of 12 mm which ensures a full illumination. The energy calibration of the detection system was carried out using a precision pulser. The energy resolution was expressed in terms of full width at half maxima (FWHM) and percentage resolution of the relevant peaks. For the electronic noise measurements, a precision pulser was fed to the pre-amplifier input using a calibrated feed-through capacitor and pulse height spectra were obtained. The width of the pulser peak expressed in terms of Coulomb rms was used as the equivalent noise charge. For measuring the ENC with the detector connected, the pulser was fed through the pre-amplifier test input.

Observations and Discussion: Electrical Characterization

Figure 26:
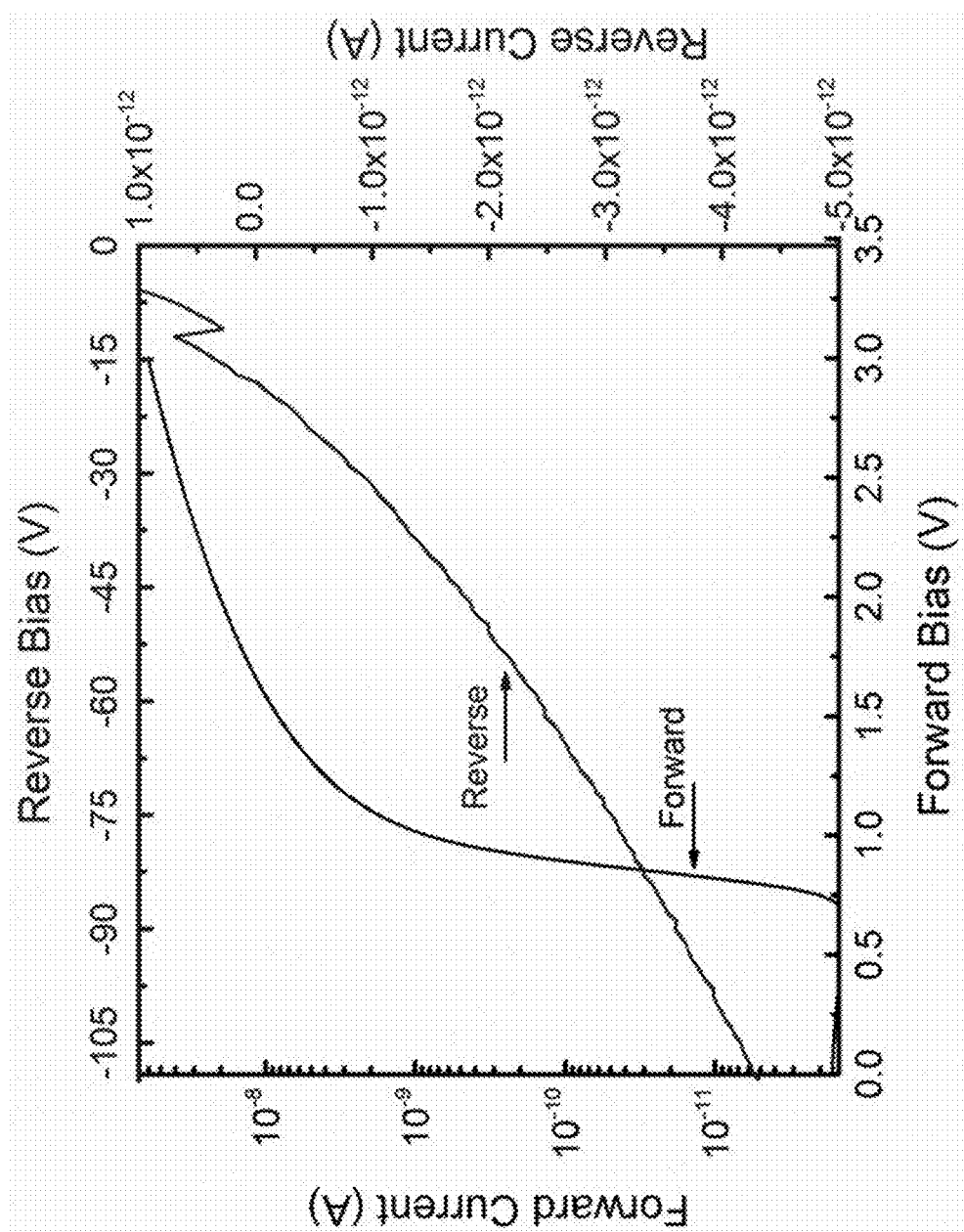
FIG. 26 shows the room temperature I-V characteristics at forward and reverse bias for an n-type 4H—SiC epitaxial Schottky detector according to Example 4.

FIG. 26 shows the variation of forward and reverse currents as a function of applied bias. The detector leakage current at a reverse bias voltage of −110 V was observed to be ~4.32 pA. However the detectors were operated at lower bias voltages, as the full-depletion was achieved at around −90 V reverse bias. From the forward I-V characteristics, the barrier height and the diode ideality factor were calculated to be 1.6 eV and 1.2 respectively using a thermionic emission model given by equation (12)

$$I = A^* A T^2 (e^{-\beta \varphi_B}) \left( e^{\frac{\beta V}{n}} - 1 \right) \quad (12)$$

where $A^*$ is the effective Richardson constant (146 Acm$^{-2}$K$^{-2}$ for 4H—SiC), A is the area of the diode, $\phi_B$ is the Schottky barrier height, n is the diode ideality factor, V is the applied voltage, and $\beta = q/(k_B T)$, q being the electronic charge, $k_B$ the Boltzmann constant, and T the absolute temperature. The obtained barrier height of 1.6 eV is high enough to offer very good rectification properties.

Figure 27:
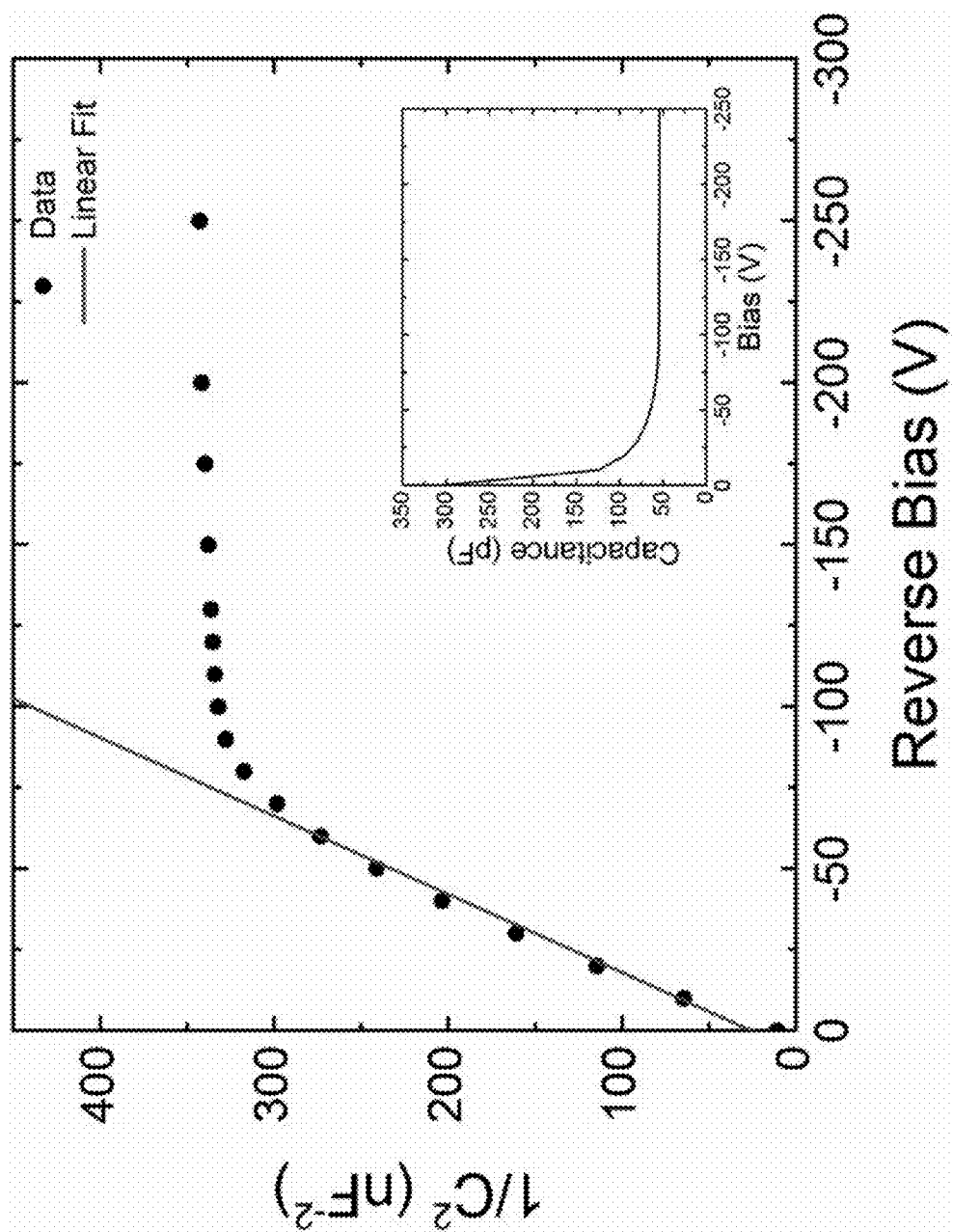
FIG. 27 shows a $1/C^2$ vs V plot for an n-type 4H—SiC Schottky barrier detector according to Example 4 (Inset shows the original C-V plot).

FIG. 27 shows the $1/C^2$ vs V plot obtained for one of the detectors. The plot was fitted with a linear function to obtain an effective doping concentration (Neff) of $2.4 \times 10^{14}$ cm$^{-3}$. The original C-V plot shown in the inset shows that the detector junction capacitance at an operating reverse bias of −90 V is 55.2 pF. It can also be noticed from FIG. 27 that the capacitance value saturated beyond a reverse bias of −90 V. The depletion width (d) at −90 V was calculated to be ~20 µm, using Eqn. 13, which is equal to the thickness of the epilayer itself and hence the junction capacitance value did not change beyond −90 V.

$$d = \sqrt{\frac{2 \varepsilon \varepsilon_0 V}{q N_{eff}}} \quad (13)$$

where, $\in$ is the dielectric constant of 4H—SiC (9.7), $\in_0$ is permittivity of vacuum, V is the applied bias and q is the electronic charge.

Observations and Discussion: Bias Dependence of Detector Performance

Figure 28:
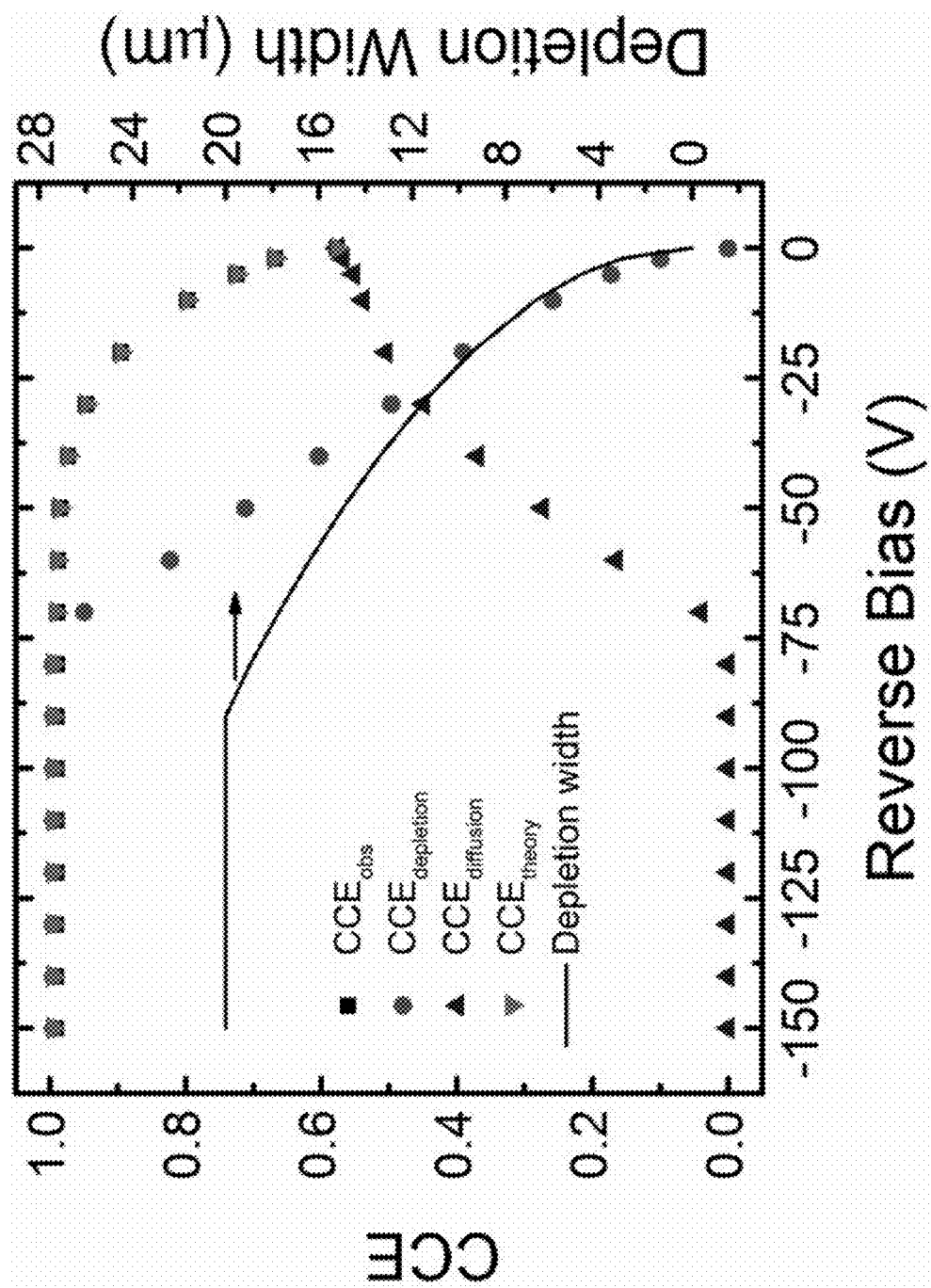
FIG. 28 shows the variation of $CCE_{obs}$ and $CCE_{theory}$ as a function of reverse bias voltage according to Example 4. The contributions to the total CCE from charge drifts in depletion region ($CCE_{depletion}$) and from hole diffusion in neutral region ($CCE_{depletion}$) are shown along with. The variation of depletion width with bias is also shown.

FIG. 28 shows the variation of charge collection efficiency (CCE$_{obs}$) for alpha particles calculated for one of the detectors as a function of reverse bias. The CCE$_{obs}$ was calculated as the ratio of the output energy observed by the detector to the actual incident energy of the alpha particles. We have also calculated the contribution of the drift (CCE$_{depletion}$) and diffusion (CCE$_{diffusion}$) related charge collection to the observed total charge collection efficiency using a drift-diffusion model given above (Eqn. 11) where we fitted the CCE$_{theory}$ values to the CCE$_{obs}$ values considering $L_d$, the minority carrier diffusion length, as a free parameter. Here, in Eqn 11, d is the depletion width at the particular bias, dE/dx is the electronic stopping power of the alpha particles calculated using SRIM 2012, x(r) is the projected range of the alpha particles with energy Ep. The average value of Ld was calculated to be ~18.6 µm. At lower bias voltages, the depletion width could be smaller than alpha penetration depth in which case most of the charge carriers are generated in the neutral region and the holes diffuse to the depletion region. These holes are then collected even in the absence of any applied bias due to the influence of the built-in potential. Hence from FIG. 28 it can be seen that CCE$_{diffusion}$ dominates over CCE$_{depletion}$ until a reverse bias of −30 V. In the present detector we have obtained a robust alpha peak at zero applied bias with CCE$_{obs}$~57%. The high CCE$_{obs}$ value at 0 V applied bias gives an idea of how effectively these detectors can work at zero applied bias. At higher bias the depletion width becomes comparable or larger than the alpha particle penetration depth (~18 µm in SiC for 5486 keV alpha particle) and the charge collection efficiency is dominated by the drifting of charge carriers within the depletion width. Hence, beyond a reverse bias of −70 V, the CCEdepletion values were almost equal to the CCE$_{obs}$ values.

Figure 29:
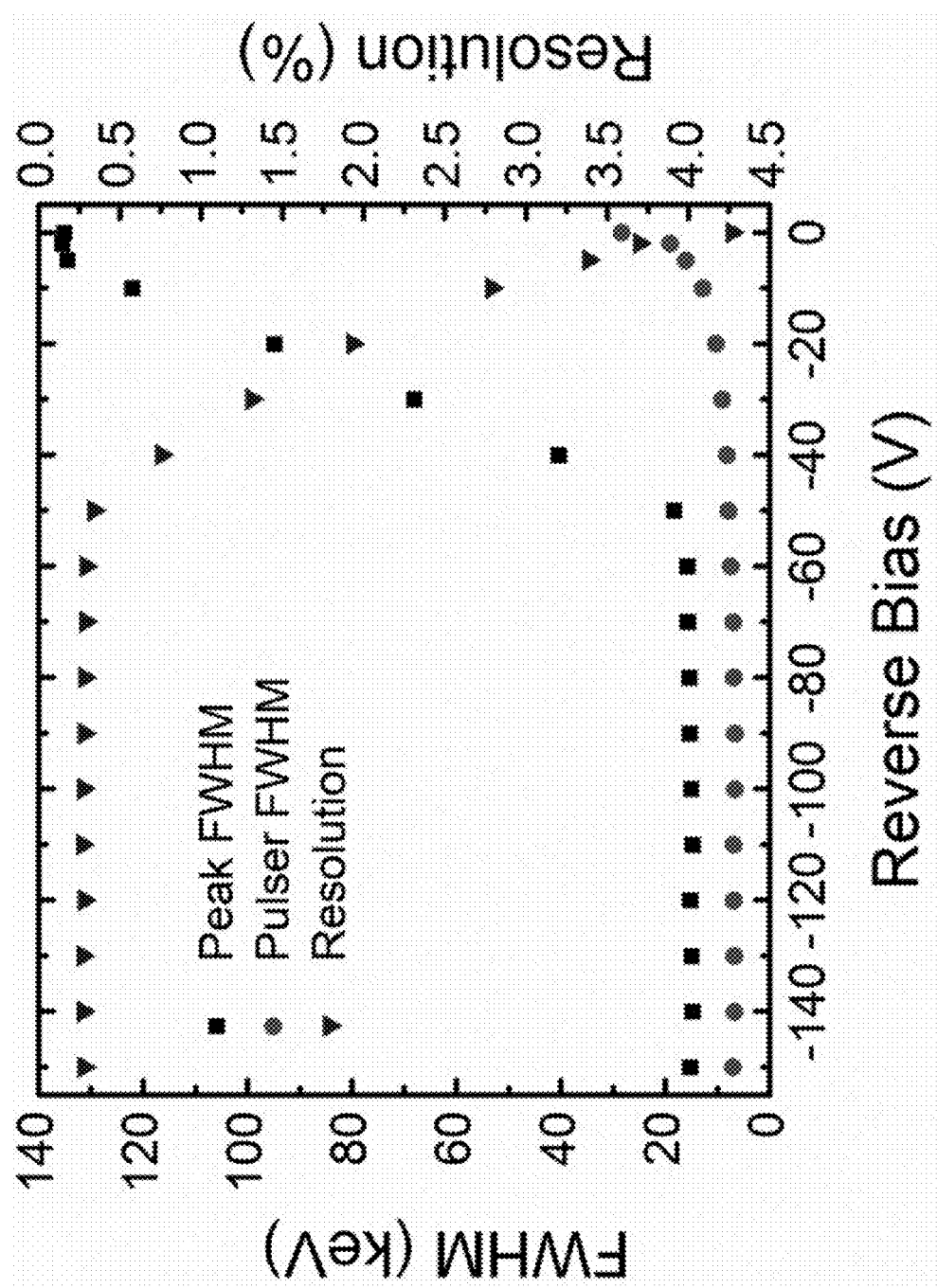

FIG. 29 shows the variation of detector resolution (in keV and percentage values) as a function of reverse bias. The variation of the width of the pulser peak acquired simultaneously is also plotted. The detector performance could be seen to improve with the applied reverse bias. Beyond −60 V, the detector performance almost saturated however the best resolution was obtained at −90 V. The pulser peak width could be seen to decrease initially in a systematic manner with the increasing bias which is an indicative of the reduction in white series noise and pink noise as the detector capacitance decreases with increasing reverse bias. The dependence of electronic noise with capacitance is discussed in details in the subsequent sections.

Figure 30:
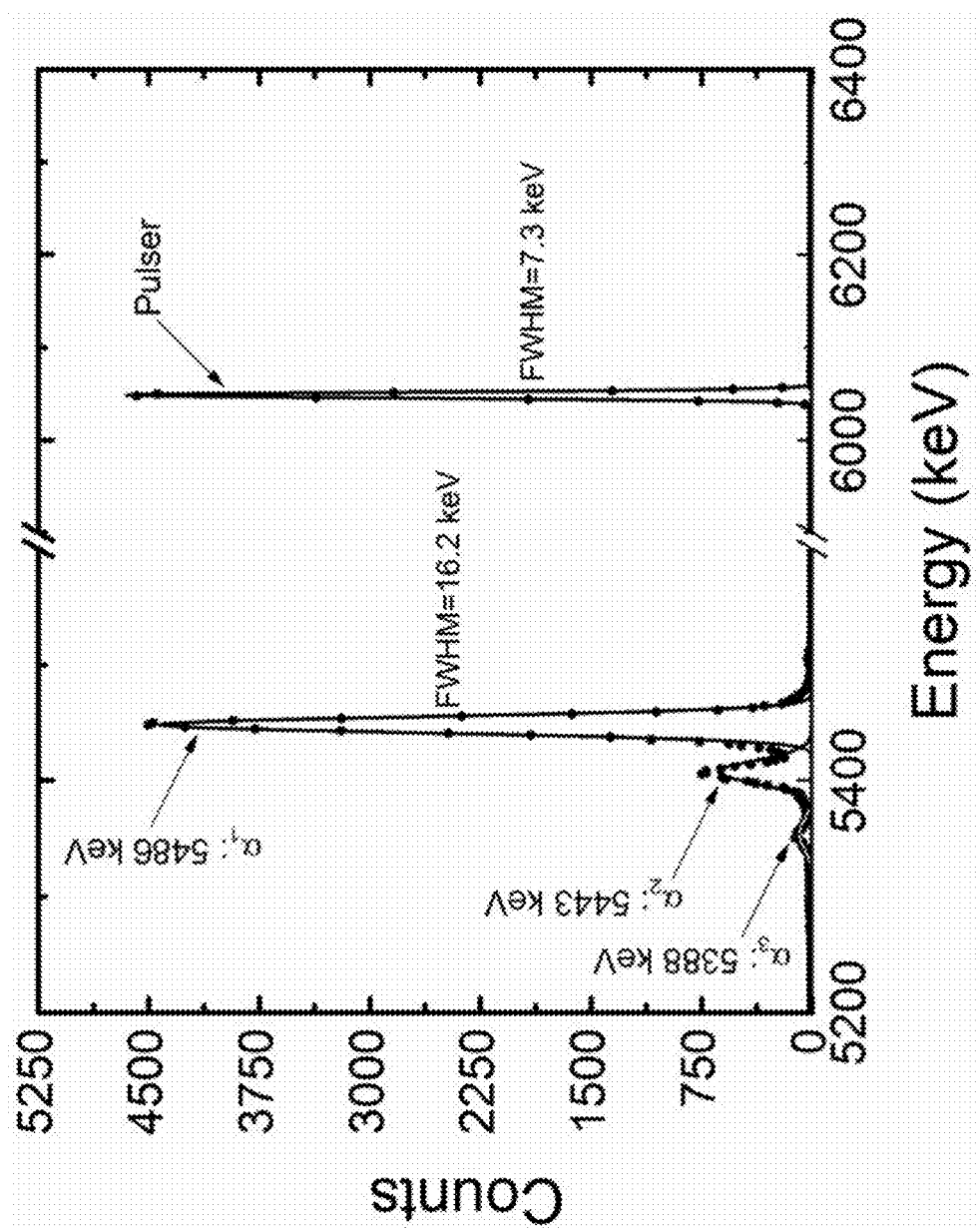
FIG. 30 shows the pulse height spectrum obtained using an n-type 4H—SiC epitaxial Schottky detector and a $^{241}$Am source according to Example 4. The three alpha peaks were deconvoluted using Gaussian function and are shown in solid lines. A pulser spectrum acquired simultaneously is also shown. The solid line in the pulser peak shows the Gaussian fitting.

FIG. 30 shows a pulse-height spectrum acquired using a $^{241}$Am source with an optimized operating bias and amplifier shaping time of −90 V and 3 µs respectively. The optimization of the shaping time is discussed in the next section. The three major alpha peaks emitted by $^{241}$Am source of energy 5388 keV, 5443 keV and 5486 keV (actual observed energies were 5353 keV, 5407 keV, and 5449 keV respectively which were slightly lower due to the combined energy loss because of source self-absorption, scattering at the entrance window, partial charge loss in defects etc.) were clearly resolved with a percentage resolution of 0.29% for the 5486 keV peak. The width of the pulser peak recorded along-with was 7.3±0.2 keV which was less compared to the width observed for the 5486 keV peak (16.2±0.2 keV) implying that the detector performance was not limited by the pre-amplifier noise. Nevertheless, it is very important to know the various noise components that contribute to the overall noise of the detection system. The intrinsic detector resolution i.e., the peak width without the broadening due to the electronic noise, was calculated to be 14.5 keV following the quadrature sum rule.

Observations and Discussion: Equivalent Noise Charge Measurements

Figure 31:
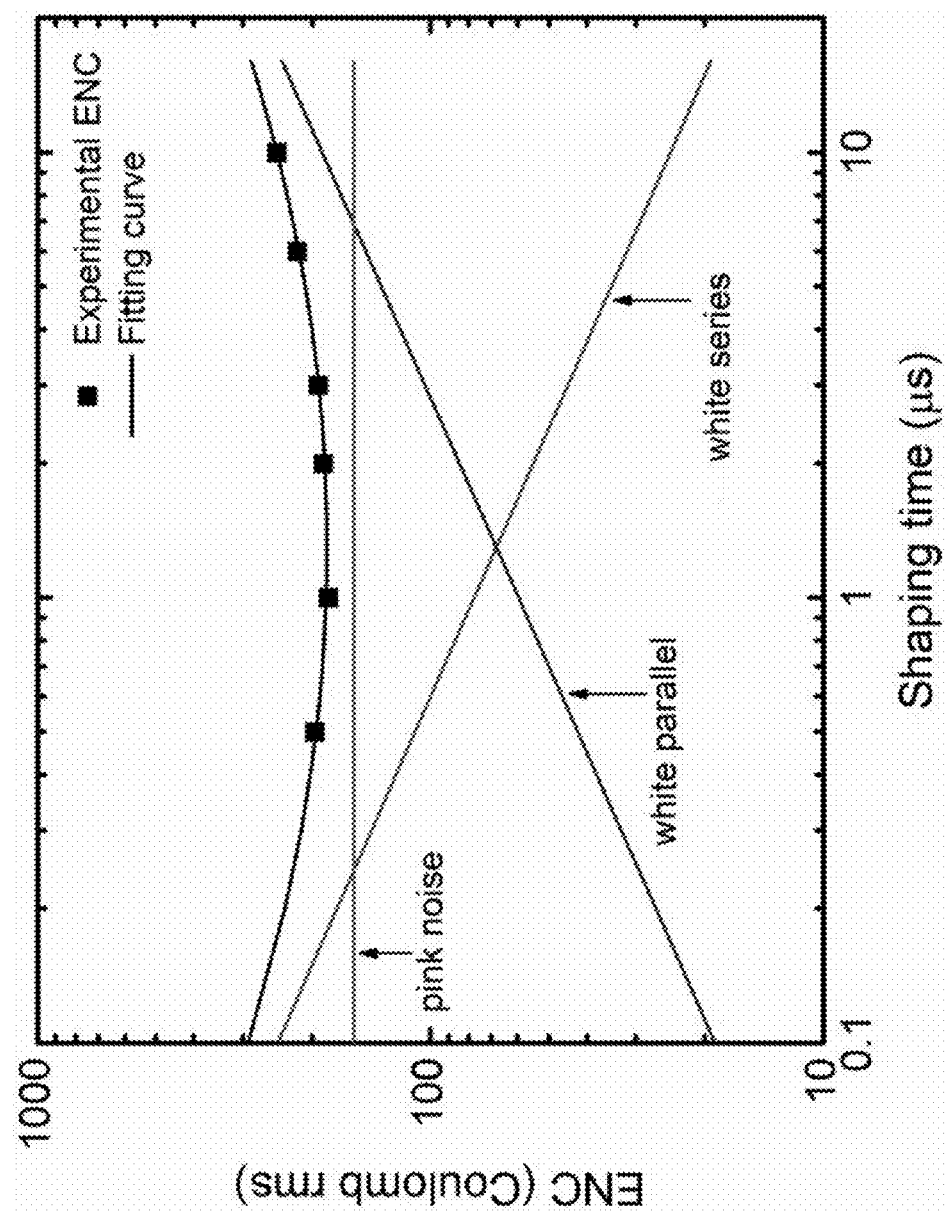
FIG. 31 shows the variation of equivalent noise charge as a function of shaping time according to Example 4. The separate contributions from white series noise, white parallel noise, and pink noise are also shown.
Figure 32:
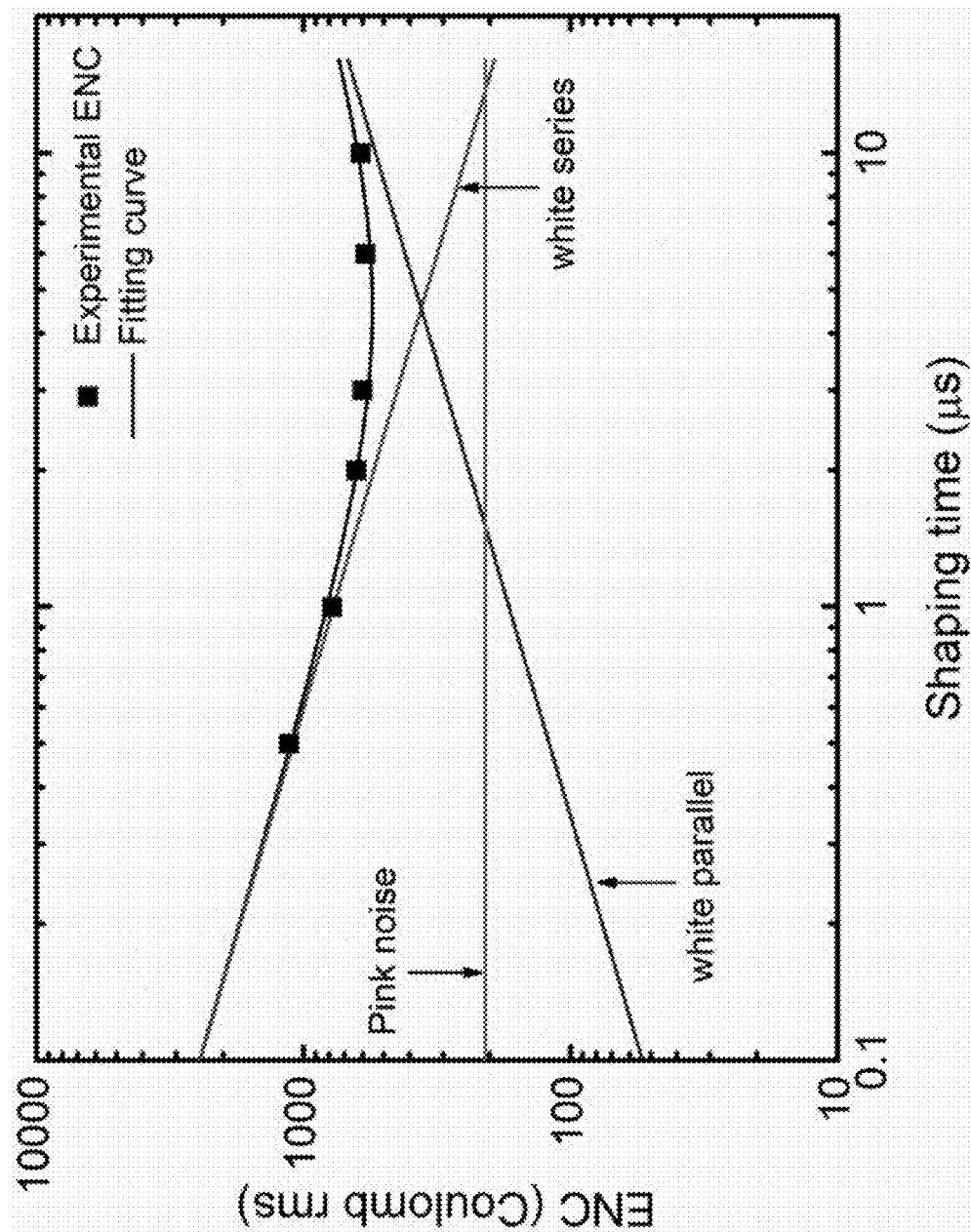
FIG. 32 shows the variation of equivalent noise charge as a function of shaping time with a detector connected to the pre-amplifier according to Example 4. The detector was biased to −90 V and exposed to the $^{241}$Am source during the measurements.
Figure 33:
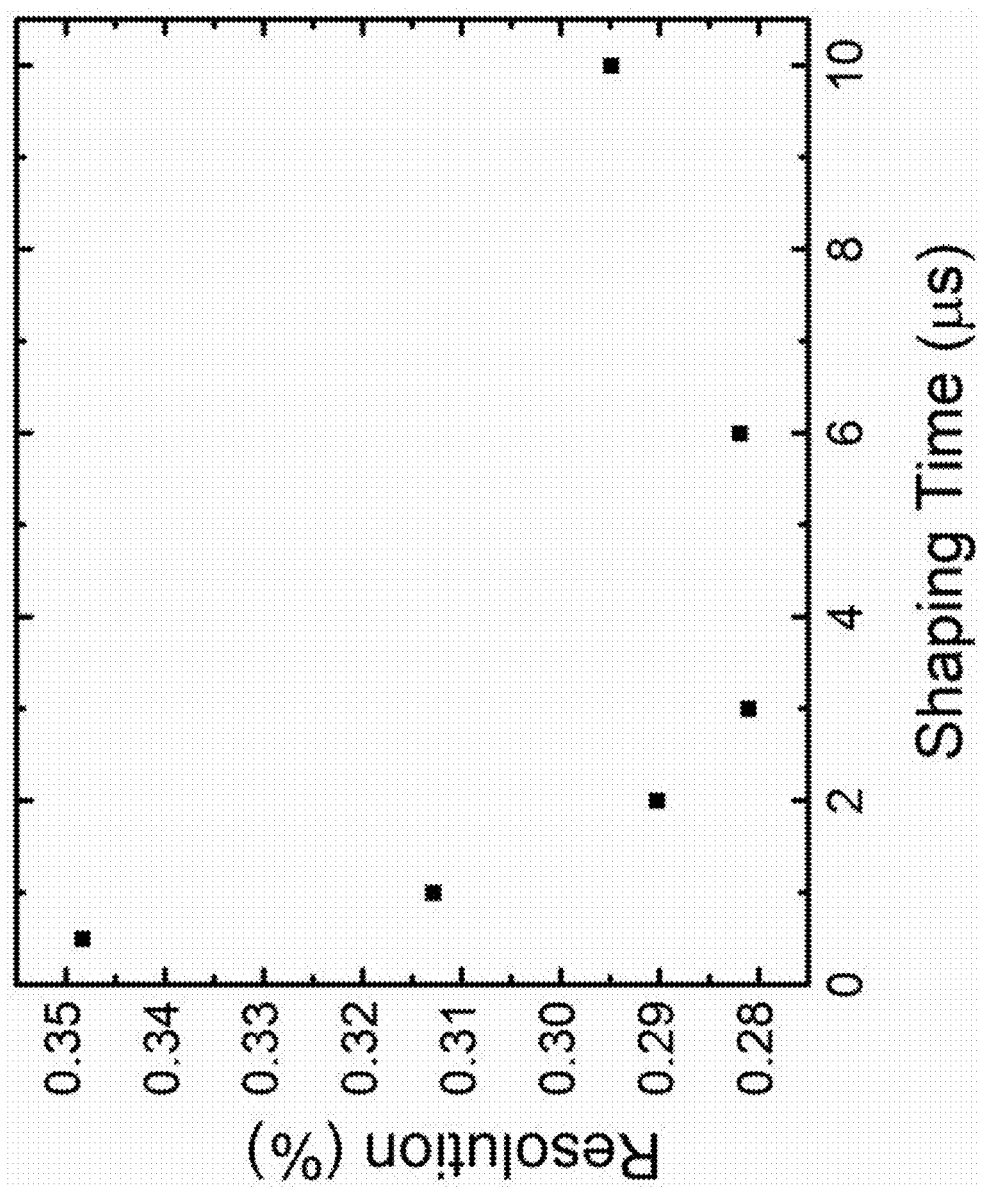
FIG. 33 shows the variation of detector resolution as a function of amplifier shaping time measured for 5486 keV alpha particles according to Example 4. The detector was reverse biased at −90 V.

We have used the formalism described by Bertuccio and Pullia in order to find the various electronic noise contributions. The electronic noise, measured from the pulser peak width (fed to the pre-amplifier using a calibrated capacitor) and expressed in terms of equivalent noise charge (ENC), was plotted as a function of amplifier shaping time $\tau$ and fitted to Eqn. 12 using a least square estimation method. The three terms in the right side of Eqn. 12 give the white series noise, pink noise (f parallel and 1/f series) and parallel white noise respectively.

$$\text{ENC}^2 = (aC_{tot}^2 A_1) 1/\tau + [(2\pi a_f C_{tot}^2 + b_f/2\pi) A_2] + (bA_3)\tau \quad (12)$$

where A1, A2 and A3 are constants depending on the shaping network response. $C_{tot}$ is the total input capacitance. The parameter a gives the white series contribution due to the thermal noise of the FET channel, $a_f$ is the coefficient of the FET 1/f noise, $b_f$ is the dielectric noise coefficient and b gives the sum of the white parallel contribution due to the shot noise of the FET and the detector leakage current. FIG. 31 shows the variation of ENC and various noise contributions calculated as a function of different shaping times and FIG. 32 shows that with a detector (biased and exposed to the alpha source) connected to the pre-amplifier. From FIG. 31 it can be seen that the minimum obtainable noise corresponded to a shaping time value in between 1 and 2 μs. In contrast, from FIG. 32 it can be seen that the minimum ENC in the system when a detector is connected is higher and corresponds to a shaping time in between 3 and 6 μs. As a consequence the best energy resolution for 5486 keV alpha particle was found to be at 3 μs from the shaping time dependence study of detector performance as shown in FIG. 33. It can be also noticed from a comparison of the two cases, that at any given shaping time, the magnitude of the white parallel noise increased by a factor of ~5 and that of the pink noise increased marginally from 156 to 207 Coulomb rms after the detector was plugged in. However, the most contrasting feature observed is the increase in white series noise by an order of magnitude after the detector was plugged in. From Eqn. 12, it can be inferred that the increase in white parallel noise was mostly due to the additional current from the detector while the increase in white series and pink noise was due to the increase in the input capacitance (detector capacitance was ~55.2 pF at –90 V).

Observations and Discussion: Bias Dependence of Equivalent Noise Charge

Figure 34:
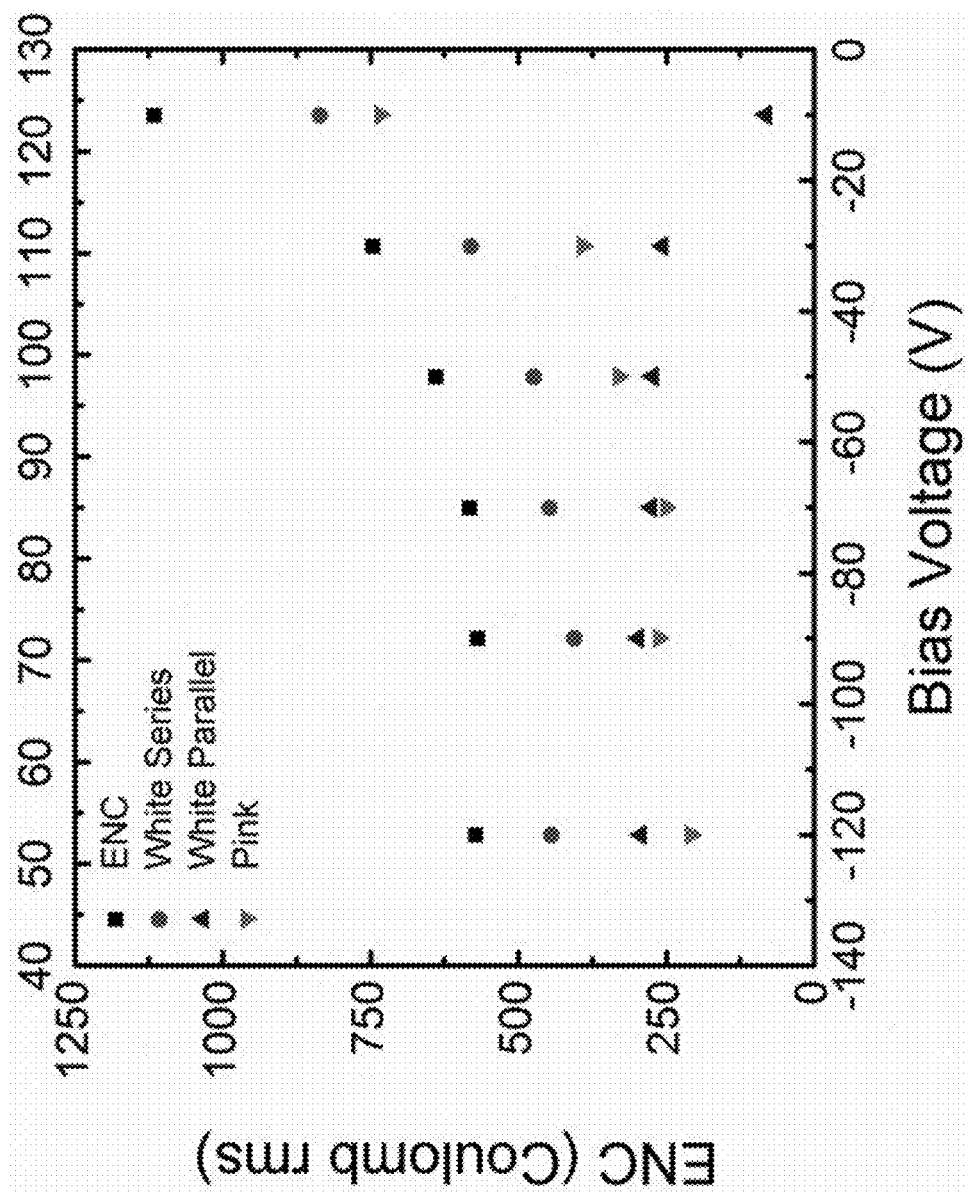
FIG. 34 shows the variation of ENC, white series noise, pink noise and white parallel noise, measured using 3 μs shaping time, as a function of different bias voltages/detector capacitance according to Example 4.

In order to study the effect of detector capacitance and leakage current on the electronic noise, a bias dependent study of the electronic noise of the detection system was carried out. The ENCs have been measured at six different reverse bias voltages viz. –10, –30, –50, –70, –90, and –120 V. FIG. 34 shows the variation of the ENC and the separate contributions to the electronic noise as a function of applied reverse bias for a shaping time of 3 μs. The increase in reverse bias reduces the detector junction capacitance and simultaneously increases the leakage current too. From FIG. 34 it can be noticed that the contribution of the white series noise dominated towards the overall noise and decreases with the increasing reverse bias or decreasing capacitance which is in consistence with Eqn. 12. The pink noise follows a similar trend which again is in agreement with Eqn. 12. The white parallel noise, which incorporates the detector leakage current, was seen to contribute the least at lower biases and increase steadily with reverse bias due to the increase in leakage current. It can also be noticed that beyond a reverse bias of –50 V, the contribution of the white parallel noise exceeded that of the pink noise.

Conclusions:

Large area alpha detectors were fabricated in simple planar configuration using 4H—SiC n-type epitaxial layers. The energy resolution (16.2 keV or 0.29%) observed for 5486 MeV alpha particles, is the best overall energy resolution reported in the literature till date. The intrinsic detector resolution at the same energy was calculated to be 14.5 keV. An even better energy resolution could be achieved by using collimated alpha source which will eliminate the uncertainty in the incident energy related to the angle of incidence.

The high resolution in this case was achieved by using a very thin (10 nm) Ni window (which is thinner by a factor of 4 or more than used by previous workers) which minimizes the broadening due to the entrance window, high quality epitaxial layers which provided less doping concentration, a micropipe density less than 1 cm$^{-2}$ and Schottky barriers with high barrier height and diode ideality factor close to 1. These detectors were also found to be highly efficient at zero applied bias due to the large hole diffusion length (18.6 μm).

An electronic noise analysis of the detection system revealed the possibility of achieving even better energy resolution by lowering the detector capacitance. The contribution of the white series noise (which is primarily due to the total input capacitance) to the overall electronic noise was found to dominate compared to the white parallel and the pink noise up to a reverse bias of –120 V and decrease steadily with decreasing capacitance. The contribution of pink noise which is also primarily due to the total input capacitance, was seen to be more than that of the white parallel noise for bias voltages less than –50 V and beyond which the contribution of white parallel noise (which incorporates the detector leakage current) became more because of the increased leakage current. For future studies we would target lower detector capacitance, to achieve even better energy resolution without reducing the detector active area, by increasing the detector active thickness, i.e. by using a thicker epitaxial layer.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed:

1. A detection device, comprising:
   a SiC substrate defining a substrate surface cut from planar to about 12°;
   a buffer epitaxial layer on the substrate surface, wherein the buffer epitaxial layer comprises a n-type 4H—SiC epitaxial layer doped at a concentration of about $1 \times 10^{15}$ cm$^{-3}$ to about $5 \times 10^{18}$ cm$^{-3}$ with nitrogen, boron, aluminum, or a mixture thereof;
   a n-type epitaxial layer on the buffer epitaxial layer, wherein the n-type epitaxial layer comprises a n-type 4H—SiC epitaxial layer doped at a concentration of about $1\times10^{13}$ cm$^{-3}$ to about $5\times10^{15}$ cm$^{-3}$ with nitrogen; and a top contact on the n-type epitaxial layer, wherein the top contact has a thickness of about 8 nm to about 15 nm, wherein the detection device has sensitivity in an energy range of 50 eV to 10 keV.

2. The detection device as in claim 1, wherein the buffer epitaxial layer has a thickness of about 0.5 μm to about 2.0 μm.

3. The detection device as in claim 1, wherein the buffer epitaxial layer is doped with nitrogen at a concentration of about $1\times10^{15}$ cm$^{-3}$ to about $5\times10^{18}$ cm$^{-3}$.

4. The detection device as in claim 1, wherein the n-type epitaxial layer has a thickness of about 10 μm to about 50 μm.

5. The detection device as in claim 1, wherein the top contact comprises a high barrier metal.

6. The detection device as in claim 5, wherein the high barrier metal comprises Pt, Au, Ag, Ni, Pd, W, Mo, Ir, Ru, or mixtures thereof.

7. The detection device as in claim 1, wherein the top contact comprises a low barrier metal.

8. The detection device as in claim 7, wherein the high barrier metal comprises Al, Sn, In, Ti, or mixtures thereof.

9. The detection device as in claim 1, wherein the n-type epitaxial layer defines an exposed surface defining a surface area, and wherein the top contact covers about 10% to about 20% of the surface area of the exposed surface of the n-type epitaxial layer.

10. The detection device as in claim 1, further comprising:
a top lead; and
a paste attaching the top lead to the top contact.

11. The detection device as in claim 10, wherein the paste comprises silver and an adhesive.

12. The detection device as in claim 11, wherein the adhesive comprises an epoxy adhesive.

13. The detection device as in claim 1, further comprising:
a bottom contact positioned on the SiC substrate opposite from the buffer epitaxial layer, wherein the bottom contact has a thickness of about 50 nm to about 200 nm.

14. The detection device as in claim 13, further comprising:
a bottom contact positioned on the Sic substrate opposite from the buffer epitaxial layer, wherein the bottom contact comprises a high barrier metal selected from the group consisting of Pt, Au, Ag, Ni, Pd, W, Mo, Ir, Ru, and mixtures thereof.

15. The detection device as in claim 13, further comprising:
a bottom contact positioned on the Sic substrate opposite from the buffer epitaxial layer, wherein the bottom contact comprises a low barrier metal selected from the group consisting of Al, Sn, In, Ti, and mixtures thereof.

16. The detection device as in claim 13, further comprising:
a bottom lead; and
a paste attaching the bottom lead to the bottom contact, wherein the paste comprises silver and an adhesive.

17. The detection device as in claim 1, wherein the SiC substrate has a crystalline structure that is 4H—SiC.

* * * * *